(12) United States Patent
Kunita

(10) Patent No.: US 6,476,092 B1
(45) Date of Patent: Nov. 5, 2002

(54) PHOTOPOLYMERIZABLE COMPOSITION CONTAINING A POLYMERIZABLE ACRYLIC COMPOUND WITH HETERO-SUBSTITUTED METHYL OR HALO-SUBSTITUTED METHYL AT THE ALPHA POSITION

(75) Inventor: Kazuto Kunita, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 1 day.

(21) Appl. No.: 09/665,685

(22) Filed: Sep. 20, 2000

(30) Foreign Application Priority Data

Sep. 22, 1999 (JP) ............................................. 11-268842

(51) Int. Cl.[7] ......................... G03F 7/028; G03F 7/029; G03F 7/031; C08F 2/50
(52) U.S. Cl. .............................. 522/31; 522/63; 522/65; 522/66; 522/75; 522/116; 522/118; 522/120; 522/136; 522/141; 522/168; 522/173; 522/178; 522/180; 522/181; 522/182; 522/183; 430/286.1; 430/287.1; 430/288.1
(58) Field of Search ............................... 522/31, 63, 65, 522/75, 116, 118, 120, 136, 141, 168, 173, 178, 180, 181, 182, 183, 66; 430/286.1, 287.1, 288.1

(56) References Cited

U.S. PATENT DOCUMENTS 5,254,422 A * 10/1993 Kato et al.
5,621,019 A * 4/1997 Nakano et al.
6,310,115 B1 * 10/2001 Vanmaele et al.

* cited by examiner

Primary Examiner—Susan W. Berman
(74) Attorney, Agent, or Firm—Burns, Doane, Swecker & Mathis, LLP

(57) ABSTRACT

A photopolymerizable composition which is capable of successfully ensuring both high sensitivity and excellent storage stability is provided as a radical photopolymerization-system composition which is highest in the sensitivity and very promising out of the image-forming techniques. The photopolymerizable composition comprises a polymerizable group-containing compound having a specific structure set forth below wherein $X^1$ and $X^2$ each independently represent a group containing a hetero atom wherein the hetero atom is in the α-position or a halogen atom and a photopolymerization initiator.

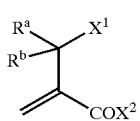

(I)

14 Claims, No Drawings

PHOTOPOLYMERIZABLE COMPOSITION CONTAINING A POLYMERIZABLE ACRYLIC COMPOUND WITH HETERO-SUBSTITUTED METHYL OR HALO-SUBSTITUTED METHYL AT THE ALPHA POSITION

FIELD OF THE INVENTION

The present invention relates to a photopolymerizable material which can be used for image-forming materials such as three-dimensional formation, holography, lithographic printing plate material, color proof, photoresist and color filter, or for photocurable resin materials such as, ink, coating material and adhesive. More specifically, the present invention relates, to a photopolymerizable composition suitable as a lithographic printing plate material capable of so-called direct plate-making, which can directly making a plate from digital signals of a computer or the like using various lasers.

BACKGROUND OF THE INVENTION

At present, high-output and compact lasers are easily available, which is a solid laser, a semiconductor laser or a gas laser each radiating an ultraviolet ray, a visible ray or an infrared ray at a wavelength of from 300 to 1,200 nm. These lasers are very useful as a light source in the recording for directly making a plate from digital lasers of a computer or the like.

A large number of studies have been made on the recording material having sensitivity to various laser rays and representative examples of the recording material include the followings.

The first is a material which has photosensitive wavelength of 760 nm or more and can be recorded by an infrared laser, and for this material, a positive-working recording material described in U.S. Pat. No. 4,708,925 and an acid catalyst crosslinking-type negative working recording material described in JP-A-8-276558 are known.

The second is a recording material having sensitivity to an ultraviolet or visible laser ray at a wavelength of from 300 to 700 nm and for this material, a large number of recording materials are known, such as a radical polymerization-type negative recording material described in U.S. Pat. No. 2,850,445 and JP-B-44-20189.

On the other hand, materials having sensitivity to light at a short wavelength of 300 nm or less or an electron beam are important particularly as a photoresist material. In recent years, integrated circuits are more and more intensified in the integration and in producing a semiconductor substrate for ultra LSI and the like, working of an ultrafine pattern comprising lines in the width of a half micron or less is involved. To satisfy this, the exposure apparatus for the photolithography is required to emit light of shorter wavelengths and use of a far ultraviolet ray or an excimer laser ray (e.g., XeCl, KrF, ArF) is being studied. Use of even an electron beam is being attempted for the formation of an ultrafine pattern. The electron beam in particular is highly promising as a light source for the pattern-formation technologies in the coming generation.

These image-forming materials all have a common problem to be solved and this is to what extent the ON-OFF of the image can be expanded in the energy-irradiated area and the non-irradiated area, namely, to simultaneously attain both high sensitivity and storage stability of the image-forming material.

Usually, the radical photopolymerization system has high sensitivity but due to the polymerization inhibition by oxygen in air, the sensitivity greatly decreases. Therefore, means of providing a layer capable of shutting out oxygen on the image-forming layer is employed. However, when a layer capable of shutting out oxygen is provided, fogging in turn occurs due to the dark polymerization and the storage stability is deteriorated. Accordingly, it is heretofore difficult to simultaneously attain both high sensitivity and storage stability, and none of conventional techniques is satisfied in the results. Thus, a new technique not known in the past is being demanded.

SUMMARY OF THE INVENTION

Accordingly, an object of the present invention is to provide a photopolymerizable composition capable of successfully ensuring both high sensitivity and excellent storage stability, as a radical photopolymerization-system composition which is highest in the sensitivity and very promising out of the image-forming techniques. Particularly, the object of the present invention is to provide a photopolymerizable composition suitable as a lithographic printing plate material capable of making a printing plate directly from digital data of a computer or the like by the recording using a solid laser or semiconductor laser which emits an ultraviolet ray, a visible ray or an infrared ray.

As a result of extensive investigations, the present inventors have found that when a compound having a specific polymerizable group is used in the photopolymerizable composition, the above-described object can be attained. More specifically, the present invention has the following constructions.

A photopolymerizable composition comprising a compound having a structure represented by the following formula (I) and a photopolymerization initiator:

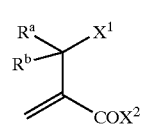

(I)

wherein $X^1$ and $X^2$ each independently represents a hetero atom or a halogen atom, $R^a$ and $R^b$ each independently represents a hydrogen atom, a halogen atom, a cyano group or an organic residue, and $X^1$ and $X^2$, $R^a$ and $R^b$, or $X^1$ and $R^a$ or $R^b$ may combine with each other to form a cyclic structure.

Conventionally, the most general radical polymerizable compound is a monomer, oligomer or polymer having an acrylic acid ester group, an acrylic acid amide group, a methacrylic acid ester group or a methacrylic acid amide group each having high polymerizability. However, these are subject to the polymerization inhibition due to oxygen and when such a compound is used in a photopolymerizable composition, the object of simultaneously attaining both high sensitivity and storage stability cannot be attained.

With respect to the constituent component of the polymer, compounds (monomer) having an α-hetero-substituted methyl acryl group or an α-halogen-substituted methyl acryl group are known, each group having polymerizability comparable to the acrylic type. Unlike an itaconic acid group or α-alkyl acryl group having a substituent at the same α-position but having low polymetizability, those compounds are considered to be improved in the polymerizability as a constituent component of a polymer due to the electronic effect and the steric effect of a hetero atom or halogen atom substituted to the α-position.

The present inventors have-found that when a compound containing a structure having a polymerizable group substituted at the α-position by a hetero atom or a halogen atom is used together with a photopolymerization initiator in a photopolymerizable composition, the problem of conventional radial polymerizable compounds, namely, the above-described polymerization inhibition by oxygen can be greatly reduced and both high sensitivity and excellent storage stability which are commonly demanded for photopolymerizable compositions can be simultaneously attained.

The mechanism for reducing the polymerization inhibition by oxygen is not clearly known, however, the compound having a structure represented by formula (I) for use in the present invention is extremely small in the stop rate constant, though the polymerization growth rate constant is not so high as compared with conventional acryl or methacryl types, therefore, a reaction with oxygen difficultly occurs at the time of chain propagation, as a result, the compound is considered to become unsusceptible to the effect of polymerization inhibition by oxygen.

DETAILED DESCRIPTION OF THE INVENTION

The compound for use in the present invention is characterized in that the compound has a structure represented by formula (I) and has at least one polymerizable group.

The structure represented by formula (I) may assume a monovalent substituent or a divalent or greater valence substituent or may assume one compound by itself on the condition that $R^a$, $R^b$, $X^1$ and $X^2$ in formula (I) all represents a terminal group. When the structure represented by formula (I) assumes a monovalent substituent or a divalent or greater valence substituent, at least one of $R^a$, $R^b$, $X^1$ and $X^2$ in formula (I) has one or more bond. Furthermore, $X^1$ and $X^2$ each may assume a linking group having linkable positions in the number of n and the terminals may be linked with the group represented by formula (I) in the number of n (n is an integer of 2 or more) (multimer).

Also, the compound may be bonded to a polymer chain through at least one of $X^1$ and $X^2$. In other words, a form such that the structure represented by formula (I) is present in the side chain of a polymer chain may be used. Examples of the polymer chain include a linear organic high molecular polymer which is described later. Specific examples thereof include vinyl-based polymers such as polyurethane, novolak and polyvinyl alcohol, polyhydroxystyrene, polystyrene, poly(meth)acrylic acid ester, poly(meth)acrylic acid amide and polyacetal. These polymers may be either a homopolymer or a copolymer.

In formula (I), $X^1$ and $X^2$ each represents a hetero atom or a halogen atom but may assume a terminal group or may be linked with another substituent (the substituent includes, as described above, the structure of formula (I) and a polymer chain) by assuming a linking group. The hetero atom is preferably a nonmetallic atom and specific examples thereof include oxygen atom, sulfur atom, nitrogen atom and phosphorus atom. Examples of the halogen atom include chlorine atom, bromine atom, iodine atom and fluorine atom.

$X^1$ is preferably a halogen atom or when $X^1$ assumes a linking group and another substituent is linked therewith, preferably represents a group such as hydroxyl group, substituted oxy group, mercapto group, substituted thio group, amino group, substituted amino group, sulfo group, sulfonate group, substituted sulfinyl group, substituted sulfonyl group, phosphono group, substituted phosphono group, phosphonate group, substituted phosphonate group, nitro group or heterocyclic group (provided that the substituent is linked through a hetero atom).

$X^2$ is preferably a halogen atom or when $X^2$ assumes a linking group and another substituent is linked therewith, preferably represents a group such as hydroxyl group, substituted oxy group, mercapto group, substituted thio group, amino group, substituted amino group or heterocyclic group (provided that the substituent is linked through a hetero atom).

In the case where $X^1$ and $X^2$ assumes a linking group and another substituent is linked therewith, the group may assume a linking group having linkable positions in the number of n by eliminating n hydrogen atoms from the group and the terminals may be linked with the group represented by formula (I) in the number of n (n is an integer of 2 or more).

Also, $X^1$ and $X^2$ may combine with each other to form a cyclic structure.

$R^a$ and $R^b$ each independently preferably represents hydrogen atom, a halogen atom, a cyano group or an organic residue such as a hydrocarbon group which may have a substituent and may contain an unsaturated bond, a substituted oxy group, a substituted thio group, a substituted amino group, a substituted carbonyl group or a carboxylate group. Also, $R^a$ and $R^b$ may combine with each other to form a cyclic structure.

Examples of each substituent of $X^1$, $X^2$, $R^a$ and $R^b$ in formula (I) are described below.

Examples of the hydrocarbon group which may have a substituent and may contain an unsaturated bond include an alkyl group, a substituted alkyl group, an aryl group, a substituted aryl group, an alkenyl group, a substituted alkenyl group, an alkynyl group and a substituted alkynyl group.

The alkyl group includes a linear, branched or cyclic alkyl group having from 1 to 20 carbon atoms and specific examples thereof include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, linear alkyl groups having from 1 to 12 carbon atoms, branched alkyl groups having from 3 to 12 carbon atoms and cyclic alkyl groups having from 5 to 10 carbon atoms are preferred.

The substituted alkyl group results from the bonding of a substituent and an alkylene group. The substituent is a monovalent nonmetallic atom group exclusive of hydrogen atom and preferred examples thereof include a hydrogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and a conjugate base group (hereinafter referred to as carboxylato), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO₃H) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—SO₂NHSO₂(alkyl)) and a conjugate base group thereof, an N-arylsulfonylsulfamoyl group (—SO₂NHSO₂(allyl)) and a conjugate base group thereof, an N-alkylsulfonylcarbamoyl group (—CONHSO₂(alkyl)) and a conjugate base group thereof, an N-arylsulfonylcarbamoyl group (—CONHSO₂(allyl)) and a conjugate base group thereof, an alkoxysilyl group (—Si(O alkyl)₃), an aryloxysilyl group (—Si(O allyl)₃), a hydroxysilyl group (—Si(OH)₃) and a conjugate base group thereof, a phosphono group (—PO₃H₂) and a conjugate base group thereof (hereinafter referred to as a phosphonato group), a dialkylphosphono group (—PO₃(alkyl)₂), a diarylphosphono group (—PO₃(aryl)₂), an alkylarylphosphono group (—PO₃(alkyl)(aryl)), a monoalkylphosphono group (—PO₃H(alkyl)) and a conjugate base group thereof (hereinafter referred to as an alkylphosphonato group), a monoarylphosphono group (—PO₃H(aryl)) and a conjugate base group thereof (hereinafter referred to as an arylphosphonato group), a phosphonooxy group (—OPO₃H₂) and a conjugate base group thereof (hereinafter referred to as a phosphonatooxy group), a dialkylphosphonooxy group (—OPO₃(alkyl)₂), a diarylphosphonooxy group (—OPO₃(aryl)₂), an alkylarylphosphonooxy group (—OPO₃(alkyl)(aryl)), a monoalkylphosphonooxy group (—OPO₃H(alkyl)) and a conjugate base group thereof (hereinafter referred to as an alkylphosphonatooxy group), a monoarylphosphonooxy group (—OPO₃H(aryl)) and a conjugate base group thereof (hereinafter referred to as an arylphosphonatooxy group), a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a nitrophenyl group, a cyanophenyl group, a sulfophenyl group, a sulfonatophenyl group, a phosphonophenyl group and a phosphonatophenyl group. Examples of the alkenyl group include a vinyl group, a 1-propenyl group, a 1-butenyl group, a cinnamyl group and a 2-chloro-1-ethenyl group, and examples of the alkynyl group include an ethynyl group, a 1-propynyl group, a 1-butynyl group, a trimethylsilylethynyl group and a phenylethynyl group.

Examples of the acyl group (R₄CO—) include those where R₄ is hydrogen atom or the above-described alkyl, aryl, alkenyl or alkynyl group.

Examples of the alkylene group in the substituted alkyl group include a divalent organic residue resulting from the elimination of any one hydrogen atom on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific preferred examples of the substituted alkyl group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, a methoxycarbonylmethyl group, a methoxycarbonylbutyl group, an ethoxycarbonylmethyl group, a butoxycarbonylmethyl group, an allyloxycarbonylmethyl group, a benzyloxycarbonylmethyl group, a methoxycarbonylphenylmethyl group, a trichloromethylcarbonylmethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfopropyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group,

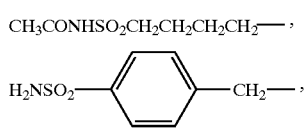

-continued

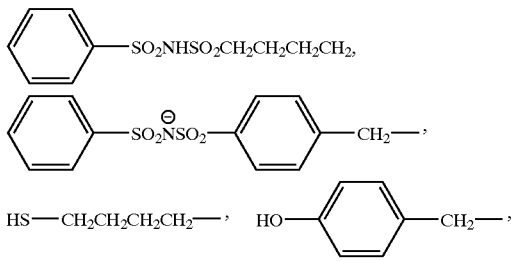

a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Examples of the aryl group include a condensed ring formed by from 1 to 3 benzene rings and a condensed ring formed by a benzene ring and a 5-membered unsaturated ring, and specific examples thereof include a phenyl group, a naphthyl group, an anthryl group, a phenanthryl group, an indenyl group, an acenaphthenyl group and a fluorenyl group, with a phenyl group and a naphthyl group being preferred.

The substituted aryl group results from the bonding of a substituent to an aryl group and includes those having a monovalent nonmetallic atom group exclusive of hydrogen atom as a substituent on the ring-forming carbon atoms of the above-described aryl group. Preferred examples of the substituent include the above-described alkyl groups, substituted alkyl groups and substituents for the substituted alkyl group. Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, a phenylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, 2-butenyl group, a 2-methylallylphenyl group, a 2-methylpropenylphenyl group, a 2-propenylphenyl group, a 2-butynylphenyl group and a 3-butynylphenyl group.

Examples of the alkenyl group include those described above. The substituted alkenyl group results from the bonding of a substituent to an alkenyl group by replacing the hydrogen atom. Examples of the substituent include the substituents described above for the substituted alkyl group and examples of the alkenyl group include the alkenyl groups described above. Preferred examples of the substituted alkenyl group include:

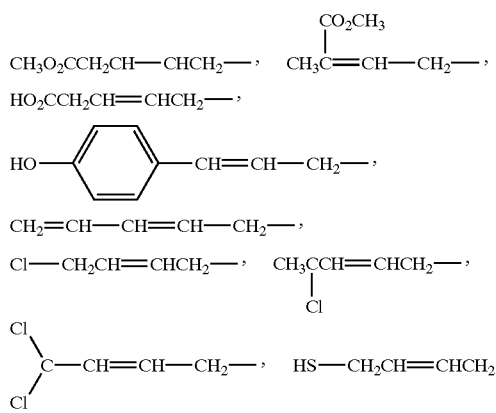

Examples of the alkynyl group include those described above. The substituted alkynyl group results from the bonding of a substituent to an alkynyl group by replacing the hydrogen atom. Examples of the substituent include the substituents described above for the substituted alkyl group and examples of the alkynyl group include the alkynyl groups described above.

The heterocyclic group includes a monovalent group resulting from the elimination of one hydrogen atom on a heterocyclic ring, and a monovalent group (substituted heterocyclic group) resulting from further eliminating one hydrogen atom from the above-described monovalent group and bonding thereto a substituent described above for the substituted alkyl group. Preferred examples of the heterocyclic ring include:

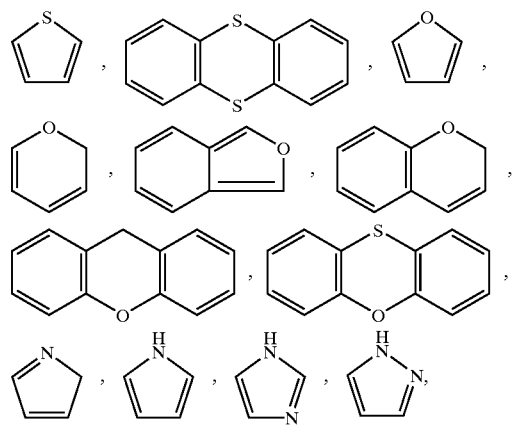

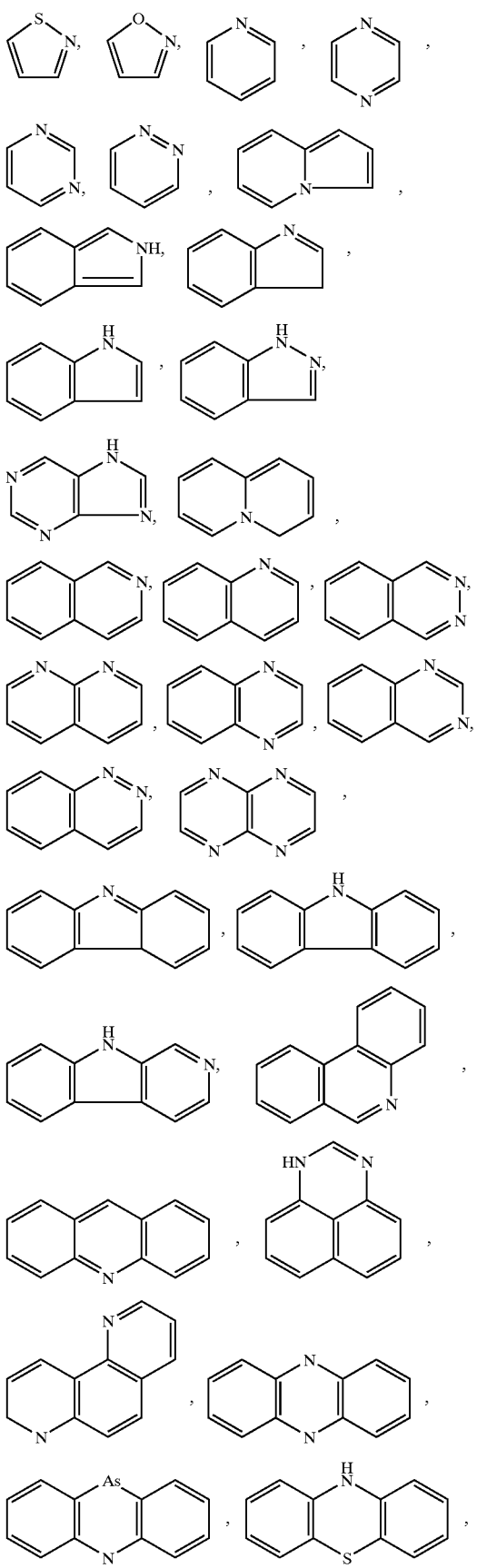
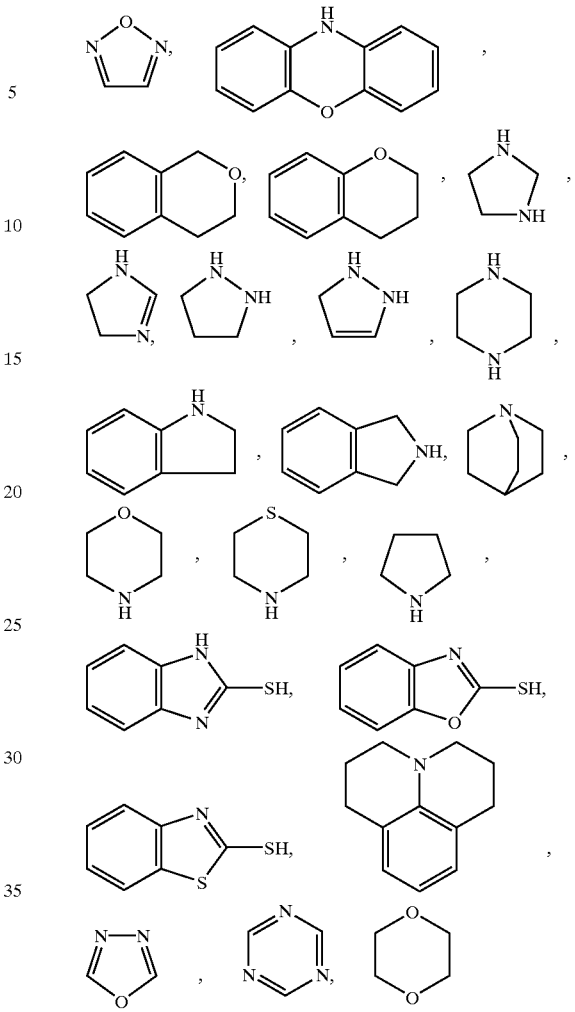

Examples of the substituted oxy group (R₅CO—) include those where $R_5$ is a monovalent nonmetallic atom group exclusive of hydrogen atom. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonooxy group and a phosphonatooxy group. Examples of the alkyl group and the aryl group in these groups include those described above for the alkyl group and the substituted alkyl group and those for the aryl group and the substituted aryl group, respectively Examples of the acyl group (R₆CO—) in the acyloxy group include those where $R_6$ is the alkyl group, substituted alkyl group, aryl group or substituted aryl group described above. Among these substituents, more preferred are an alkoxy group, an aryloxy group, an acyloxy group and an arylsulfoxy group. Specific examples of preferred substituted oxy groups include a methoxy group, an ethoxy group, a propyloxy group, an isopropyloxy group, a butyloxy group, a pentyloxy group, a hexyloxy group, a dodecyloxy group, a benzyloxy group, an allyloxy group, a phenethyloxy group, a carboxyethyloxy group, a methoxycarbonylethyloxy group, an ethoxycarbonylethyloxy group, a methoxyethoxy group, a phenoxyethoxy group, a methoxyethoxyethoxy group, an ethoxyethoxyethoxy group, a morpholinoethoxy group, a morpholinopropyloxy group, an allyloxyethoxyethoxy group, a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, an acetyloxy group, a benzoyloxy group, a naphthyloxy group, a phenylsulfonyloxy group, a phosphonooxy group and a phosphonatooxy group.

Examples of the substituted thio group ($R_7S$—) which can be used includes those where $R_7$ is a monovalent nonmetallic atom group exclusive of hydrogen atom. Preferred examples of the substituted thio group include an alkylthio group, an arylthio group, an alkyldithio group, an aryldithio group and an acylthio group. The alkyl group and the aryl group in these groups include those described above for the alkyl group and the substituted alkyl group and those for the aryl group and the substituted aryl group, respectively. The acyl group ($R_6CO$—) in the acylthio group is the same as described above. Among these, an alkylthio group and an arylthio group are more preferred. Specific examples of preferred substituted thio groups include a methylthio group, an ethylthio group, a phenylthio group, an ethoxyethylthio group, a carboxyethylthio group and a methoxycarbonylthio group.

Examples of the substituted amino group ($R_8NH$—, ($R_9$)($R_{10}$)N—) includes those where $R_8$, $R_9$ and $R_{10}$ each is a monovalent nonmetallic atom group exclusive of hydrogen atom. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N-alkyl-N-arylureido group, an N',N'-dialkyl-N alkylureido group, an N',N'-dialkyl-N'-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group.

Examples of the alkyl group and the aryl group in these groups include those described above for the alkyl group and the substituted alkyl group and those for the aryl group and the substituted aryl group, respectively, and $R_6$ of the acyl group ($R_6CO$—) in the acylamino group, N-alkylacylamino group and N-arylacylamino group is the same as described above. Among these, more preferred are an N-alkylamino group, an N,N-dialkylamino group, an N-arylamino group and an acylamino group. Specific examples of preferred substituted amino groups include a methylamino group, an ethylamino group, a diethylamino group, a morpholino group, a piperidino group, a pyrrolidino group, a phenylamino group, a benzoylamino group and an acetylamino group.

Examples of the substituted carbonyl group ($R_{11}$-CO—) which can be used include those where $R_{11}$ is a monovalent nonmetallic atom group. Preferred examples of the substituted carbonyl group include a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N'-arylcarbamoyl group. The alkyl group and the aryl group in these groups include those described above for the alkyl group and the substituted alkyl group and those for the aryl group and the substituted aryl group, respectively. Among these, more preferred are a formyl group, an acyl group, a carboxyl group, an alkoxycarbonyl group, an aryloxycarbonyl group, a carbamoyl group, an N-alkylcarbamoyl group, an N,N-dialkylcarbamoyl group and an N-arylcarbamoyl group, still more preferred are a formyl group, an acyl group, an alkoxycarbonyl group and an aryloxycarbonyl group. Specific examples of preferred substituted carbonyl groups include a formyl group, an acetyl group, a benzoyl group, a carboxyl group, a methoxycarbonyl group, an allyloxycarbonyl group, an N-methylcarbamoyl group, an N-phenylcarbamoyl group, an N,N-diethylcarbamoyl group and a morpholinocarbonyl group.

Examples of the substituted sulfinyl group ($R_{12}$—SO—) which can be used include those where $R_{12}$ is a monovalent nonmetallic atom group. Preferred examples thereof include an alkylsulfinyl group, an arylsulfinyl group, a sulfinamoyl group, an N-alkylsulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and the aryl group in these groups include those described above for the alkyl group and the substituted alkyl group and those for the aryl group and the substituted aryl group, respectively. Among these, more preferred are an alkylsulfinyl group and an arylsulfinyl group. Specific-examples of the substituted sulfinyl group include a hexylsulfinyl group, a benzylsulfinyl group and a tolylsulfinyl group.

Examples of the substituted sulfonyl group ($R_{13}$—SO_2—) include those where $R_{13}$ is a monovalent nonmetallic atom group. More preferred examples thereof include an alkylsulfonyl group and an arylsulfonyl group. The alkyl group and the aryl group in these groups include those described above for the alkyl group and the substituted alkyl group and those for the aryl group and the substituted aryl group, respectively. Specific examples of the substituted sulfonyl group include a butylsulfonyl group and a chlorophenylsulfonyl group.

The sulfonato group (—$SO_3^-$) means a conjugated base anion group of a sulfo group (—$SO_3H$) as described above and usually, the sulfonato group is preferably used together with a counter cation. Examples of the counter cation include generally known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The carboxylato group (—$CO_2^-$) means a conjugate base anion group of a carboxyl group ($CO_2H$) as described above and usually, the carboxylato group is preferably used together with a counter cation. Examples of the counter cation include generally known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphono group means a compound resulting from the displacement of one or two hydroxyl groups on the phosphono group by other organic oxo groups and preferred examples thereof include a dialkylphosphono group, a diarylphosphono group, an alkylarylphosphono group, a monoalkylphosphono group and a monoarylphosphono group. Among these, preferred are a dialkylphosphono group and a diarylphosphono group. Specific examples thereof include a diethylphosphono group, a dibutylphosphono group and a diphenylphosphono group.

The phosphonato group ($-PO_3^{2-}$, $-PO_3H^-$) means a conjugate base anion group derived from acid first dissociation or acid second dissociation of a phosphono group ($-PO_3H_2$) and usually, the phosphonato group is preferably used together with a counter cation. Examples of the counter cation include generally known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$).

The substituted phosphonato group is a conjugate base anion group of the above-described substituted phosphono groups where one hydroxyl group is displaced by an organic oxo group. Specific examples thereof include a conjugate base of the above-described monoalkylphosphono group ($-PO_3H(alkyl)$) and a conjugate base of the monoarylphosphono group ($-PO_3H(aryl)$). Usually, the substituted phosphonato group is preferably used together with a counter cation and examples of the counter cation include generally known cations, more specifically, various oniums (e.g., ammoniums, sulfoniums, phosphoniums, iodoniums, aziniums) and metal ions (e.g., $Na^+$, $K^+$, $Ca^{2+}$, $Zn^{2+}$). The cyclic structure formed by the combining of $X^1$ and $X^2$, $R^a$ and $R^b$, or $X^1$ and $R^a$ or $R^b$ with each other is described below. Examples of the aliphatic ring formed by the combining of $X^1$ and $X^2$, $R^a$ and $R^b$, or $X^1$ and $R^a$ or $R^b$ with each other include a 5-, 6-, 7- or 8-membered aliphatic ring, more preferably a 5- or 6-membered aliphatic ring. The aliphatic ring may further have a substituent on the carbon atoms constituting the ring (examples of the substituent include the above-described substituents on the substituted alkyl group) or a part of the ring-constituting carbon atoms may be substituted by a hetero atom (e.g., oxygen atom, sulfur atom, nitrogen atom). Furthermore, a part of the aliphatic ring may constitute a part of an aromatic ring.

Specific examples of the compound having a structure represented by formula (I) are set forth below.

TABLE 1 i) Monofunctional Type (Group A)

(general formula)

| No. | $X^1$ | $X^2$ |
|---|---|---|
| A-1 | OH | $OCH_3$ |
| A-2 | OH | $O(n)C_4H_9$ |
| A-3 | OH | $O(n)C_{12}H_{25}$ |
| A-4 | OH | O-CH₂-phenyl |
| A-5 | OH | O-cyclohexyl |
| A-6 | OH | O-CH₂-CH=CH₂ |
| A-7 | OH | O-(4-tert-butylphenyl) |
| A-8 | $OCH_3$ | $OC_2H_5$ |
| A-9 | O-CH(CH₃)₂ (isopropoxy) | $O(n)C_4H_9$ |
| A-10 | $O(n)C_8H_{17}$ | $OCH_3$ |
| A-11 | O-CH₂-CH=CH₂ | O-CH₂-CH=CH₂ |
| A-12 | O-CH₂-phenyl | $OCH_3$ |

TABLE 1-continued i) Monofunctional Type (Group A)    (general formula)

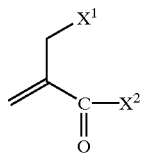

| No. | X$^1$ | X$^2$ |
|---|---|---|
| A-13 | O-C$_6$H$_5$ (phenoxy) | OCH$_3$ |
| A-14 | OCH$_2$CH$_2$Cl | OCH$_3$ |
| A-15 | OCH$_2$CH$_2$OCOCH$_3$ | OC$_2$H$_5$ |
| A-16 | O(CH$_2$)$_4$CN | OC$_2$H$_5$ |
| A-17 | OCOCH$_3$ | OCH$_3$ |
| A-18 | OCO(n)C$_6$H$_{13}$ | OCH$_3$ |
| A-19 | OCO-C$_6$H$_5$ | OCH$_3$ |
| A-20 | OSO$_2$CH$_3$ | OCH$_3$ |
| A-21 | OSO$_2$(n)C$_4$H$_9$ | OCH$_3$ |
| A-22 | OSO$_2$-C$_6$H$_4$-CH$_3$ (p-tolyl) | OCH$_3$ |
| A-23 | OSO$_2$CF$_3$ | OC$_2$H$_5$ |
| A-24 | SCH$_3$ | OC$_2$H$_5$ |
| A-25 | S(n)C$_4$H$_9$ | OC$_2$H$_5$ |
| A-26 | S-C$_6$H$_5$ | OC$_2$H$_5$ |
| A-27 | S-benzothiazol-2-yl | OCH$_3$ |
| A-28 | S-(6-chlorobenzoxazol-2-yl) | OCH$_3$ |
| A-29 | F | O(n)C$_{12}$H$_{25}$ |
| A-30 | F | OCH$_2$-C$_6$H$_5$ |
| A-31 | Cl | OCH$_3$ |
| A-32 | Cl | O-C$_6$H$_4$-C(CH$_3$)$_2$CH$_2$C(CH$_3$)$_3$ |

TABLE 1-continued
i) Monofunctional Type (Group A)
(general formula)
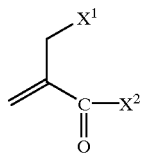
| No. | $X^1$ | $X^2$ |
|---|---|---|
| A-33 | Br | $O(n)C_4H_9$ |
| A-34 | Br | ![2-ethylhexyloxy] |
| A-35 | I | $O(n)C_4H_9$ |
| A-36 | I | ![phenethyloxy] |
| A-37 | N(CH₃)₂ | $OC_2H_5$ |
| A-38 | morpholino | $OC_2H_5$ |
| A-39 | pyrrolidino | $OC_2H_5$ |
| A-40 | thiomorpholino | $OC_2H_5$ |
| A-41 | 4-(ethoxycarbonyl)piperidino ($CO_2C_2H_5$) | $OC_2H_5$ |
| A-42 | N(CH₃)(CH₂Ph) | $OC_2H_5$ |
| A-43 | N(CH₂CH₂OH)₂ | $OC_2H_5$ |
| A-44 | N(Ph)₂ | $OC_2H_5$ |

TABLE 1-continued i) Monofunctional Type (Group A) (general formula)

$$\begin{array}{c}\phantom{xx}X^1\\ \diagup\\ CH_2=C-X^2\\ \|\\ O\end{array}$$

| No. | $X^1$ | $X^2$ |
|---|---|---|
| A-45 | N(CH$_2$CH=CH$_2$)$_2$ | OC$_2$H$_5$ |
| A-46 | NHCOCH$_3$ | OCH$_3$ |
| A-47 | NHCO(n)C$_4$H$_9$ | O(n)C$_4$H$_9$ |
| A-48 | N(COCH$_3$)(CH$_3$) | OCH$_3$ |
| A-49 | NHSO$_2$CH$_3$ | O(n)C$_4$H$_9$ |
| A-50 | NHSO$_2$-C$_6$H$_4$-CH$_3$ | O(n)C$_4$H$_9$ |
| A-51 | OCOCH$_3$ | OCH$_2$CH$_2$OH |
| A-52 | OCOCH$_3$ | O-(CH$_2$)$_4$-OCH$_3$ |
| A-53 | OCOCH$_3$ | OCH$_2$CH$_2$Cl |
| A-54 | OCOCH$_3$ | OCH$_2$CH$_2$N$^+$(CH$_3$)$_2$ Cl$^-$ |
| A-55 | OCOCH$_3$ | OCH$_2$CH$_2$N$^+$(CH$_3$)$_2$ PF$_6^-$ |
| A-56 | OCOC$_2$H$_5$ | O-(CH$_2$)$_6$-OCOCH$_3$ |
| A-57 | OCOC$_2$H$_5$ | O-(CH$_2$)$_3$-OSO$_2$-C$_6$H$_4$-CH$_3$ |
| A-58 | OCOC$_2$H$_5$ | O-(1,4-cyclohexylene)-OH |
| A-60 | N(SO$_2$C$_2$H$_5$)(C$_2$H$_5$) | OCH$_3$ |
| A-70 | OCOCH$_3$ | O-(CH$_2$)$_3$-PO$_3$H$_2$ |
| A-71 | OCOCH$_3$ | O-(CH$_2$)$_3$-OPO$_3$H$_2$ |

TABLE 1-continued i) Monofunctional Type (Group A)

(general formula)

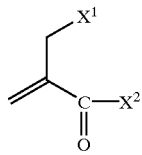

| No. | $X^1$ | $X^2$ |
|---|---|---|
| A-72 | OCOCH$_3$ | O–CH$_2$CH$_2$CH$_2$–CO$_2$H |
| A-73 | O–CH$_2$–C$_6$H$_5$ | OH |
| A-74 | O–CH$_2$–C$_6$H$_5$ | O$^\ominus$Na$^\oplus$ |
| A-75 | O–CH$_2$–C$_6$H$_5$ | O–CH$_2$CH$_2$CH$_2$–SO$_3$H |
| A-76 | O–CH$_2$–C$_6$H$_5$ | O–CH$_2$CH$_2$CH$_2$–SO$_3{}^\ominus$K$^\oplus$ |
| A-77 | O–CH$_2$CH=CH$_2$ | O–(CH$_2$)$_4$–PO$_3$(C$_2$H$_5$)$_2$ |
| A-78 | O–CH$_2$CH=CH$_2$ | O–(CH$_2$)$_4$–SO$_3$–C$_6$H$_{11}$ |
| A-79 | OH | OC$_2$H$_5$ |
| A-80 | O–CH$_2$CH$_2$–O–CH$_2$CH$_2$–OCH$_3$ | OCH$_3$ |
| A-81 | OCONH–C$_6$H$_5$ | OCH$_3$ |
| A-82 | OCONHSO$_2$–C$_6$H$_4$–CH$_3$ | OCH$_3$ |
| A-83 | NHCONH–C$_6$H$_5$ | OCH$_3$ |
| A-84 | NHCO$_2$(n)C$_6$H$_{13}$ | OCH$_3$ |
| A-85 | OCSNH(n)C$_4$H$_9$ | OCH$_3$ |

TABLE 2
(Group B)
| | |
|---|---|
| B-1 | 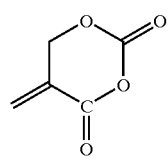 |
| B-2 | 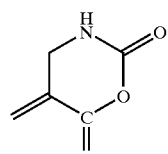 |
| B-3 | 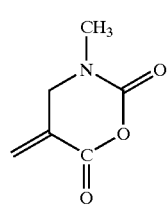 |
| B-4 | 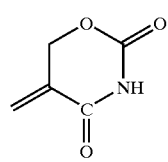 |
| B-5 | 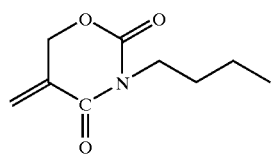 |
TABLE 2-continued
(Group B)
| | |
|---|---|
| B-6 | 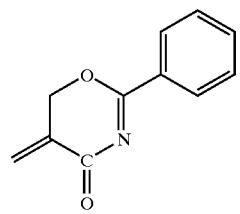 |
| B-7 | 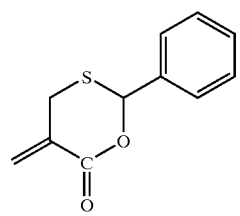 |
| B-8 | 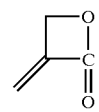 |
| B-9 | 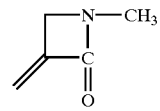 |
TABLE 3
ii) Bifunctional Type (Group C)
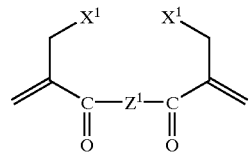
| No. | $X^1$ | $Z^1$ |
|---|---|---|
| C-1 | OH | 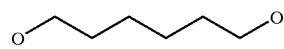 |
| C-2 | OH | 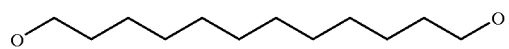 |
| C-3 | OCOCH$_3$ | 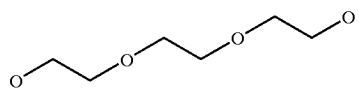 |

TABLE 3-continued
ii) Bifunctional Type (Group C)
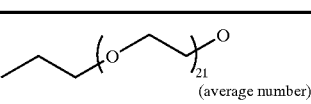
| No. | X¹ | Z¹ |
|---|---|---|
| C-4 | OCOCH$_3$ | 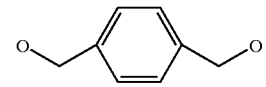 (average number) |
| C-5 | OH | 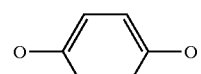 |
| C-6 | OH | 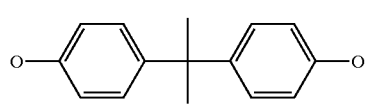 |
| C-7 | OH | 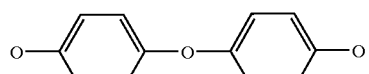 |
| C-8 | OH | 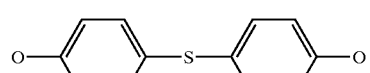 |
| C-9 | OCH$_3$ | 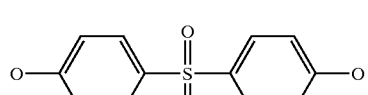 |
| C-10 | 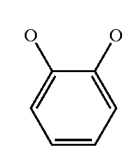 | 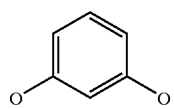 |
| C-11 | OCOC$_2$H$_5$ | 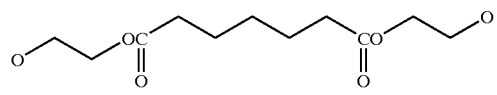 |
| C-12 | OCOC$_2$H$_5$ | |
| C-13 | OH | |
| C-14 | OCOCH$_3$ | 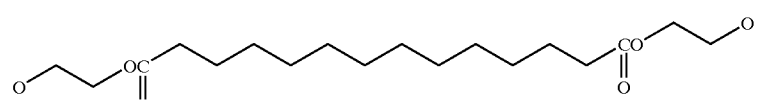 |
| C-15 | 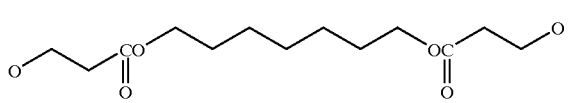 | |

TABLE 3-continued
ii) Bifunctional Type (Group C)
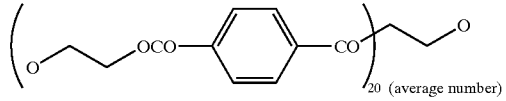
| No. | X¹ | Z¹ |
|---|---|---|
| C-16 | OH | 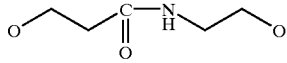 |
| C-17 | OH | 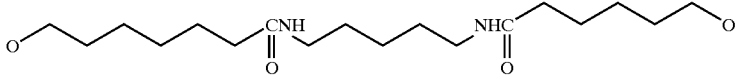 |
| C-18 | OH | 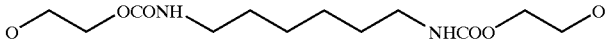 |
| C-19 | OCOCH₃ | 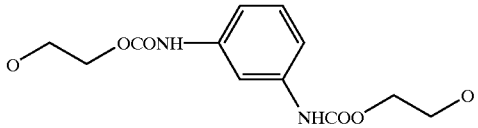 |
| C-20 | OCOCH₃ |  |
| C-21 | OCO(n)Pr | 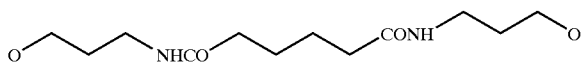 |
| C-22 | OCO(n)Pr | 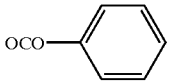 |
| C-23 | 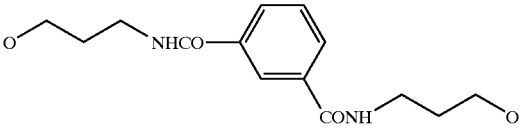 | 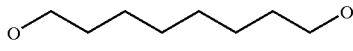 |
| C-24 | SCH₃ | 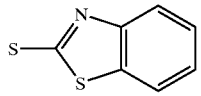 |
| C-25 | 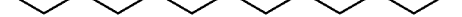 |  |
| C-26 | SCOCH₃ | 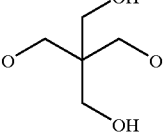 |
| C-27 | OSO₂CH₃ | 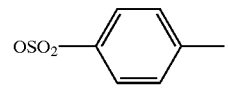 |
| C-28 | 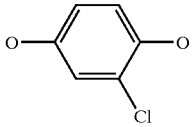 | |

TABLE 3-continued ii) Bifunctional Type (Group C)

| No. | X¹ | Z¹ |
|---|---|---|
| C-29 | N(CH₃)₂ | –O–C₆H₄–O– (para) |
| C-30 | morpholino (N-linked) | –O–(CH₂)₄–O– |
| C-31 | piperidino | 3,5-(NHSO₂–)₂–C₆H₃– |
| C-32 | F | –O–(CH₂)₄–O– |
| C-33 | NHCOCH₃ | piperazine-1,4-diyl |
| C-34 | NHSO₂–C₆H₄–CH₃ (para) | HN–(CH₂)₄–NH |
| C-35 | NHCO₂–C₆H₅ | HN–CH₂CH₂–O–CH₂CH₂–O–CH₂CH₂–NH |

TABLE 4

(Group D)

| No. | X² | Z² |
|---|---|---|
| D-1 | OCH₃ | –O–(CH₂)₆–O– |
| D-2 | OCH₃ | –O–(CH₂)₁₂–O– |
| D-3 | OC₂H₅ | –O–CH₂CH₂–O–CH₂CH₂–O–CH₂CH₂–O– |
| D-4 | OC₂H₅ | –O–CH₂CH₂–(O–CH₂CH₂)₂₁–O– (average number) |

TABLE 4-continued (Group D)

| No. | X² | Z² |
|---|---|---|
| D-5 | –O–CH₂–CH=CH₂ | –O–CH₂–C₆H₄–CH₂–O– (para) |
| D-6 | –O–CH₂–C₆H₅ | –O–C₆H₄–O– (para) |
| D-7 | OCH₃ | –OCO–(CH₂)₃–COO– |
| D-8 | OCH₃ | –OCO–(CH₂)₈–COO– |
| D-9 | O(n)C₄H₉ | –OCO–C₆H₄–COO– (para) |
| D-10 | O(n)C₄H₉ | –OCO–CH₂–C₆H₄–CH₂–COO– (para) |
| D-11 | –O–CH₂CH₂–OCH₃ | –OCO–C₆H₁₀–COO– |
| D-12 | –O–CH₂CH₂–N(CH₃)₂ | –OCONH–(CH₂)₆–NHCOO– |
| D-13 | OCH₃ | –OCONH–C₆H₄–NHCOO– (meta) |
| D-14 | OCH₃ | –OCONH–C₆H₄–C(CH₃)₂–C₆H₄–NHCOO– |
| D-15 | OCH₃ | –OSO₂–(CH₂)₅–SO₂O– |
| D-16 | O(n)C₁₂H₂₅ | –OSO₂–(trimethylphenyl)–SO₂O– |
| D-17 | OCH₃ | –OCO–(CH₂)₃–COO–(CH₂)₄–OCO–(CH₂)₃–COO– |

TABLE 4-continued (Group D)

| No. | X² | Z² |
|---|---|---|
| D-18 | OCH₃ | OCO~~~~CONH~~~~~~NHCO~~~~COO (structure) |
| D-19 | OCH₃ | OCO~~CO(O~~OCO-C₆H₄-CO)₂₀O~~OCO~~COO (average number) |
| D-20 | OC₂H₅ | OCO~~~CONH~~~~O (structure) |
| D-21 | OCH₃ | OCO~~~~O (structure) |
| D-22 | SCH₃ | OCO~~~~OCO (structure) |
| D-23 | S-C₆H₅ | OCO~~OCO (structure) |
| D-24 | 5-chloro-2-benzothiazolylthio | OCO~~OCO |
| D-25 | N(CH₃)(C₂H₅) | OCO~~~OCO |
| D-26 | morpholino | OCO~~~OCO |
| D-27 | NH(n)C₁₂H₂₅ | OCO~~~~OCO |
| D-28 | OCH₃ | S~~~~~S |
| D-29 | OCH₂CH₂OH | S~~~~~~S |
| D-30 | O~~~~OCOCH₃ | NHCO~~~~~~CONH |
| D-31 | OCH₃ | N(CH₃)~~~~~~N(CH₃) |
| D-32 | OCH₃ | CH₃N(CO)-C₆H₄-(CO)NCH₃ |

TABLE 4-continued
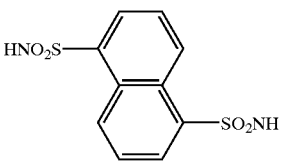
| No. | X² | Z² |
|---|---|---|
| D-33 | OCH₃ | 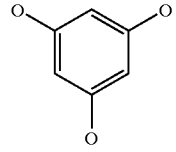 |
| D-34 | OCH₃ | 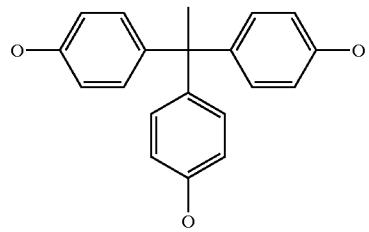 |
| D-35 | OC₂H₅ | O |
TABLE 5
iii) Trifunctional or Greater Functional Type (Group E)
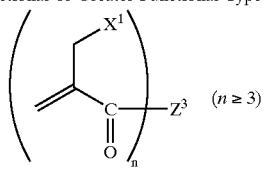
(n ≥ 3)
| No. | X¹ | Z³ |
|---|---|---|
| E-1 | OH | 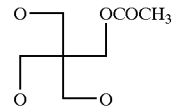 |
| E-2 | OCH₃ | 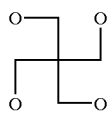 |
| E-3 | OCOCH₃ | |
| E-4 | OH | |

TABLE 5-continued iii) Trifunctional or Greater Functional Type (Group E)

$$\left( \begin{array}{c} X^1 \\ | \\ CH_2 \\ \| \\ C-Z^3 \\ \| \\ O \end{array} \right)_n \quad (n \geq 3)$$

| No. | $X^1$ | $Z^3$ |
|---|---|---|
| E-5 | OCOCH$_3$ | (structure: 1,3,5-benzenetricarboxylate with ethyleneoxy linkers) |
| E-6 | OCH$_2$CH=CH$_2$ | (structure: 1,3,5-benzene trisubstituted with ester/ethyleneoxy linkers) |
| E-7 | OH | (structure: 1,3,5-triazine with three butyleneoxy linkers) |
| E-8 | OH | (structure: pentaerythritol tetraester with ethyleneoxy linkers) |
| E-9 | OH | (structure: dipentaerythritol-based hexaether) |
| E-10 | OCOCH$_3$ | (structure: dipentaerythritol-based with OH group) |
| E-11 | SCH$_3$ | (structure: pentaerythritol tetraether) |
| E-12 | Cl | (structure: pentaerythritol tetraether) |

TABLE 5-continued iii) Trifunctional or Greater Functional Type (Group E)

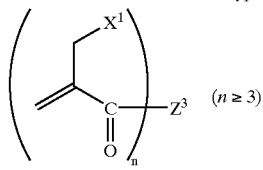
($n \geq 3$)

| No. | $X^1$ | $Z^3$ |
|---|---|---|
| E-13 | Br | (pentaerythritol tetraoxy) |
| E-14 | $-N^{\oplus}(CH_3)_3 \; {}^{\ominus}Cl$ | 1,3,5-trioxybenzene |
| E-15 | $-N(CH_3)_2$ | 1,3,5-trioxybenzene |
| E-16 | morpholino | (trioxy branched) |
| E-17 | $OCO(n)C_{12}H_{25}$ | $HN-CH_2-C(CH_2NH-)_2$ |
| E-18 | $-S-C_6H_5$ | $HN-CH_2CH_2-N(-CH_2CH_2NH-)$ |
| E-19 | $-SO_2-C_6H_5$ | (trioxy, OH) |
| E-20 | $-OSO_2-C_6H_4-CH_3$ | (pentaerythritol tetraoxy) |
| E-21 | $NHCOCH_3$ | (pentaerythritol tetraoxy) |
| E-22 | $-NHSO_2-C_6H_4-CH_3$ | (pentaerythritol tetraoxy) |

TABLE 5-continued iii) Trifunctional or Greater Functional Type (Group E)

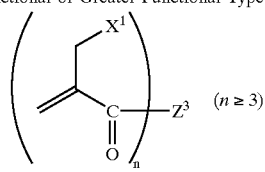

| No. | X¹ | Z³ |
|---|---|---|
| E-23 | O-CH(CH₃)-OC₂H₅ | pentaerythritol tetraether core |
| E-24 | O-C(CH₃)₃ | pentaerythritol tetraether core |
| E-25 | OH | pentaerythritol tetrakis(2-mercaptoethyl) ester |
| E-26 | OH | N,N,N',N'-tetra-substituted butanediamine |

TABLE 6

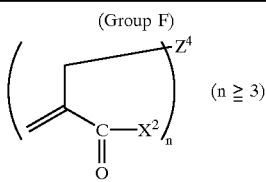

| No. | X² | Z⁴ |
|---|---|---|
| F-1 | OH | 1,3,5-trihydroxybenzene (phloroglucinol) |
| F-2 | OCH₃ | pentaerythritol core |
| F-3 | OCH₃ | benzene-1,3,5-tricarboxylate |
| F-4 | OCH₃ | EDTA-tetraacetate |

TABLE 6-continued
| F-5 | OC$_2$H$_5$ | 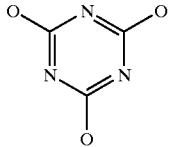 |
| --- | --- | --- |
| F-6 | OCH$_3$ | 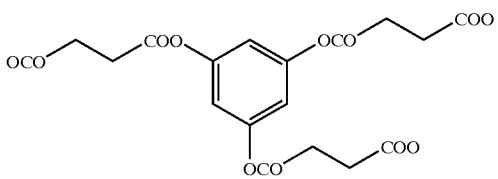 |
| F-7 | OCH$_3$ | 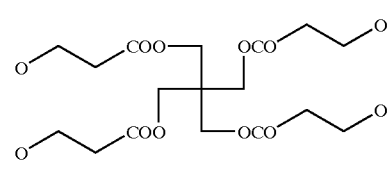 |
| F-8 | O(n)C$_3$H$_7$ | 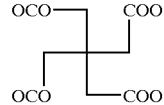 |
| F-9 |  | 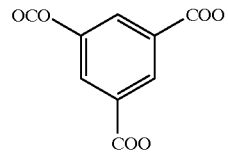 |
| F-10 | O(n)C$_{12}$H$_{25}$ | 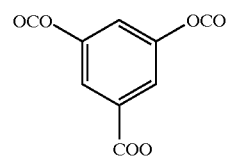 |
| F-11 | 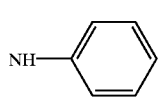 | 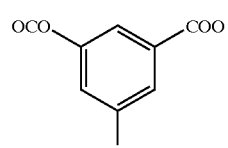 |
| F-12 | NH—(n)C$_4$H$_9$ | 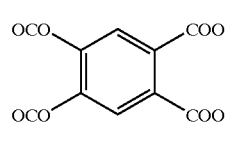 |
| F-13 | Cl | 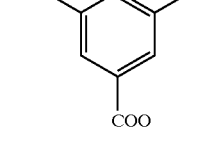 |
| F-14 | O$^\ominus$Na$^\oplus$ | 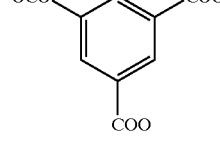 |

TABLE 6-continued

| | | |
|---|---|---|
| F-15 | (tetrabutylammonium propoxide, zwitterionic structure) | benzene-1,3,5-tricarboxylate (trianion) |
| F-16 | OCH₃ | naphthalene-1,3,7-trisulfonate |
| F-17 | OCH₃ | pentaerythritol tetrakis(3-mercaptoethyl) ester |
| F-18 | OCH₃ | pentaerythritol tetrakis(3-mercaptopropionate) analog |
| F-19 | 1-acetyl piperazine | 1,4-diaminobutane |
| F-20 | morpholine | pentaerythritol (tris-O, OH) |
| F-21 | OCH₃ | dipentaerythritol |
| F-22 | morpholine | piperazinium dichloride |

| | (iv) Polymer Type | |
|---|---|---|
| G-1 | —(CH₂CH)₈₀— / OCO— (with =CH₂, CH₂OH)    —(CH₂CH)₁₀— / OH    —(CH₂CH)₁₀— / OCOCH₃ | Mw 20000 |

| | | Mw |
|---|---|---|
| G-2 | (structures) | Mw 15000 |
| G-3 | (structures) | Mw 30000 |
| G-4 | (structures) | Mw 50000 |
| G-5 | (structures) | Mw 20000 |
| G-6 | (structures) | Mw 10000 |
| G-7 | (structures) | Mw 20000 |
| G-8 | (structures) | Mw 20000 |
| G-9 | (structures) | Mw 5000 |

-continued
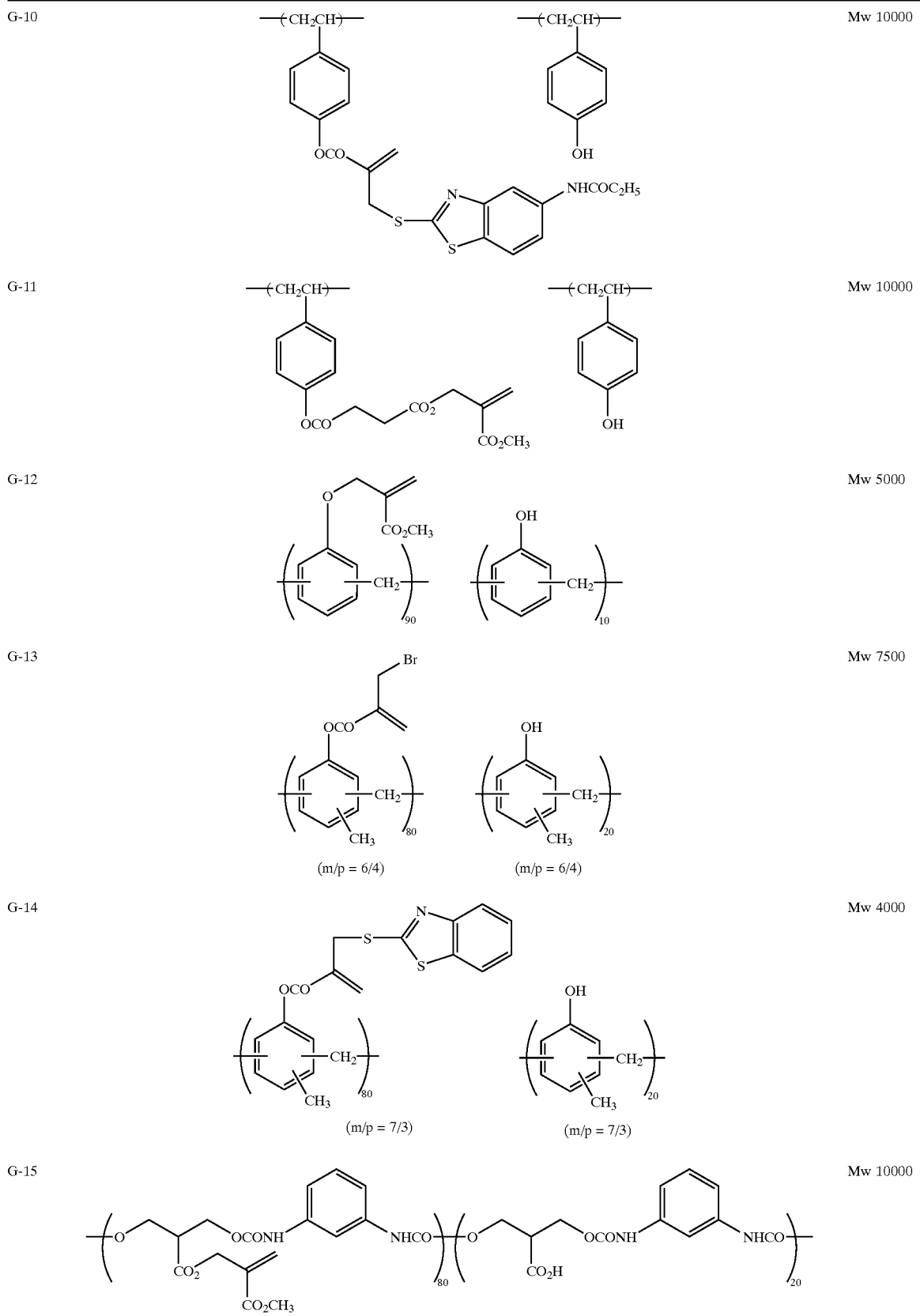

-continued
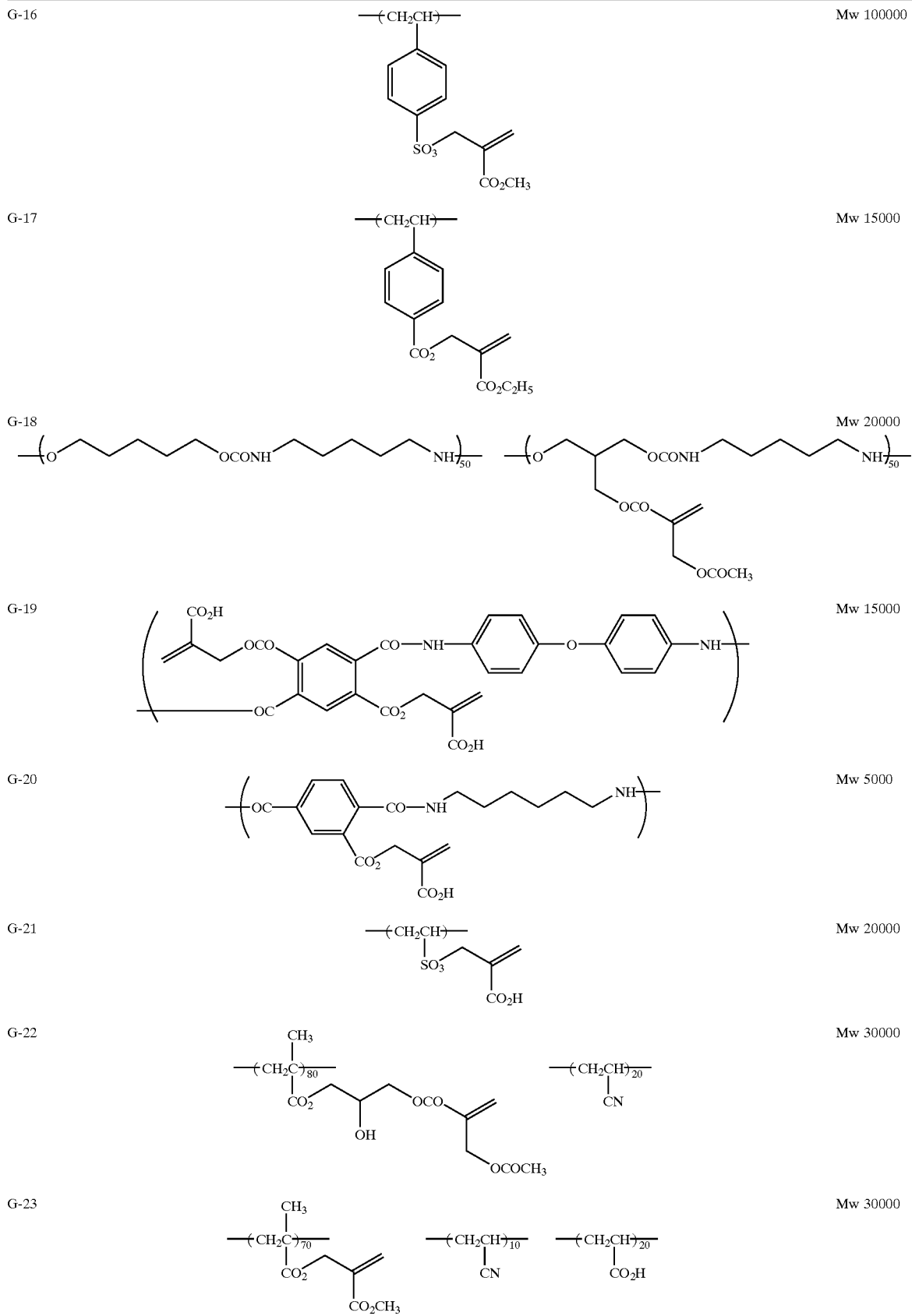

-continued
G-24 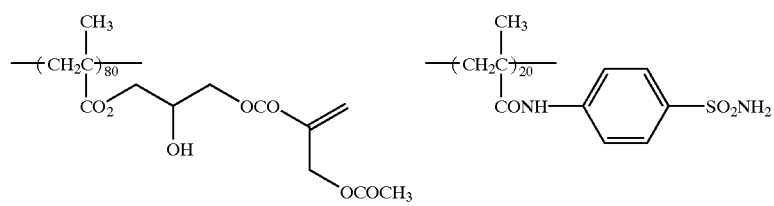 Mw 20000
G-25 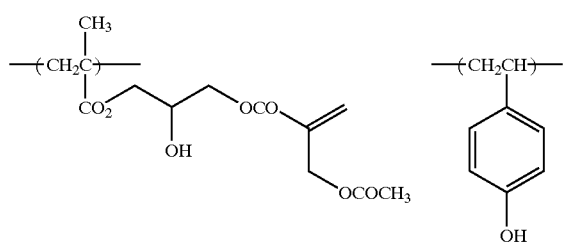 Mw 15000
G-26 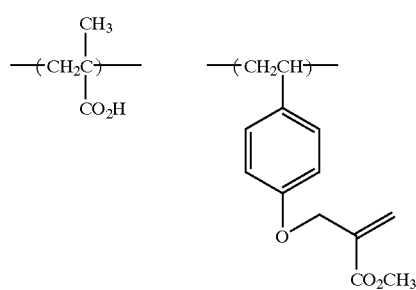 Mw 10000
(v) Others (group H)
H-1 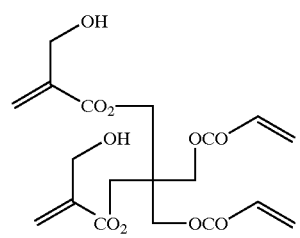
H-2 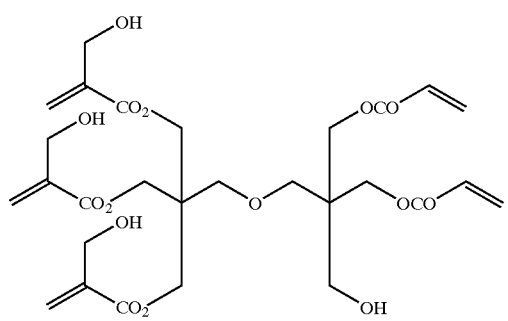
H-3 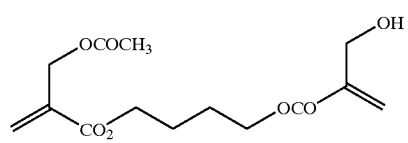

-continued
H-4 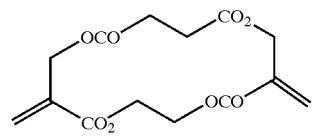
H-5 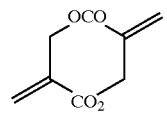
H-6 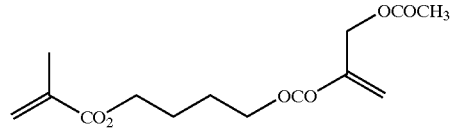
H-7 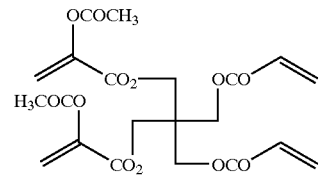
(Group J)
J-1 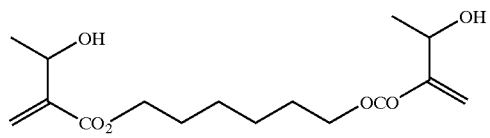
J-2 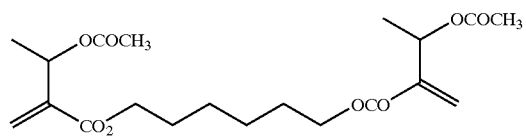
J-3 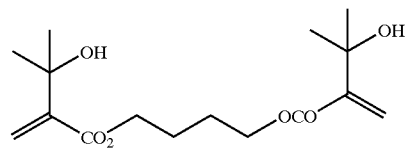
J-4 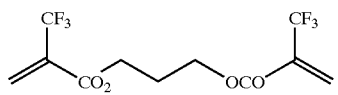
J-5 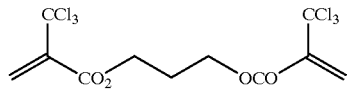
J-6 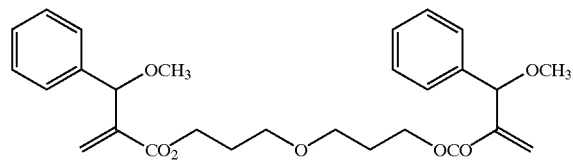

-continued
J-7 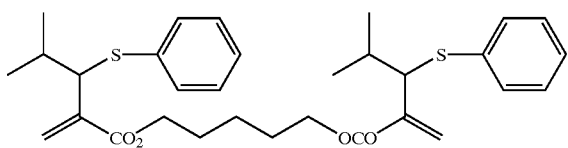
J-8 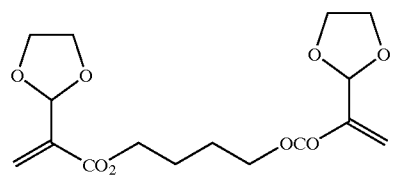
J-9 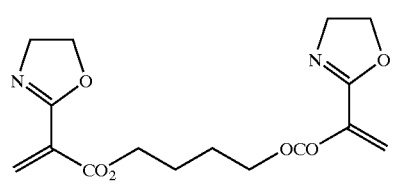
J-10 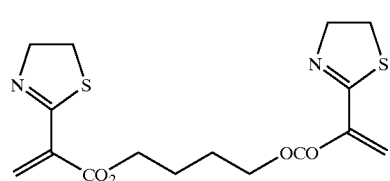
J-11 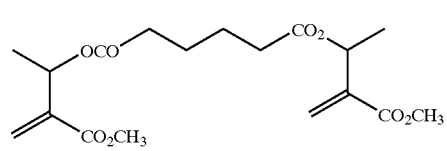
J-12 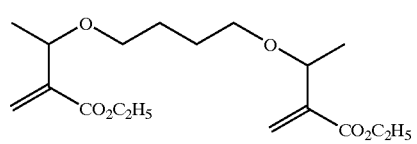
J-13 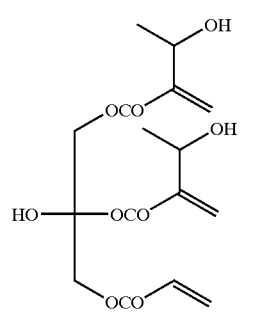

J-14

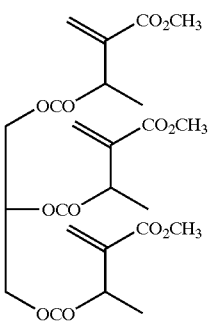

J-15

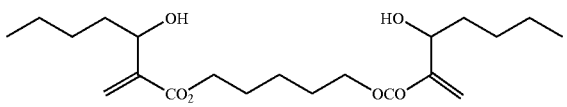

The compound of the present invention is most preferably a compound of polyfunctional type (bifunctional or greater function type or polymer type) having two or more structures represented by formula (I) within the molecule or a compound having a structure represented by formula (I) and another radical polymerizable group in combination, which can substantially make a polyfunctional contribution to the photopolymerization.

In the photopolymerizable composition of the present invention, the compound having a structure represented by formula (I) is used as the compound having an addition polymerizable ethylenically unsaturated bond and the compound is used alone or in combination of two or more thereof or used as a mixture with a conventionally known compound having an addition polymerizable ethylenically unsaturated bond which is described below.

Examples of conventionally known compounds having an addition polymerizable ethylenically unsaturated bond include esters of an unsaturated carboxylic acid (e.g., acrylic acid, methacrylic acid, itaconic acid, crotonic acid, isocrotonic acid, maleic acid) with an aliphatic polyhydric alcohol compound, and amides of the above-described unsaturated carboxylic acid with an aliphatic polyhydric amine compound.

Specific examples of the ester monomer of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer; methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(acryloxy-ethoxy)phenyl]dimethylmethane; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonic acid esters such as ethylene glycol dicrotonate, tetramethylene glycol dicrotonate, pentaerythritol dicrotonate and sorbitol tetradicrotonate; isocrotonic acid esters such as ethylene glycol diisocrotonate, pentaerythritol diisocrotonate and sorbitol tetraisocrotonate; maleic acid esters such as ethylene glycol dimaleate, triethylene glycol dimaleate, pentaerythritol dimaleate and sorbitol tetramaleate; and a mixture of these ester monomers. Specific examples of the amide monomer of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other examples include vinyl urethane compounds having two or more polymerizable vinyl groups in one molecule described in JP-B-48-41708, which are obtained by adding a vinyl monomer having a hydroxyl group represented by the following formula (A) to a polyisocyanate compound having two or more isocyanate groups within one molecule:

$$CH_2=C(R)COOCH_2CH(R')OH \qquad (A)$$

wherein R and R' each represents H or $CH_3$.

Also, polyfunctional acrylates and methacrylates such as urethane acrylates described in JP-A-51-37193, polyester acrylates described in JP-A-48-64183, JP-B-49-43191 and JP-B-52-30490 and epoxy acrylates obtained by reacting an epoxy resin with a (meth)acrylic acid may be used. Furthermore, those described as a photocurable monomer or oligomer in *Nippon Secchaku Kyokaishi (Journal of Japan Adhesive Society)*, Vol. 20, No. 7, pp. 300–308 (1984) may be used. In the present invention, these monomers each may be used in the chemical form of a prepolymer (dimer, trimer or oligomer) or a mixture thereof.

The compound containing all polymerizable compounds including the compound having a structure represented by formula (I) is usually used in an amount of from 1 to 99.99%, preferably from 5 to 90.0%, more preferably from 10 to 70% ("%" as used herein means "% by weight (wt %)"), based on the entire weight of components of the photopolymerizable composition.

However, the content of the compound having a structure represented by formula (I) of the present invention in the compound containing all polymerizable groups is from 0.005 to 100 wt %, preferably from 1 to 100 wt %, more preferably from 30 to 100 wt %. If the content is less than 0.005 wt %, the effect of the present invention may not be brought out.

The photopolymerization initiator used in the photopolymerizable composition of the present invention is described below.

Preferred examples of the photopolymerization initiator include (a) aromatic ketones, (b) aromatic onium salt compounds, (c) organic peroxides, (d) thio compounds, (e) hexaarylbiimidazole compounds, (f) ketooxime ester compounds, (g) borate compounds, (h) azinium compounds, (i) metallocene compounds, (j) active ester compounds and (k) compounds having a carbon halogen bond.

Preferred examples of the aromatic ketone (a) include compounds having a benzophenone skeleton or a thioxanthone skeleton described in J. P. Fouassier and J. F. Rabek, *Radiation Curing in Polymer Science and Technology*, pp. 77–117 (1993), such as:

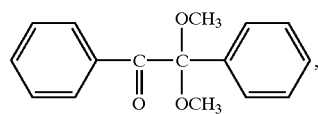

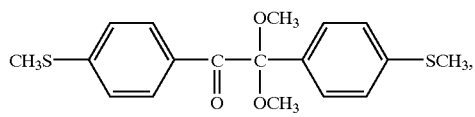

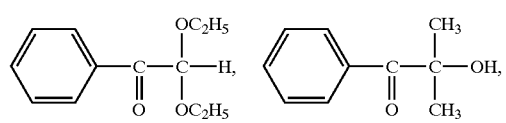

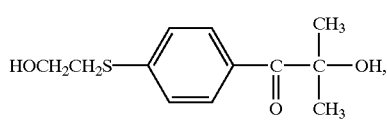

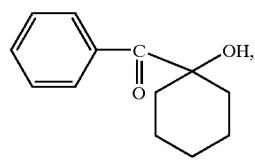

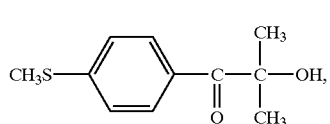

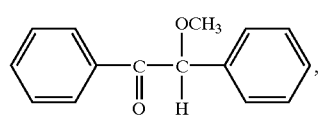

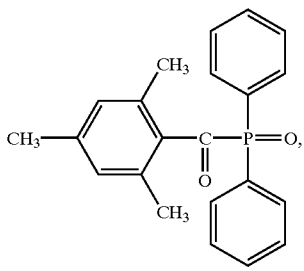

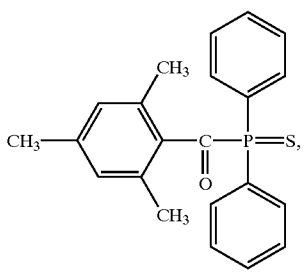

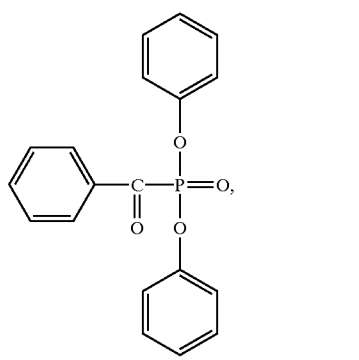

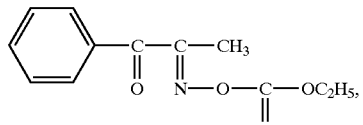

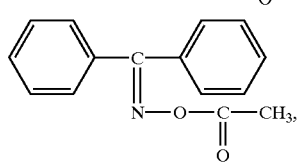

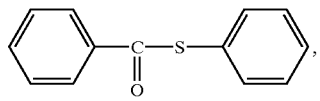

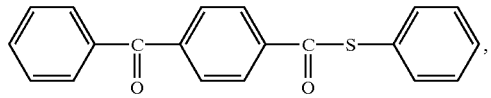

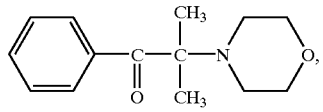

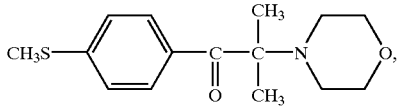

-continued
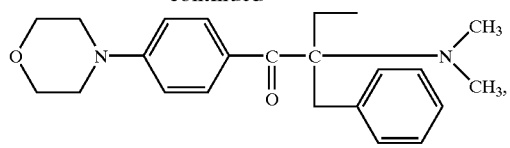
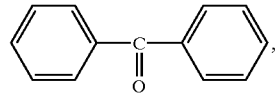
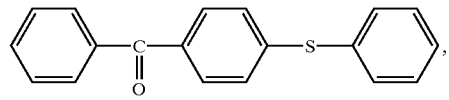
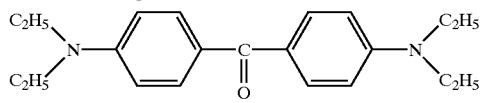
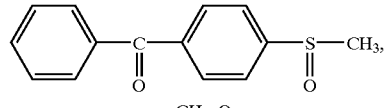
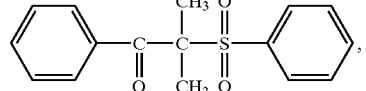
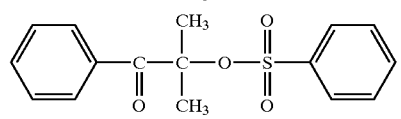
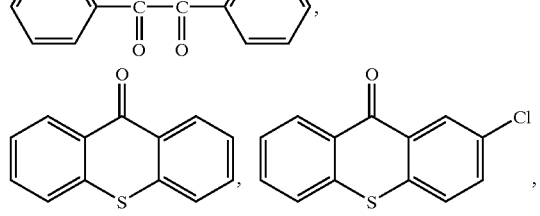
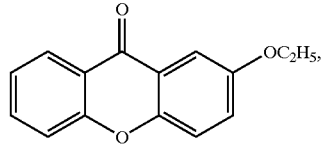
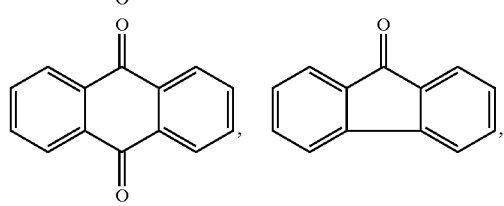
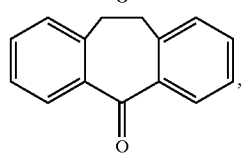
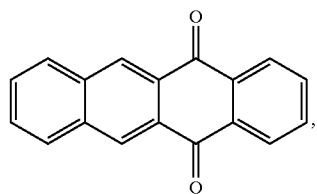
-continued
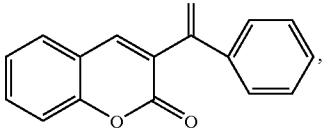
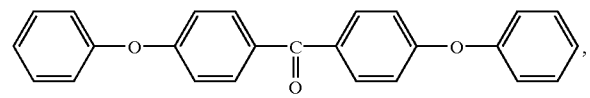
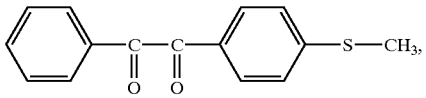
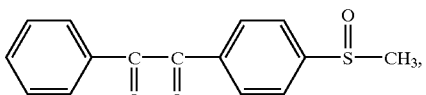
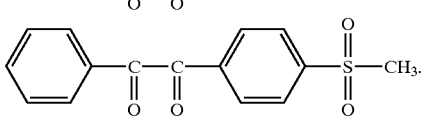
More preferred examples of the aromatic ketone (a) include α-thiobenzophenone compounds described in JP-B-47-6416, benzoin ethers described in JP-B-47-3981 such as
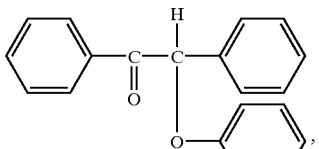
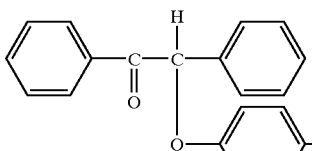
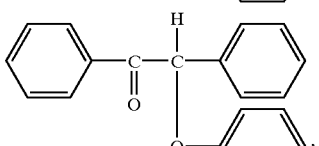
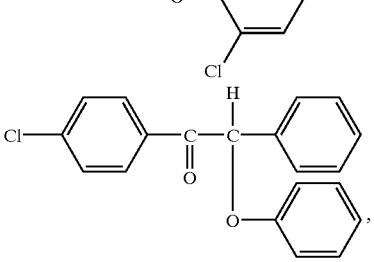
α-substituted benzoin compounds described in JP-B-47-22326 such as
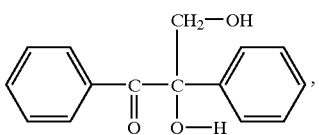

-continued
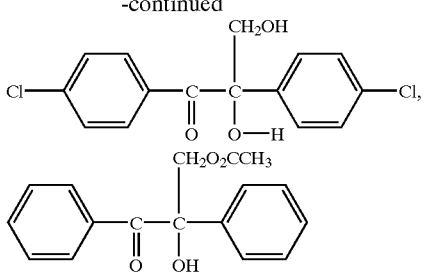
benzoin derivatives described in JP-B-47-23664, aroylphosphonic acid esters described in JP-A-57-30704, dialkoxybenzophenones described in JP-B-60-26483 such as
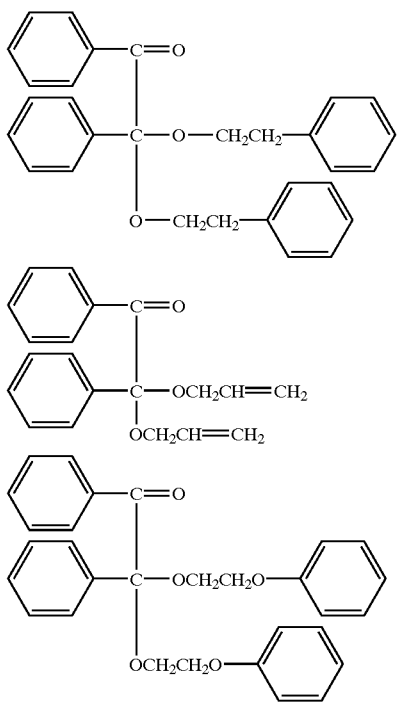
benzoin ethers described in JP-B-60-26403 and JP-A-62-81345 such as
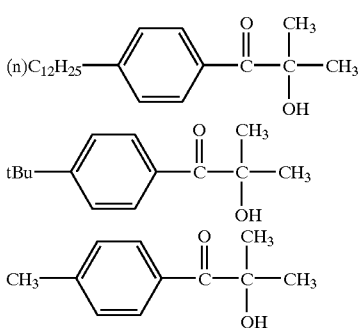
α-aminobenzophenones described in JP-B-1-34242, U.S. Pat. No. 4,318,791 and European patent 0284561A1 such as
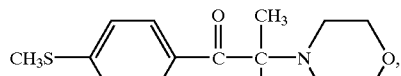
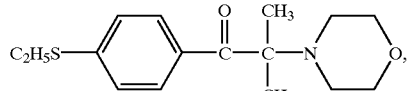
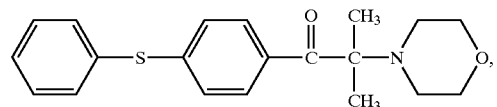
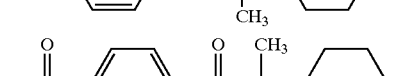
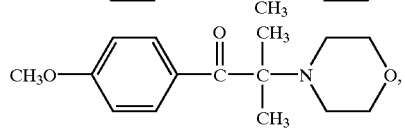
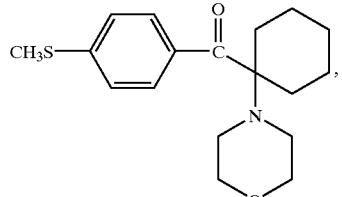
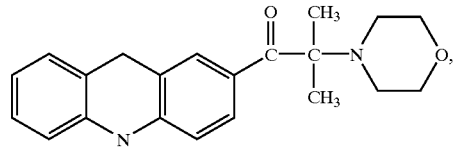
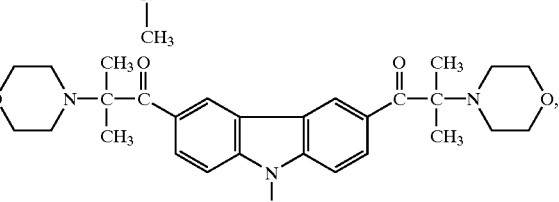
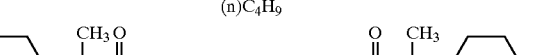
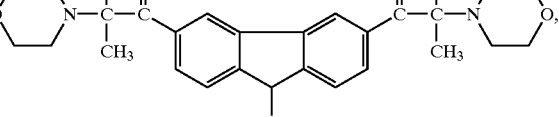
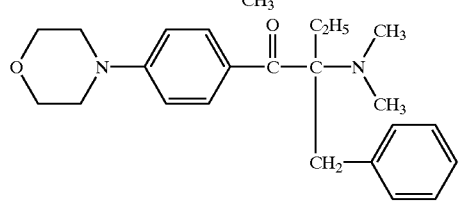
p-di(dimethylaminobenzoyl)benzenes described in JP-A-2-211452 such as

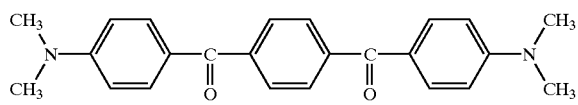

thio-substituted aromatic ketones described in JP-A-61-194062 such as

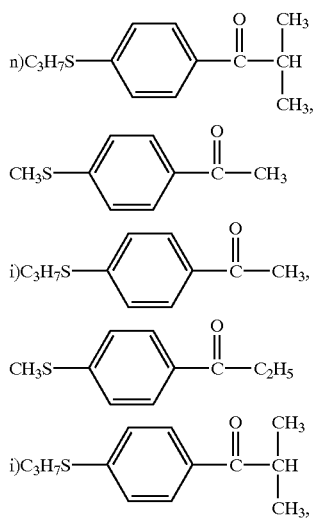

acylphosphine sulfides described in JP-B-2-9597 such as

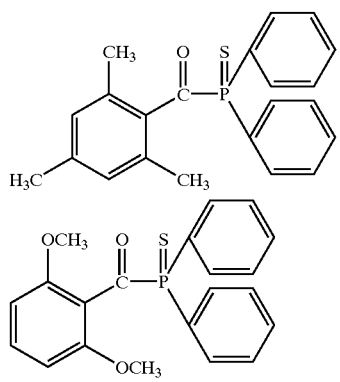

acylphosphines described in JP-B-2-9596 such as

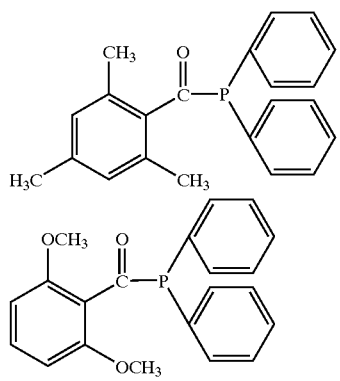

thioxanthones described in JP-B-63-61950 and coumarins described in JP-B-59-42864.

The aromatic onium salt (b) as another example includes aromatic onium salts of elements belonging to Groups V, VI and VII of the Periodic Table, more specifically, N, P, As, Sb, Bi, O, S, Se, Te and I. Examples of the aromatic onium salt include the compounds described in JP-B-52-14277, JP-B-52-14278 and JP-B-52-14279. Specific examples thereof include the following compounds.

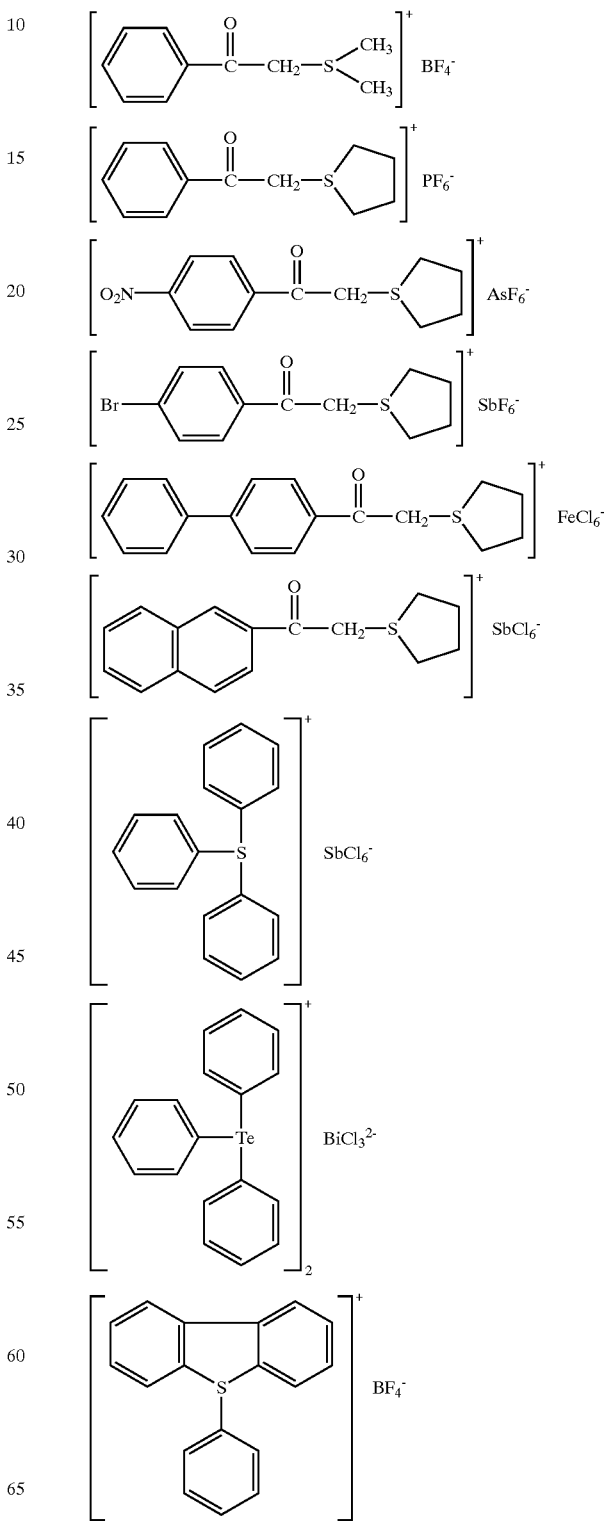

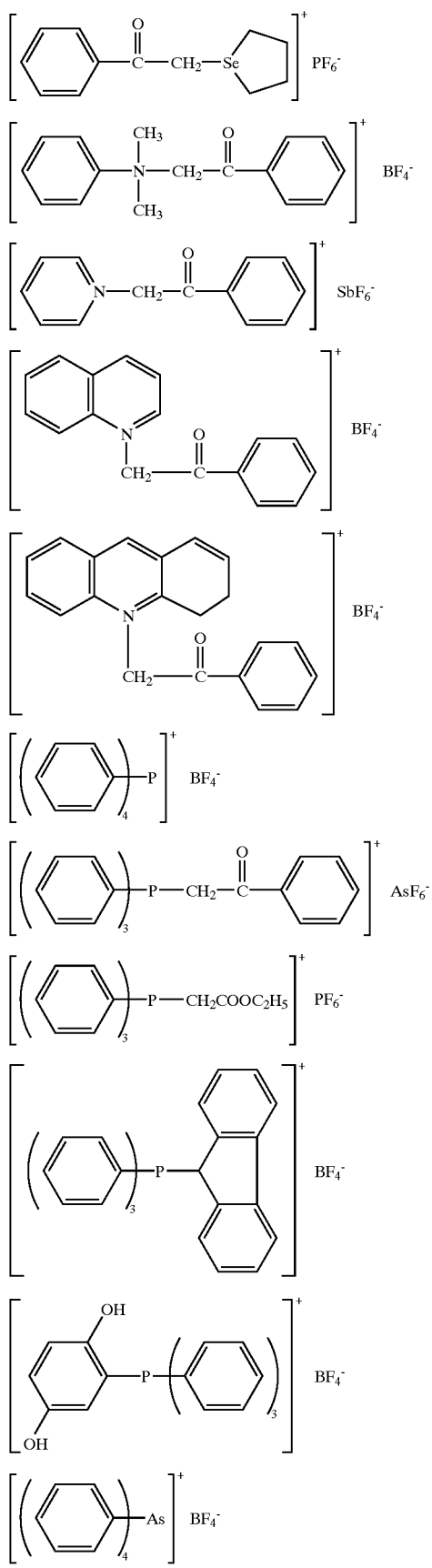
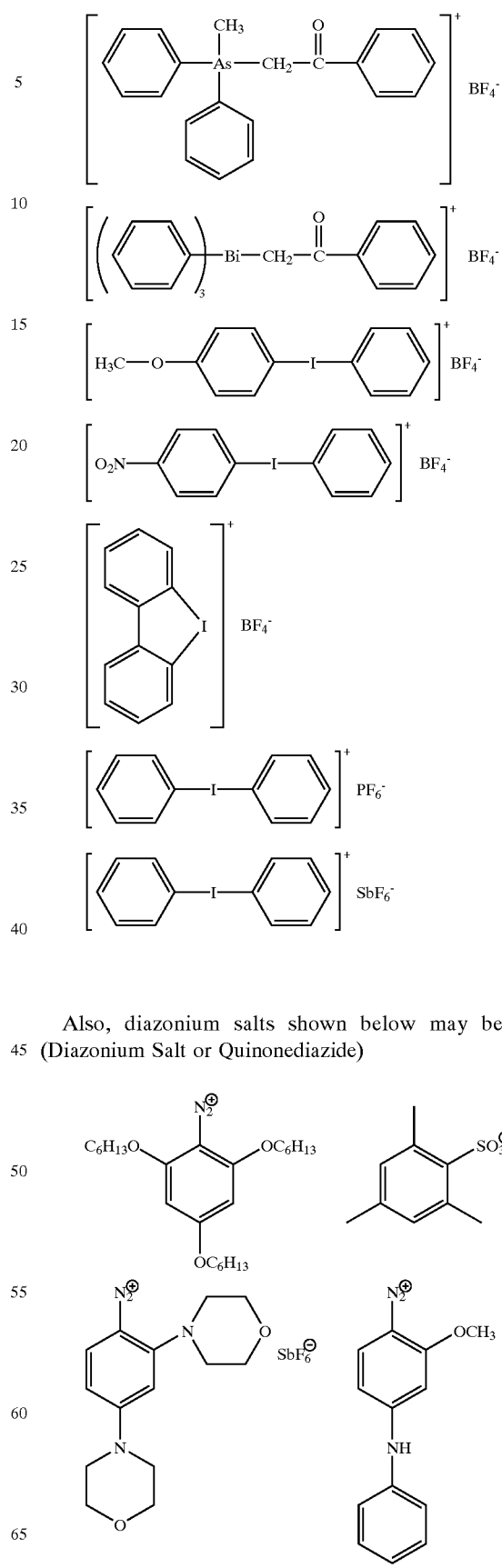
Also, diazonium salts shown below may be used. (Diazonium Salt or Quinonediazide)
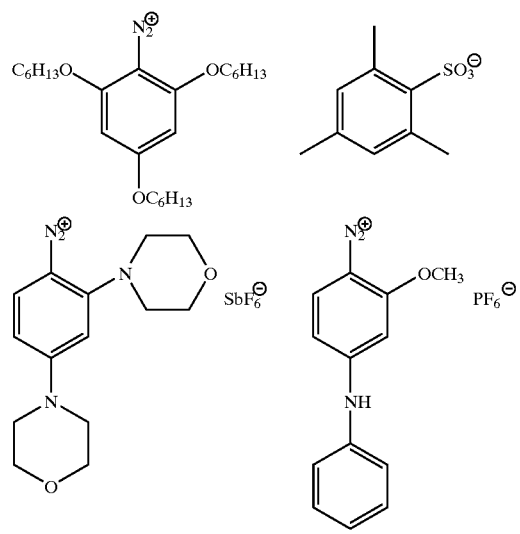

-continued

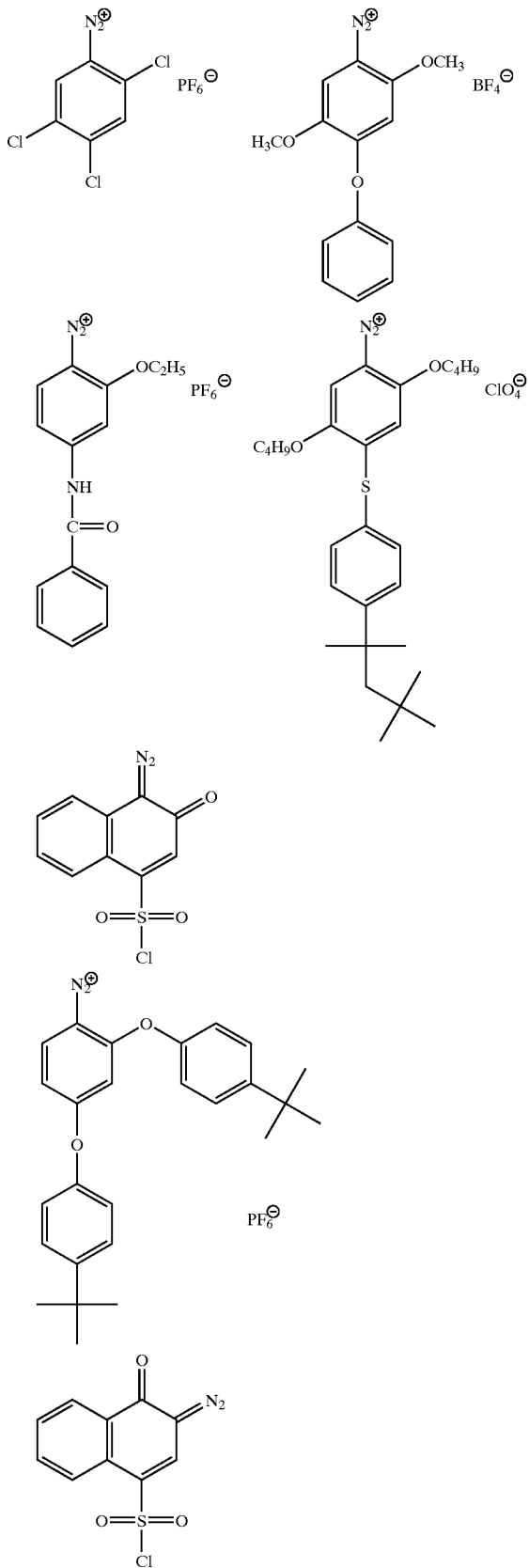

The organic peroxide (c) as still another example of the photopolymerization initiator for use in the present invention includes almost all organic compounds having one or more oxygen-oxygen bonds within the molecule and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramfethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(tert-butylperoxycarbonyl) benzophenone, 3,3',4,4'-tetra-(tert-amylperoxycarbonyl) benzophenone, 3,3',4,4'-tetra-(tert-hexylperoxycarbonyl) benzophenone, 3,3',4,4'-tetra-(tert-octylperoxycarbonyl) benzophenone, 3,3',4,4'-tetra-(cumylperoxycarbonyl) benzophenone, 3,3',4,4'-tetra-(p-isopropylcumylperoxycarbonyl)benzophenone, carbonyldi (tert-butylperoxy dihydrogen diphthalate) and carbonyldi (tert-hexylperoxy dihydrogen diphthalate).

Among these, preferred are ester peroxides such as 3,3', 4,4'-tetra-(tert-butylperoxycarbonyl)benzophenone, 3,3',4, 4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-((cumylperoxycarbonyl)benzophenone, 3,3',4,4'-tetra-(p-isopropylcumylperoxycarbonyl)benzophenone and di-tert-butyl diperoxyisophthalate.

The thio compound (d) as the photopolymerization initiator for use in the present invention is represented by the following formula [II]:

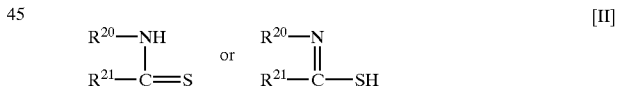

wherein $R^{20}$ represents an alkyl group, an aryl group or a substituted aryl group and $R^{21}$ represents hydrogen atom or an alkyl group or $R^{20}$ and $R^{21}$ may combine with each other to represent a nonmetallic atom group necessary for forming a 5-, 6- or 7-membered ring which may contain a hetero atom selected from oxygen atom, sulfur atom and nitrogen atom.

The alkyl group in formula [II] is preferably an alkyl group having from 1 to 4 carbon atoms. The aryl group represented is preferably an aryl group having from 6 to 10 carbon atoms such as phenyl and naphthyl and the substituted aryl group includes the above-described aryl group substituted by a halogen atom such as chlorine, an alkyl group such as methyl, or an alkoxy group such as methoxy and ethoxy. $R^{21}$ is preferably an alkyl group having from 1 to 4 carbon atoms. Specific examples of the thio compound represented by formula [II] include the following compounds.

| No. | R²⁰ | R²¹ |
|---|---|---|
| 1 | H | H |
| 2 | H | CH₃ |
| 3 | CH₃ | H |
| 4 | CH₃ | CH₃ |
| 5 | C₆H₅ | C₂H₅ |
| 6 | C₆H₅ | C₄H₉ |
| 7 | C₆H₄Cl | CH₃ |
| 8 | C₆H₄Cl | C₄H₉ |
| 9 | C₆H₄—CH₃ | C₄H₉ |
| 10 | C₆H₄—OCH₃ | CH₃ |
| 11 | C₆H₄—OCH₃ | C₂H₅ |
| 12 | C₆H₄OC₂H₅ | CH₃ |
| 13 | C₆H₄OC₂H₅ | C₂H₅ |
| 14 | C₆H₄OCH₃ | C₄H₉ |
| 15 | —(CH₂)₂— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH=CH—N(CH₃)— | |
| 25 | —(CH₂)₃—S— | |
| 26 | —(CH₂)₂—CH(CH₃)—S— | |
| 27 | —(CH₂)₃—O— | |
| 28 | —(CH₂)₅— | |
| 29 | —C₆H₄—O— | |
| 30 | —N=C(SCH₃)—S— | |
| 31 | —C₆H₄—NH— | |
| 32 | 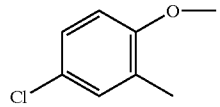 | |

The hexaarylbiimidazole (e) as another example of the photopolymerization initiator for use in the present invention includes lophine dimers described in JP-B-45-37377 and JP-B-44-86516, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)-biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

The ketooxime ester (f) as another example of the photopolymerization initiator for use in the present invention includes 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate salt (g) as still another example of the photopolymerization initiator for use in the present invention includes the compaund represented by the following formula [III]:

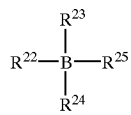

[III]

wherein $R^{22}$, $R^{23}$, $R^{24}$ and $R^{25}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, two or more groups of $R^{22}$, $R^{23}$, $R^{24}$ and $R^{25}$ may combine to form a cyclic structure, provided that at least one of $R^{22}$, $R^{23}$, $R^{24}$ and $R^{25}$ is a substituted or unsubstituted alkyl group, and $Z^+$ represents an alkali metal cation or a quaternary ammonium cation. The alkyl group represented by $R^{22}$, $R^{23}$, $R^{24}$ or $R^{25}$ includes a linear, branched or cyclic alkyl group preferably having from 1 to 18 carbon atoms. Specific examples thereof include methyl, ethyl, propyl, isopropyl, butyl, pentyl, hexyl, octyl, stearyl, cyclobutyl, cyclopentyl and cyclohexyl. The substituted alkyl group includes these alkyl groups which are substituted by a substituent such as halogen atom (e.g., —Cl, —Br), a cyano group, a nitro group, an aryl group (preferably a phenyl group), a hydroxy group,

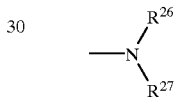

wherein $R^{26}$ and $R^{27}$ each independently represents hydrogen atom, an alkyl group having from 1 to 14 carbon atoms or an aryl group, —COOR²⁸ wherein $R^{28}$ represents hydrogen atom, an alkyl group having from 1 to 14 carbon atoms or an aryl group, —OCOR²⁹ or —OR³⁰ wherein $R^{29}$ and $R^{30}$ each represents an alkyl group having from 1 to 14 carbon atoms or an aryl group. The aryl group represented by $R^{22}$, $R^{23}$, $R^{24}$ or $R^{25}$ includes mono-, di- and tri-cyclic aryl groups such as phenyl group and naphthyl group, and the substituted aryl group includes these aryl groups which are substituted by a substituent described above for the substituted alkyl group or by an alkyl group having from 1 to 14 carbon atoms. The alkenyl group represented by $R^{22}$, $R^{23}$, $R^{24}$ or $R^{25}$ includes linear, branched and cyclic alkenyl groups each having from 2 to 18 carbon atoms and the substituent of the substituted alkenyl group includes the substituents described above for the substituted alkyl group. The alkynyl group represented by $R^{22}$, $R^{23}$, $R^{24}$ or $R^{25}$ includes linear and branched alkynyl groups each having from 2 to 28 carbon atoms and the substituent of the substituted alkynyl group includes the substituents described above for the substituted alkyl group. The heterocyclic group represented by $R^{22}$, $R^{23}$, $R^{24}$ or $R^{25}$ includes 5- and greater membered, preferably 5- to 7-membered heterocyclic groups each containing at least one of N, S and O and the heterocyclic group may contain a condensed ring and may further have a substituent described above as the substituent of the substituted alkyl group. Specific examples of the compound represented by formula [III] include the compounds described in U.S. Pat. Nos. 3,567,435 and 4,343,891 and European Patent Nos. 109,772 and 109,773 and the compounds described below.

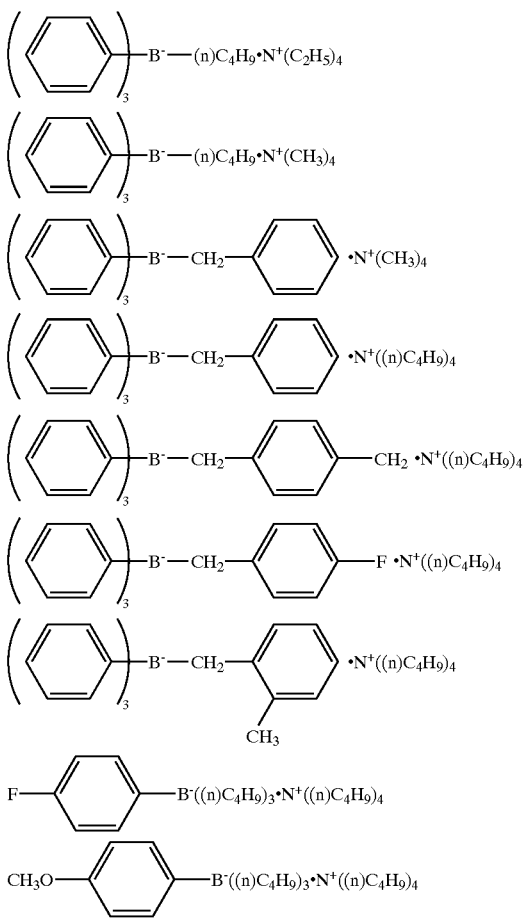

Examples of the azinium salt compound (h) as another example of the photopolymerization initiator for use in the present invention include the compounds having an N—O bond described in JP-A-63-138345, JP-A-63-142345, JP-A-63-142346, JP-A-63-143537 and JP-B-46-42363.

Examples of the metallocene compound (i) as still another example of the photopolymerization initiator include titanocene compounds described in JP-A-59-152396, JP-A-61-151197, JP-A-63-41484, JP-A-2-249 and JP-A-2-4705 and iron-allene complexes described in JP-A-1-304453 and JP-A-1-152109.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, di-methylcyclopentadienyl-Ti-bis-2,3,5,6-tetrafluorophen-1-yl, dimethylcyclopentadienyl-Ti-bis-2,4-difluorophen-1-yl, bis-(cyclopentadienyl)-bis(2,6-difluoro-3-(pyr-1-yl) phenyl)-titanium, bis(cyclopentadienyl)bis[2,6-difluoro-3-(methyl-sulfonamido)phenyl]titanium, bis (cyclopentadienyl)bis[2,6-difluoro-3-(N-butylbiaroylamino)phenyl]titanium, bis(cyclopentadienyl) bis[2,6-difluoro-3-(N-ethylacetyl-amino)phenyl]titanium, bis(cyclopentadienyl)bis[2,6-difluoro-3-(N-methylacetylamino)phenyl]titanium, bis(cyclo-pentadienyl) bis[2,6-difluoro-3-(N-ethylpropionylamino)-phenyl] titanium, bis(cyclopentadienyl)bis[2,6-difluoro-3-(N-ethyl-(2,2-dimethylbutanoyl)amino)phenyl]titanium, bis (cyclopentadienyl)bis[2,6-difluoro-3-(N-butyl-(2,2-dimethylbutanoyl)amino)phenyl]titanium, bis(cyclopentadienyl)bis[2,6-difluoro-3-(N-pentyl-(2,2-dimethylbutanoyl)amino)phenyl]titanium, bis(cyclopentadienyl)bis-[2,6-difluoro-3-(N-hexyl)-(2,2-dimethylbutanoyl)phenyl]-titanium, bis(cyclopentadienyl)bis[2,6-difluoro-3-(N-methylbutyrylamino)phenyl]titanium, bis (cyclopentadienyl)-bis[2,6-difluoro-3-(N-methylpentanoylamino)phenyl]titanium, bis (cyclopentadienyl)bis[2,6-difluoro-3-(N-ethylcyclohexylcarbonylamino)phenyl]titanium, bis (cyclopentadienyl)-bis[2,6-difluoro-3-(N-ethylisobutyrylamino)phenyl]titanium, bis (cyclopentadienyl)bis[2,6-difluoro-3-(N-ethylacetyl-amino) phenyl]titanium, bis(cyclopentadienyl)bis[2,6-difluoro-3-(2,2,5,5-tetramethyl-1,2,5-azadisilolidin-1-yl)phenyl] titanium, bis(cyclopentadienyl)bis[2,6-difluoro-3-(octylsulfonamido)phenyl]titanium, bis(cyclopentadienyl)-bis[2,6-difluoro-3-(4-tolylsulfonamido)phenyl]titanium, bis (cyclopentadienyl)bis[2,6-difluoro-3-(4-dodecylphenyl-sulfonylamido)phenyl]titanium, bis(cyclopentadienyl)bis[2, 6-difluoro-3-(4-(1-pentyl-heptyl)phenylsulfonylamido) phenyl]titanium, bis(cyclopenta-dienyl)bis[2,6-difluoro-3-(ethylsulfonylamido)phenyl]-titanium, bis (cyclopentadienyl)bis[2,6-difluoro-3-((4-bromophenyl) sulfonylamido)phenyl]titanium, bis(cyclopenta-dienyl)bis [2,6-difluoro-3-(2-naphthylsulfonylamido)phenyl]-titanium, bis(cyclopentadienyl)bis[2,6-difluoro-3-(hexadecylsulfonylamido)phenyl]titanium, bis(cyclopenta-dienyl)bis[2,6-difluoro-3-(N-methyl-(4-dodecylphenyl)-sulfonylamido)phenyl]titanium, bis(cyclopentadienyl)bis[2, 6-difluoro-3-(N-methyl-4-(1-pentylheptyl)phenyl) sulfonylamido)]titanium, bis(cyclo-pentadienyl)bis[2,6-difluoro-3-(N-hexyl-(4-tolyl)sulfonyl-amido)phenyl] titanium, bis(cyclopentadienyl)bis[2,6-difluoro-3-(pyrrolidine-2,5-dion-1-yl)phenyl]titanium, bis (cyclopentadienyl)bis[2,6-difluoro-3-(3,4-dimethyl-3-pyrrolidine-2,5-dion-1-yl)phenyl]titanium, bis(cyclopenta-dienyl)bis[2,6-difluoro-3-(phthalimido)phenyl]titanium, bis (cyclopentadienyl)bis[2,6-difluoro-3-isobutoxycarbonyl-amino)phenyl]titanium, bis(cyclopentadienyl)bis[2,6-difluoro-3-(ethoxycarbonylamino)phenyl]titanium, bis (cyclo-pentadienyl)bis[2,6-difluoro-3-((2-chloroethoxy) carbonyl-amino)phenyl]titanium, bis(cyclopentadienyl)bis [2,6-difluoro-3-(phenoxycarbonyl-amino)phenyl]titanium, bis(cyclopentadienyl)bis[2,6-difluoro-3-(3-phenylthioureido)phenyl]titanium, bis(cyclo-pentadienyl) bis[2,6-difluoro-3-(3-butylthioureido)phenyl]-titanium, bis (cyclopentadienyl)bis[2,6-difluoro-3-(3-phenylureido) phenyl]titanium, bis(cyclopentadienyl)bis[2,6-difluoro-3-(3-butylureido)phenyl]titanium, bis(cyclopenta-dienyl)bis [2,6-difluoro-3-(N,N-diacetylamino)phenyl]-titanium, bis (cyclopentadienyl)bi bis(cyclopentadienyl)bis[2,6-difluoro-3-(acetylamino)-phenyl]titanium, bis(cyclopentadienyl)bis [2,6-difluoro-3-(butylamino)phenyl]titanium, bis (cyclopentadienyl)bis[2,6-difluoro-3-(decanoylamino) phenyl]titanium, bis(cyclopenta-dienyl)bis[2,6-difluoro-3-(octadecanoylamino)phenyl]-titanium, bis (cyclopentadienyl)bis[2,6-difluoro-3-(isobutylamino) phenyl]titanium, bis(cyclopentadienyl)-bis[2,6-difluoro-3-(2-ethylhexanoylamino)phenyl]titanium, bis (cyclopentadienyl)bis[2,6-difluoro-3-(2-methylbutanoyl-amino)phenyl]titanium, bis(cyclopentadienyl)bis[2,6-difluoro-3-(pivaloylamino)phenyl]titanium, bis (cyclopentadienyl)bis[2,6-difluoro-3-(2,2-dimethyl-butanoylamino)phenyl]titanium, bis(cyclopentadienyl)bis-

[2,6-difluoro-3-(2-ethyl-2-methylheptanoylamino)phenyl]-titanium, bis(cyclopentadienyl)bis[2,6-difluoro-3-(cyclohexylcarbonylamino)phenyl]titanium, bis(cyclopentadienyl)-bis[2,6-difluoro-3-(2,2-dimethyl-3-chloropropanoylamino)-phenyl]titanium, bis(cyclopentadienyl)bis[2,6-difluoro-3-(3-phenylpropanoylamino)phenyl]titanium, bis(cyclopentadienyl)bis[2,6-difluoro-3-(2-chloromethyl-2-methyl-3-chloropropanoylamino)phenyl]titanium, bis(cyclopentadienyl)bis[2,6-difluoro-3-(3,4-xyloylamino)-phenyl]titanium, bis(cyclopentadienyl)bis[2,6-difluoro-3-(4-ethylbenzoylamino)phenyl]titanium, bis(cyclopentadienyl)bis[2,6-difluoro-3-(2,4,6-mesylcarbonylamino)-phenyl]titanium, bis(cyclopentadienyl)bis[2,6-difluoro-3-(benzoylamino)phenyl]titanium, bis(cyclopentadienyl)bis-[2,6-difluoro-3-(N-(3-phenylpropyl)benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluyl)amino)phenyl]titanium, bis(cyclopentadienyl)bis[2,6-difluoro-3-(N-isobutylbenzoylamino)phenyl]titanium, bis(cyclopentadienyl)bis[2,6-difluoro-3-(N-cyclohexylmethylpivaloylamino)phenyl]titanium, bis(cyclopentadienyl)bis[2,6-difluoro-3-(N-(oxoran-2-ylmethyl)benzoylamino)phenyl]titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl-(4-toluyl)amino)phenyl]titanium, bis(cyclopentadienyl)bis[2,6-difluoro-3-(N-(oxoran-2-ylmethyl)-(4-toluyl)amino)phenyl]titanium, bis(cyclopentadienyl)bis[2,6-difluoro-3-(N-(4-toluylmethyl)benzoylamino)-pheny]titanium, bis(cyclopentadienyl)bis[2,6-difluoro 3-(N-(4-toluyl-methyl)-(4-toluyl)amino)phenyl]titanium, bis(cyclopentadienyl)bis[2,6-difluoro-3-(N-butylbenzoylamino)phenyl]-titanium, bis(cyclopentadienyl)bis[2,6-difluoro-3-(N-(butyl-(4-toluyl)amino)phenyl]titanium, bis(cyclopentadienyl)bis[2,6-difluoro-3-(N-(hexyl-(4-toluyl)amino)-phenyl]titanium, bis(cyclopentadienyl)bis[2,6-difluoro-3-(N-(2,4-dimethylpentyl)-2,2-dimethylbutanoylamino)-phenyl]titanium, bis(cyclopentadienyl)bis[2,6-difluoro-3-(2,4-dimethylpentyl)-2,2-dimethylpentanoylamino)phenyl]-titanium, bis(cyclopentadienyl)bis[2,6-difluoro-3-((4-toluyl)amino)-phenyl]titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxy-propanoylamino)phenyl]titanium, bis(cyclopentadienyl)-bis[2,6-difluoro-3-(2,2-dimethyl-3-allyloxypropanoyl-amino)phenyl]titanium, bis(cyclopentadienyl)bis[2,6-difluoro-3-(N-allylacetylamino)phenyl]titanium, bis(cyclopentadienyl)bis[2,6-difluoro-3-(2-ethylbutanoylamino)-phenyl]titanium, bis(cyclopentadienyl)bis[2,6-difluoro-3-(N-cyclohexylmethylbenzoylamino)phenyl]titanium, bis(cyclopentadienyl)bis[2,6-difluoro-3-(N-cyclohexyl-methyl-(4-toluyl)amino)phenyl]titanium, bis(cyclopentadienyl)bis[2,6-difluoro-3-(N-2-ethylhexyl)benzoylamino)-phenyl]titanium, bis(cyclopentadienyl)bis[2,6-difluoro-3-(N-isopropylbenzoylamino)phenyl]titanium, bis(cyclopentadienyl)bis[2,6-difluoro-3-(N-(3-phenylpropyl)-2,2-dimethyl-pentanoylamino)phenyl]titanium, bis(cyclopentadienyl)-bis[2,6-difluoro-3-(N-hexylbenzoylamino)phenyl]titanium, bis(cyclopentadienyl)bis[2,6-difluoro-3-(N-cyclohexyl-methyl-2,2-dimethylpentanoylamino)phenyl]titanium, bis-(cyclopentadienyl)bis[2,6-difluoro-3-(N-butylbenzoylamino)phenyl]titanium, bis(cyclopentadienyl)bis[2,6-difluoro-3-(N-(2-ethylhexyl)-2,2-dinethylpentanoylamino)phenyl]titanium, bis(cyclopenta-dienyl)bis[2,6-difluoro-3-(N-hexyl-2,2-dimethylpentanoyl-amino)phenyl]titanium, bis(cyclopentadienyl)bis[2,6-difluoro-3-(N-isopropyl-2,2-dimethylpentanoylamino)phenyl]titanium, bis(cyclopentadienyl)bis[2,6-difluoro-3-(N-(3-phenylpropyl)pivaloylamino)phenyl]titanium, bis(cyclopentadienyl)bis[2,6-difluoro-3-(N-butyl-2,2-dimethylpentanoylamino)phenyl]titanium, bis(cyclopenta-dienyl)bis[2,6-difluoro-3-(N-(2-methoxyethyl)benzoylamino)phenyl]titanium, bis(cyclopentadienyl)bis[2,6-difluoro-3-(N-benzylbenzoylamino)phenyl]titanium, bis(cyclopentadienyl)bis[2,6-difluoro-3-(N-benzyl-(4-toluyl)amino)phenyl]titanium, bis(cyclopentadienyl)bis[2,6-difluoro-3-(N-(2-methoxyethyl)-(4-toluyl)amino)phenyl]titanium, bis(cyclopentadienyl)bis-[2,6-difluoro-3-(N-(4-methylphenylmethyl)-2,2-dimethylpentanoylamino)phenyl]titanium, bis(cyclopentadienyl)-bis[2,6-difluoro-3-(N-(2-methoxyethyl)-2,2-dimethylpentanoylamino)phenyl]titanium, bis(cyclopentadienyl)bis[2,6-difluoro-3-(N-cyclohexylmethyl-(2-ethyl-2-methylheptanoyl)amino)phenyl]titanium, bis(cyclopentadienyl)bis[2,6-difluoro-3-(N-butyl-(4-chlorobenzoyl)amino)phenyl]titanium, bis(cyclopenta-dienyl)bis[2,6-difluoro-3-(N-hexyl-(2-ethyl-2-methyl-butanoylamino)phenyl]titanium, bis(cyclopentadienyl)-bis[2,6-difluoro-3-(N-cyclohexyl-2,2-dimethylpentanoyl-amino)phenyl]titanium, bis(cyclopentadienyl)bis[2,6-difluoro-3-(N-(oxoran-2-ylmethyl)-2,2-dimethylpentanoylamino)phenyl]titanium, bis(cyclopentadienyl)bis[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chlorobenzoyl)amino)phenyl]titanium, bis(cyclopentadienyl)bis[2,6-difluoro-3-(3,3-dimethyl-2-azetidinon-1-yl)phenyl]titanium, bis(cyclopentadienyl)bis[2,6-difluoro-3-isocyanatophenyl]-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)-phenyl]titanium, bis(cyclopentadienyl)bis[2,6-difluoro-3-(N-butyl-(4-tolylsulfonyl)amino)phenyl]titanium, bis(cyclo-pentadienyl)bis[2,6-difluoro-3-(N-isobutyl-(4-tolyl-sulfonyl)amino)phenyl]titanium, bis(cyclopentadienyl)-bis[2,6-difluoro-3-(N-butyl-(2,2-ditethyl-3-chloro-propanoyl)amino)phenyl]titanium, bis(cyclopentadienyl)bis[2,6-difluoro-3-(N-(3-phenyl-propyl)-2,2-dimethyl-3-chloropropanoyl)amino)phenyl]-titanium, bis(cyclopentadienyl)bis[2,6-difluoro-3-(N-cyclohexylmethyl-(2,2-dimethyl-3-chloropropanoyl)amino)-phenyl]titanium, bis(cyclopentadienyl)bis[2,6-difluoro-3-(N-isobutyl-(2,2-dimethyl-3-chloropropanoyl)phenyl]titanium, bis(cyclopentadienyl)bis[2,6-difluoro-3-(N-butyl-(2-chloro-methyl-2-methyl-3-chloropropanoyl)amino)phenyl]titanium, bis(cyclopentadienyl)bis[2,6-difluoro-3-(butylthiocarbonyl-amino)phenyl]titanium, bis(cyclopentadienyl)bis[2,6-difluoro-3-(phenylthiocarbonylamino)phenyl]titanium, bis(cyclopentadienyl)bis[2,6-difluoro-3-isocyanatophenyl]-titanium, bis(cyclopentadientyl)bis[2,6-difluoro-3-(N-ethyl-(4-tolylsulfonyl)amino)phenyl]titanium, bis(cyclo-pentadienyl)bis[2,6-difluoro-3-(N-hexyl-(4-tolylsulfonyl)-amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopenta-dienyl)bis[2,6-difluoro-3-(N-butyl-(2,2-dimethyl-3-chloro-propanoyl)amino)phenyl]titanium, bis(cyclopentadienyl)-bis[2,6-difluoro-3-(N-(3- phenylpropanoyl)-2,2-dimethyl-3-chloropropanoyl)amino) phenyl]titanium, bis(cyclopentadienyl)bis[2,6-difluoro-3-(N-cyclohexyl-methyl-(2,2-dimethyl-3-chloropropanoyl) amino)phenyl]-titanium, bis(cyclopentadienyl)bis[2,6-difluoro-3-(N-isobutyl-(2,2-dimethyl-3-chloropropanoyl) phenyl]-titanium, bis(cyclopentadienyl)bis[2,6-difluoro-3-(N-butyl-(2-chloromethyl-2-methyl-3-chloropropanoyl) amino)phenyl]-titanium, bis(cyclopentadienyl)bis[2,6-difluoro-3-(butylthiocarbonylamino)phenyl]titanium, bis(cyclopenta-dienyl)bis[2,6-difluoro-3-(phenylthiocarbonylamino)phenyl]-titanium, bis(methylcyclopentadienyl)bis[2,6-difluoro-3-(N-hexyl-2,2-dimethylbutanoyl)amino)phenyl]titanium, bis(methylcyclopentadienyl)bis[2,6-difluoro-3-(N-hexyl-2,2-dimethylbutanoylamino)phenyl]titanium, bis(methylcyclopentadienyl)bis[2,6-difluoro-3-(N-ethylacetylamino) phenyl]-titanium, bis(methylcyclopentadienyl)bis[2,6-difluoro-3-(N-ethylpropionylamino)phenyl]titanium, bis(trimethylsilyl-pentadienyl)bis[2,6-difluoro-3-(N-butyl-2,2-dimethyl-propanoylamino)phenyl]titanium, bis(cyclopentadienyl)bis-[2,6-difluoro-3-(N-(2-methoxyethyl) trimethylsilylamino)-phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-tolylmethyl-propyl)dimethylsilylamino)phenyl]titanium, bis(cyclopentadienyl)bis[2,6-difluoro-3-(3-ethoxymethyl-3-methyl-2-azetidinon-1-yl)phenyl]titanium, bis(cyclopentadienyl)bis[2,6-difluoro-3-(3-allyloxymethyl-3-methyl-2-azetidinon-1-yl)phenyl]titanium, bis(cyclopentadienyl)-bis [2,6-difluoro-3-(3-chloromethyl-3-methyl-2-azetidinon-1-yl)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(5,5-dimethyl-2-pyrrolidinon-1-yl)phenyl]titanium, bis(cyclopentadienyl)-bis[2,6-difluoro-3-(6,6-diphenyl-2-piperidinon-1-yl)-phenyl]titanium, bis(cyclopentadienyl)bis[2,6-difluoro-3-(N-2,3-dihydro-1,2-benzisothiazol-3-one(1,1-dioxide)-2-yl) phenyl]titanium, bis(cyclopentadienyl)bis[2,6-difluoro-3-(N-hexyl-(4-chlorobenzoyl)amino)phenyl]titanium, bis(cyclopenta-dienyl)bis[2,6-difluoro-3-(N-hexyl-(2-chlorobenzoyl)amino)-phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4-methylphenyl-methyl)-(4-chlorobenzoyl)amino)phenyl]titanium, bis(cyclo-pentadienyl)bis[2,6-difluoro-3-(N-(4-methylphenylmethyl)-(2-chlorobenzoyl)amino)phenyl] titanium, bis(cyclopentadienyl)bis[2,6-difluoro-3-(N-butyl-(4-choro-benzoyl)amino)phenyl]titanium, bis(cyclopentadienyl)bis-[2,6-difluoro-3-(N-benzyl-2,2-dimethylpentanoylamino)-phenyl]titanium, bis(cyclopentadienyl)bis[2,6-difluoro-3-(N-(2-ethylhexyl)-4-tolyl-sulfonyl)amino)phenyl]titanium, bis(cyclopentadienyl)bis[2,6-difluoro-3-(N-(3-oxaheptyl)-benzoylamino)phenyl]titanium, bis(cyclopentadienyl)bis[2,6-difluoro-3-(N-(3,6-dioxadecyl)benzoylamino)phenyl] titanium, bis(cyclopentadienyl)bis[2,6-difluoro-3-(trifluoromethyl-sulfonyl)amino)phenyl]titanium, bis(cyclopentadienyl)bis-[2,6-difluoro-3-(trifluoroacetylamino)phenyl]titanium, bis(cyclopentadienyl)bis[2,6-difluoro-3-(2-chlorobenzoyl)-amino)phenyl]titanium, bis(cyclopentadienyl)bis[2,6-difluoro-3-(4-chlorobenzoyl)amino)phenyltitanium, bis-(cyclopentadienyl)bis[2,6-difluoro-3-(N-(3,6-dioxadecyl)-2,2-dimethylpentanoylamino)phenyl]titanium, bis(cyclo-pentadienyl)bis[2,6-difluoro-3-(N-(3,7-dimethyl-7-methoxy-octyl)benzoylamino)phenyl]titanium and bis (cyclopenta-dienyl)bis[2,6-difluoro-3-(N-cyclohexylbenzoylamino)-phenyl]titanium.

Examples of the active ester compound (j) as still another example of the photopolymerization initiator include imidosulfonate compounds described in JP-B-62-6223 and active sulfonates described in JP-B-63-14340 and JP-A-59-174831.

Preferred examples of the compound (k) having a carbon halogen bond as one example of the polymerization initiator include those represented by the following formulae [IV] to [X].

A compound represented by formula [IV]:

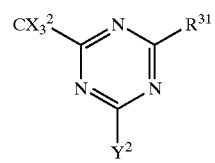

[IV]

wherein $X^2$ represents a halogen atom, $Y^2$ represents $—C(X^2)_3$, $—NH_2$, $—NHR^{32}$, $—NR^{32}$ or $—OR^{32}$ (wherein $R^{32}$ represents an alkyl group, a substituted alkyl group, an aryl group or a substituted aryl group) and $R^{31}$ represents $—C(X^2)_3$, an alkyl group, a substituted alkyl group, an aryl group, a substituted aryl group or a substituted alkenyl group.

A compound represented by formula [V]:

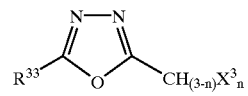

[V]

wherein $R^{33}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, $X^3$ represents a halogen atom and n represents an integer of from 1 to 3.

A compound represented by formula [VI]:

[VI]

wherein $R^{34}$ represents an aryl group or a substituted aryl group, $R^{35}$ represents

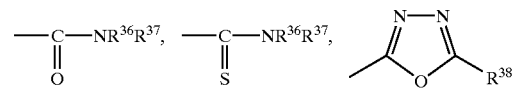

or a halogen, $Z^2$ represents $—C(=O)—$, $—C(=S)—$ or $—SO_2—$, $R^{36}$ and $R^{37}$ each represents an alkyl group, a substituted alkyl group, an alkenyl group, a substituted alkenyl group, an aryl group or a substituted aryl group, $R^{38}$ has the same meaning as $R^{32}$ in formula [IV], $X^3$ represents a halogen atom and m represents 1 or 2.

A compound represented by formula [VII]:

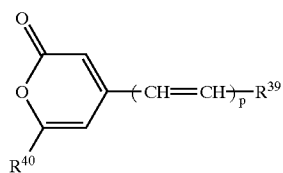

[VII]

wherein $R^{39}$ represents an aryl group which may be substituted or a heterocyclic group which may be substituted, $R^{40}$ represents a trihaloalkyl or trihaloalkenyl group having from 1 to 3 carbon atoms and p represents 1, 2 or 3.

A carbonylmethylene heterocyclic compound having a trihalogenomethyl group, represented by formula [VIII]:

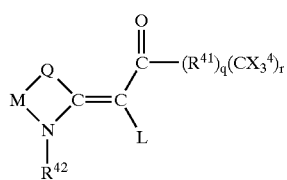

[VIII]

wherein L represents hydrogen atom or a substituent represented by the formula: CO—$(R^{41})_q(C(X^4)_3)_r$, Q represents sulfur atom, selenium atom, oxygen atom, a dialkylmethylene group, an alken-1,2-ylene group, 1,2-phenylene group or an N—R group, M represents a substituted or unsubstituted alkylene or alkenylene group or a 1,2-arylene group, $R^{42}$ represents an alkyl group, an aralkyl group or an alkoxyalkyl group, $R^{41}$ represents a carbocyclic or heterocyclic divalent aromatic group, $X^4$ represents chlorine atom, bromine atom or iodine atom, and q=0 and r=1 or q=1 and r=1 or 2.

A 4-halogeno-5-(halogenomethyl-phenyl)-oxazole derivative represented by formula [IX]:

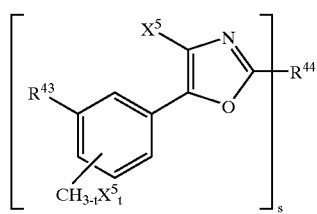

[IX]

wherein $X^5$ represents a halogen atom, t represents an integer of from 1 to 3, s represents an integer of from 1 to 4, $R^{43}$ represents hydrogen atom or a $CH_{3-t}X^5_t$ group and $R^{44}$ represents an s-valent unsaturated organic group which may be substituted.

A 2-(halogenomethyl-phenyl)-4-halogeno-oxazole derivative represented by formula [X]:

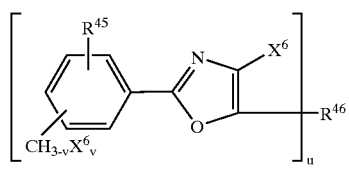

[X]

wherein $X^6$ represents a halogen atom, v represents an integer of from 1 to 3, u represents an integer of from 1 to 4, $R^{45}$ represents hydrogen atom or a $CH_{3-v}X^6_v$ group and $R^{46}$ represents a u-valent unsaturated organic group which may be substituted.

Specific examples of the compound having a carbon-halogen bond include: compounds described, for example, in Wakabayashi et al, *Bull. Chem. Soc. Japan*, 42, 2924 (1969), such as 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxy-phenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(∞, ∞, β-trichloroethyl)-4,6-bis(trichloromethyl)-S-triazine; compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-s-triazine; compounds described in JP-A-53-133428 such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)-naphtho-1-yl]-4,6-bis-trichloromethyl-S-triazine, 2-(4,7-dimethoxynaphtho-1-yl)-4,6-bis-trichloromethyl-S-triazine and 2-(acenaphtho-5-yl)-4,6-bis-trichloromethyl-S-triazine; compounds described in German Patent No. 3,337,024 such as

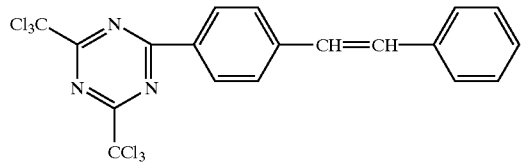

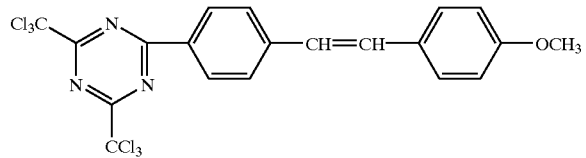

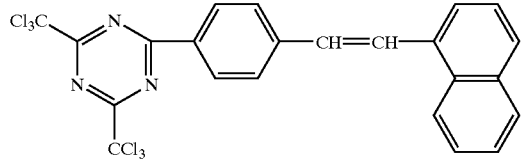

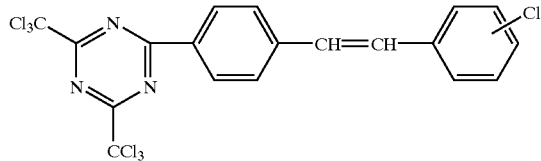

compounds shown below:

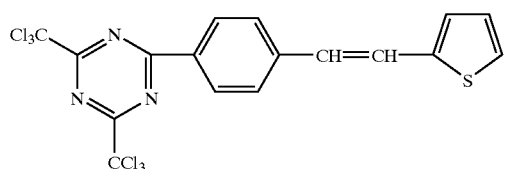

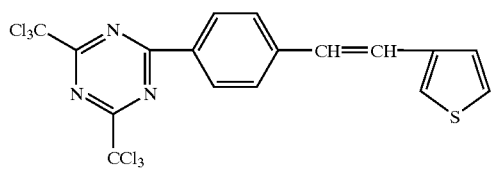

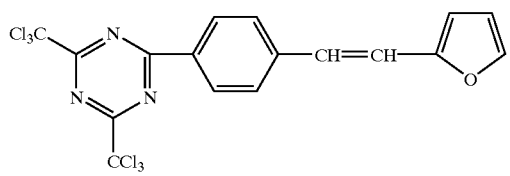

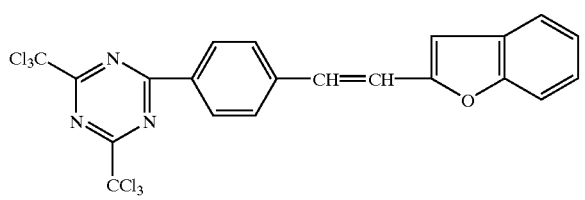

compounds described in F. C. Schaefer et al., *J. Org. Chem.*, 29, 1527 (1964) such as 2-methyl-4,6-bis(tribromomethyl)-S-triazine, 2,4,6-tris(tribromomethyl)-S-triazine, 2,4,6-tris(tribromomethyl)-S-triazine, 2-amino-4-methyl-6-tribromomethyl-S-triazine and 2-methoxy-4-methyl-6-trichloromethyl-S-triazine; compounds described in JP-A-62-58241 such as

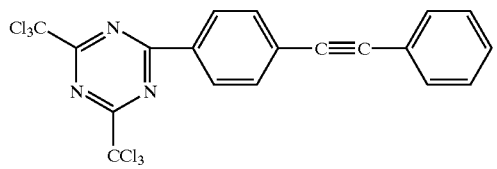

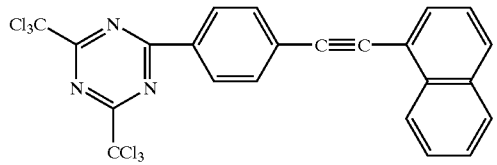

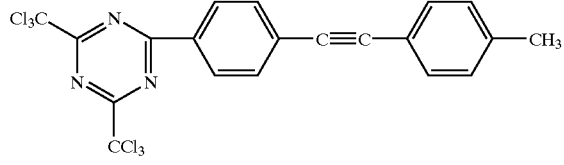

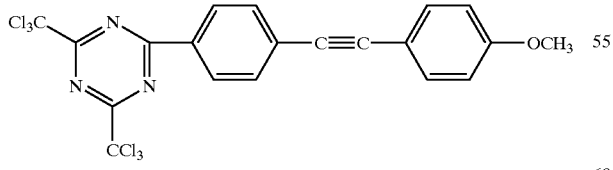

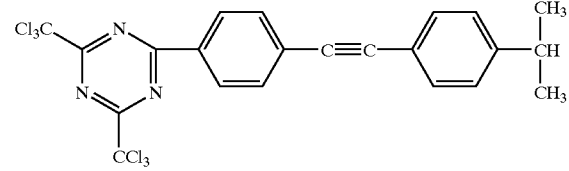

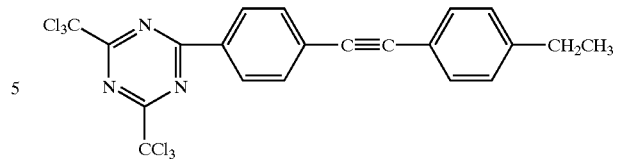

compounds described in JP-A-5-281728 such as

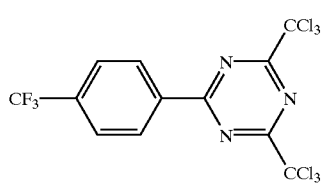

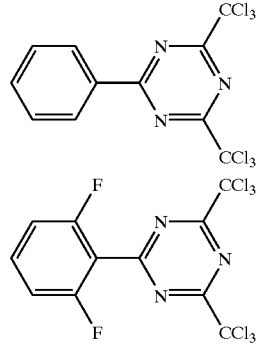

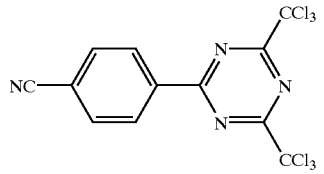

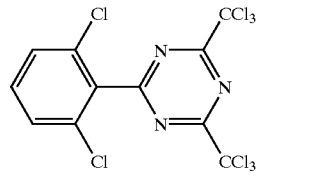

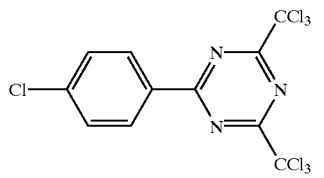

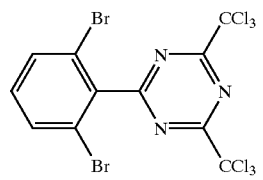

compounds shown below, which can be easily synthesized by a person skilled in the art according to the synthesis method described in M. P. Hutt, E. F. Elslager and L. M. Herbel, *Journal of Heterocyclic Chemistry*, Vol. 7 (No. 3), page 511 et seq. (1970):

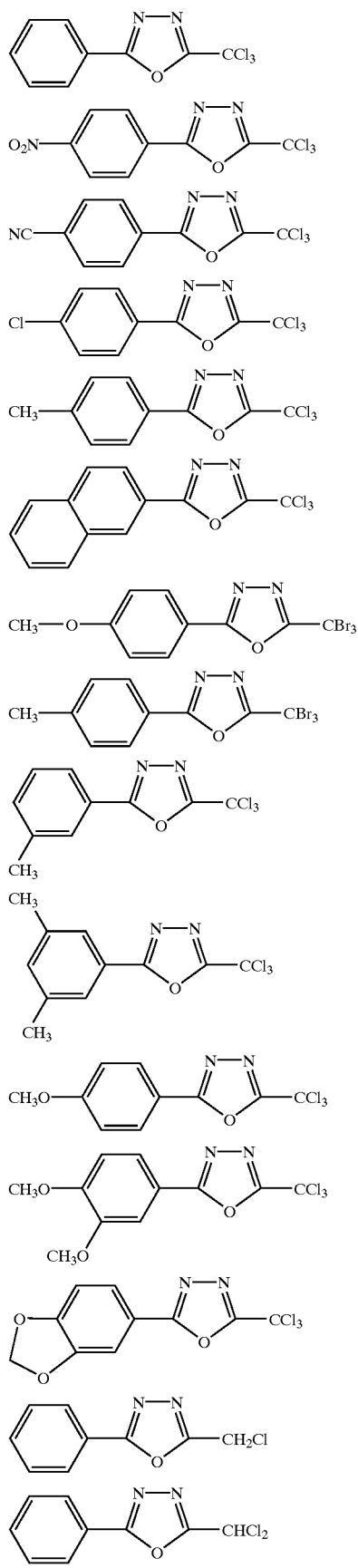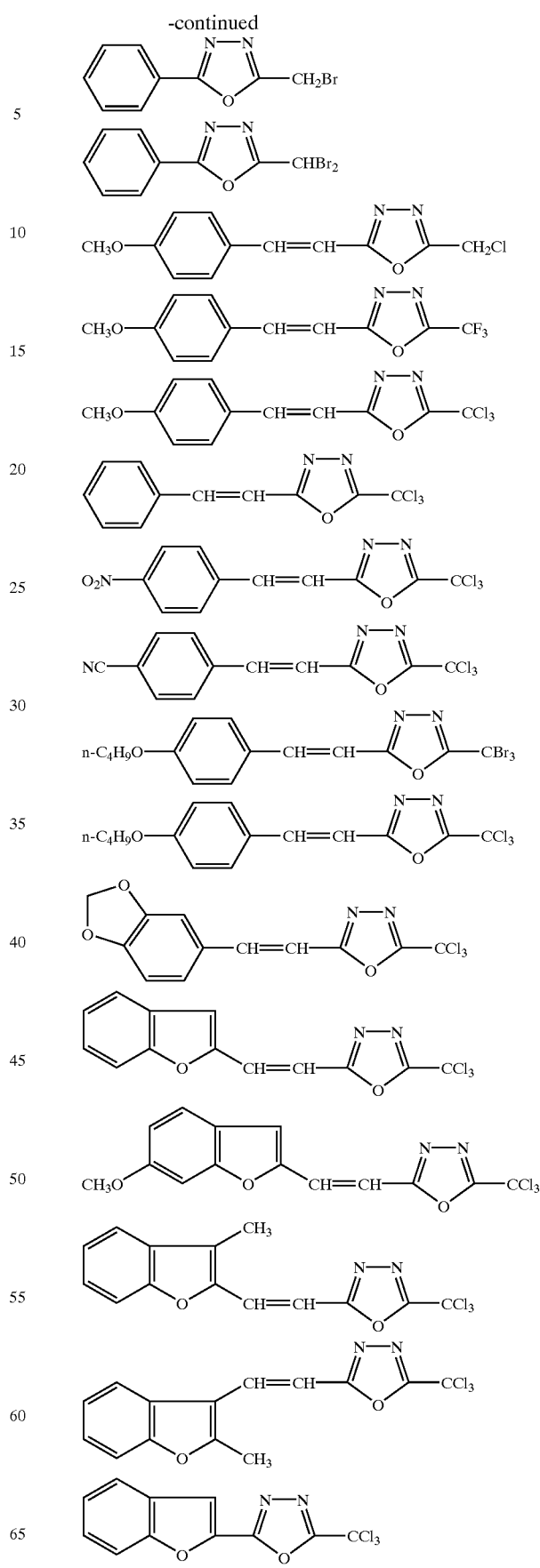

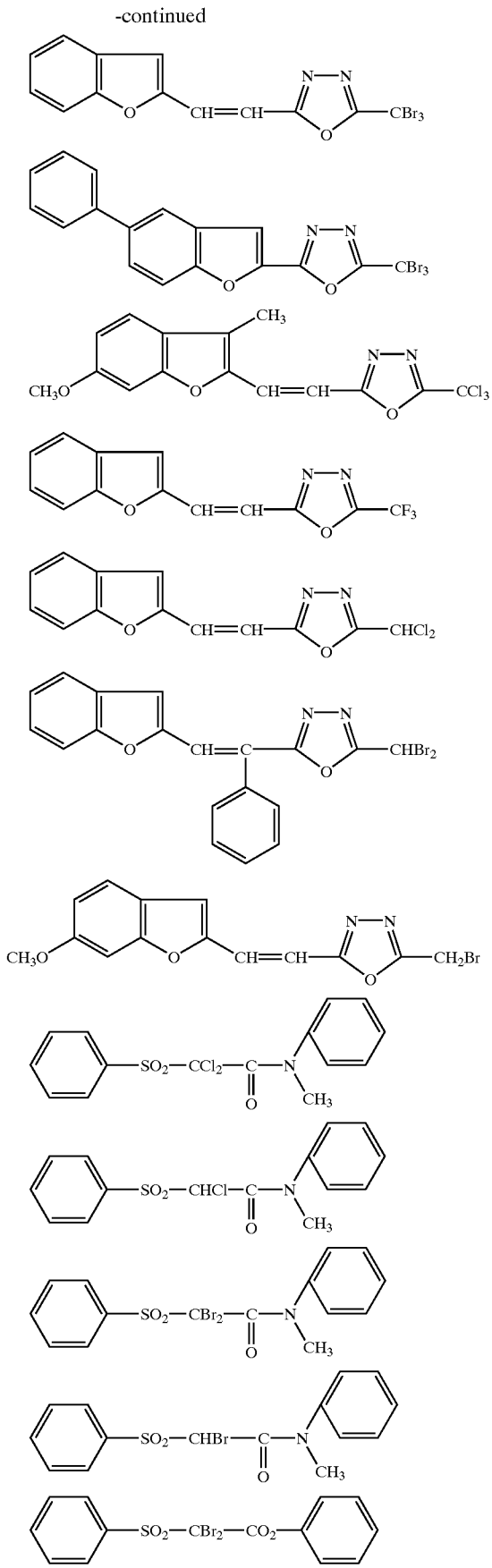
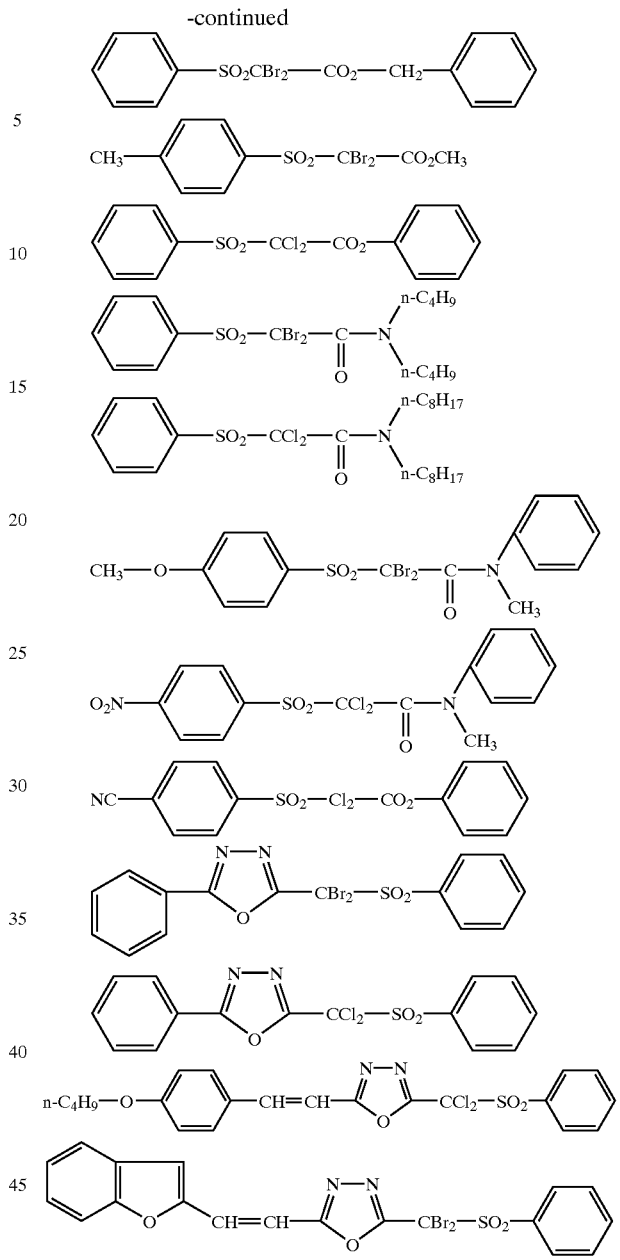
compounds described in German Patent No. 2,641,100 such as 4-(4-methoxystyryl)-6-(3,3,3-trichloropropenyl)-2-pyrone and 4-(3,4,5-trimethoxystyryl)-6-trichloromethyl-2-pyrone; compounds described in German Patent No. 3,333,450 such as
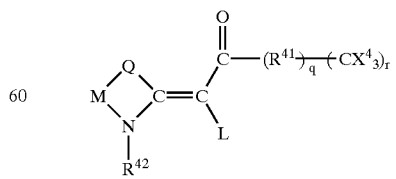
wherein $R^{41}$ represents a benzene ring and $R^{42}$ represents an alkyl group, an aralkyl group or an alkoxyalkyl group.

| | $R^{42}$ | M | L | a | $(CX_3^4)_r$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CCl_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ | compounds described in German Patent No. 3,021,590:

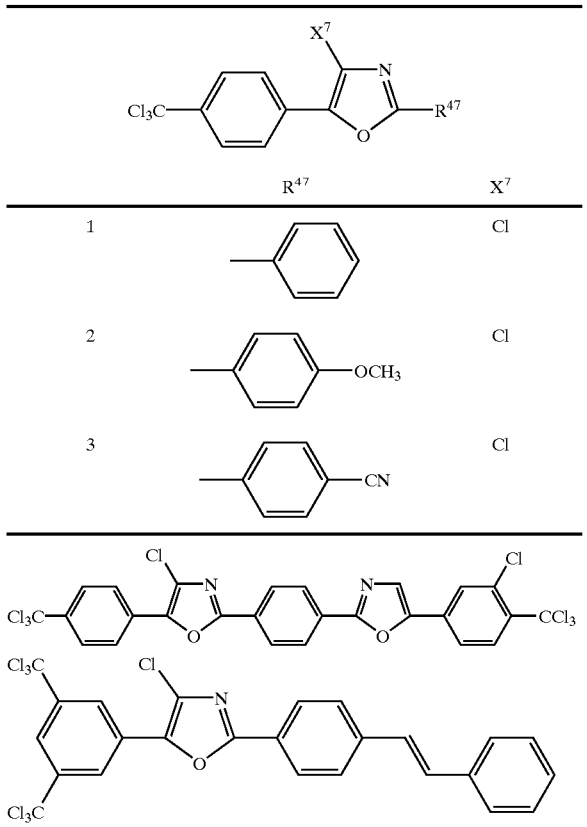

compounds described in German Patent No. 3,021,599 such as

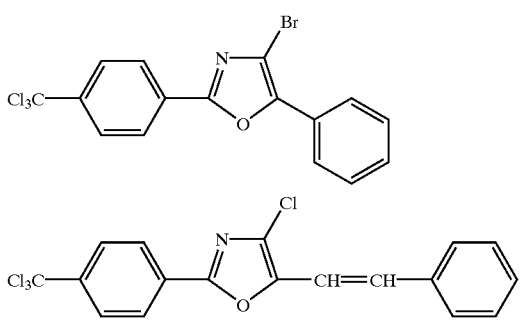

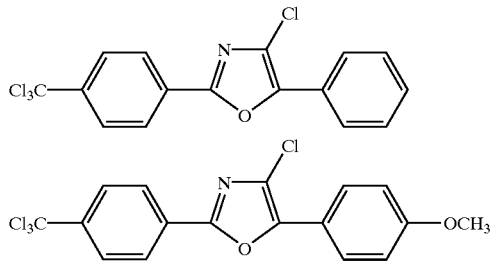

Among these photopolymerization initiators for use in the present invention, more preferred are (a) aromatic ketones, (b) aromatic onium salts, (c) organic peroxides, (e) hexaarylbiimidazoles, (i) metallocene compounds and (k) compounds having a carbon-halogen bond, and most preferred are aromatic iodonium salts, aromatic diazonium salts, titanocene compounds and trihalomethyl-S-triazine compounds represented by formula [IV].

The photopolymerization initiators for use in the present invention are suitably used individually or in combination of two or more thereof.

Examples of the sensitizing dye which can work as one component of the photopolymerization composition of the present invention include a spectral sensitizing dye and a dyestuff or pigment which absorbs light of a light source and interacts with the photopolymerization initiator.

Preferred examples of the spectral sensitizing dye or dyestuff include polynuclear aromatic compounds (e.g., pyrene, perylene, triphenylene), xanthenes (e.g., Fluorescein, eosine, erythrosine, Rhodamine B, Rose Bengal), cyanines (e.g., thiacarbocyanine, oxacarbocyanine), merocyanines (e.g., merocyanine, carbomerocyanine), thiazines (e.g., thionine, methylene blue, toluidine blue), acridines (e.g., Acridine orange, chloroflavin, acriflavine), phthalocyanines (e.g., phthalocyanine, metallo-phthalocyanine), porphyrins (e.g., tetraphenyl porphyrin, center metal-substituted porphyrin), chlorophylls (e.g., chlorophyll, chlorophyllin, center metal-substituted chlorophyll), metal complexes such as

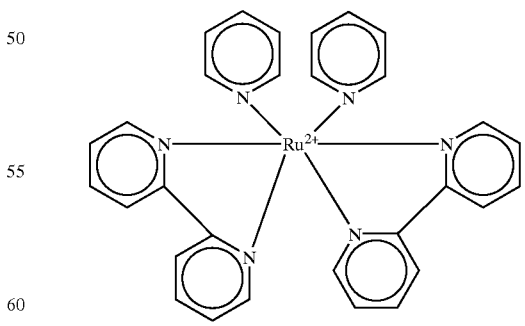

anthraquinones (e.g., anthraquinone) and squaliums (e.g., squalium). More preferred examples of the spectral sensitizing dye or dyestuff include styryl-based dyes described in JP-B-37-13034 such as

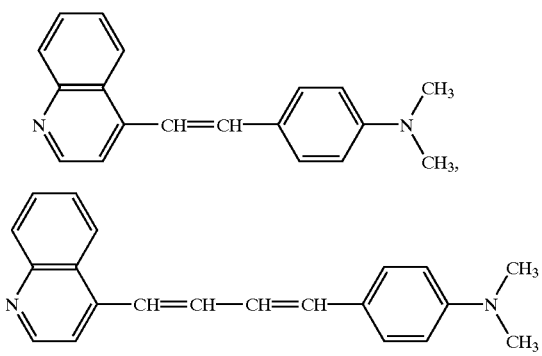
cationic dyes described in JP-A-62-143044 such as
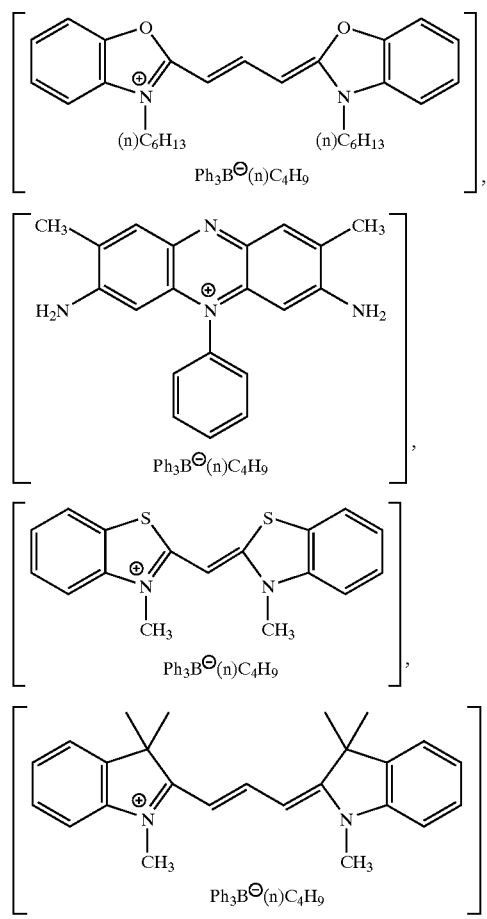
quinoxalium salts described in JP-B-59-24147 such as
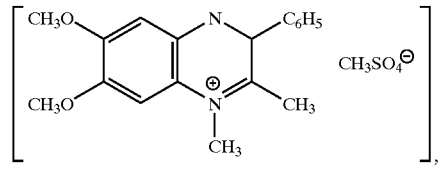
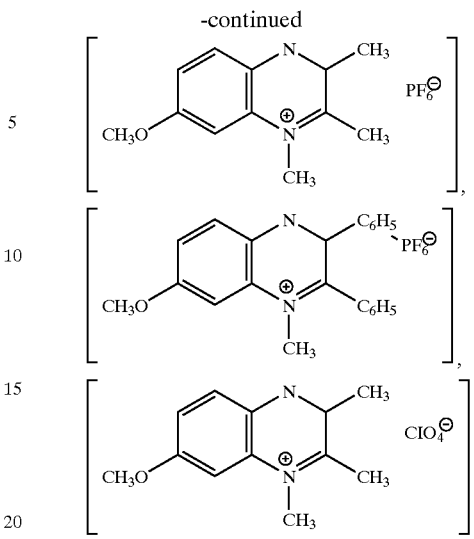
new Methylene Blue compounds described in JP-A-64-33104 such as
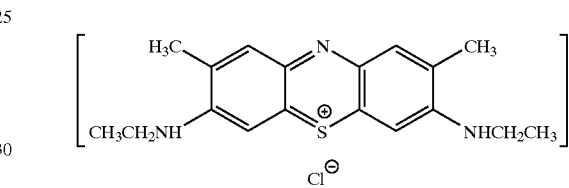
anthraquinones described in JP-A-64-56767 such as
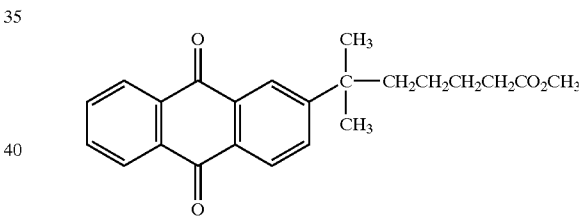
benzoxanthene dyes described in JP-A-2-1714; acridines described in JP-A-2-226148 and JP-A-2-226149 such as
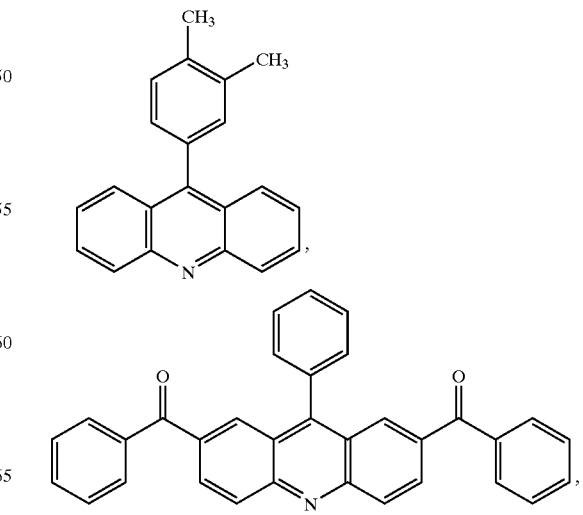

-continued
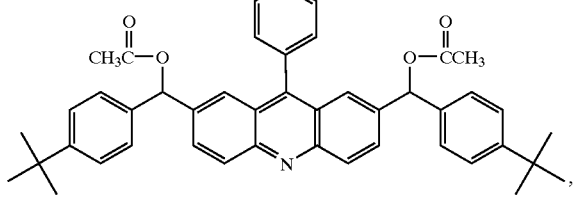
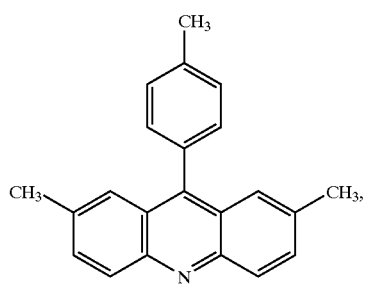
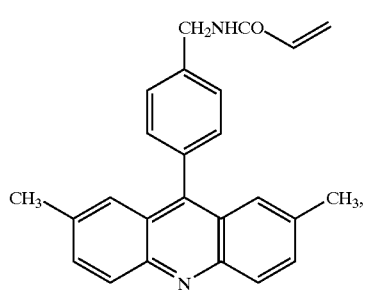
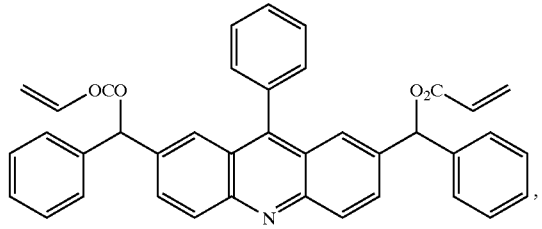
pyrylium salts described in JP-B-40-28499 such as
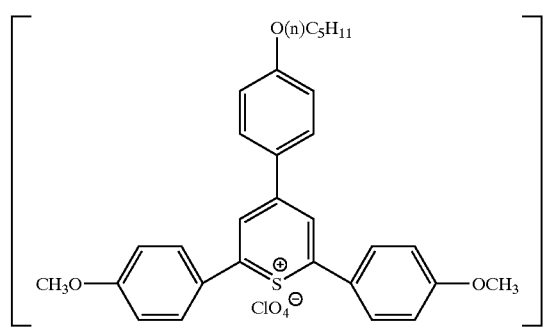
-continued
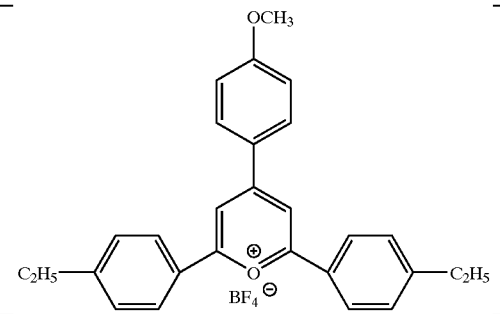
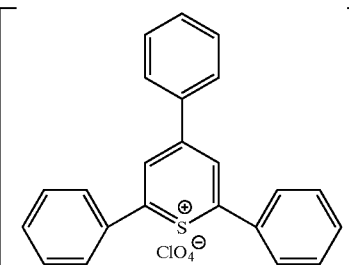
cyanines described in JP-B-46-42363 such as
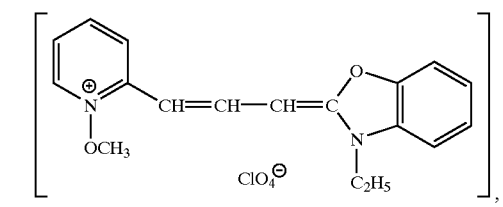
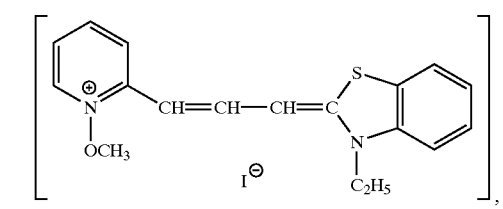
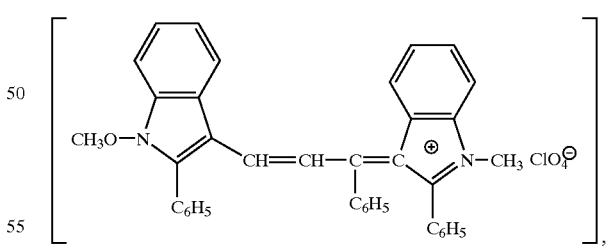
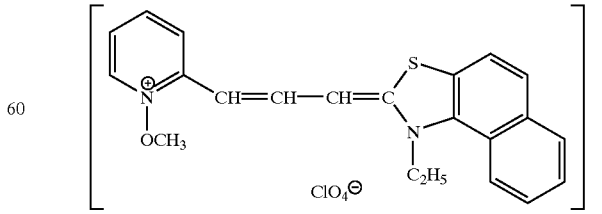
benzofurane dyes described in JP-A-2-63053 such as

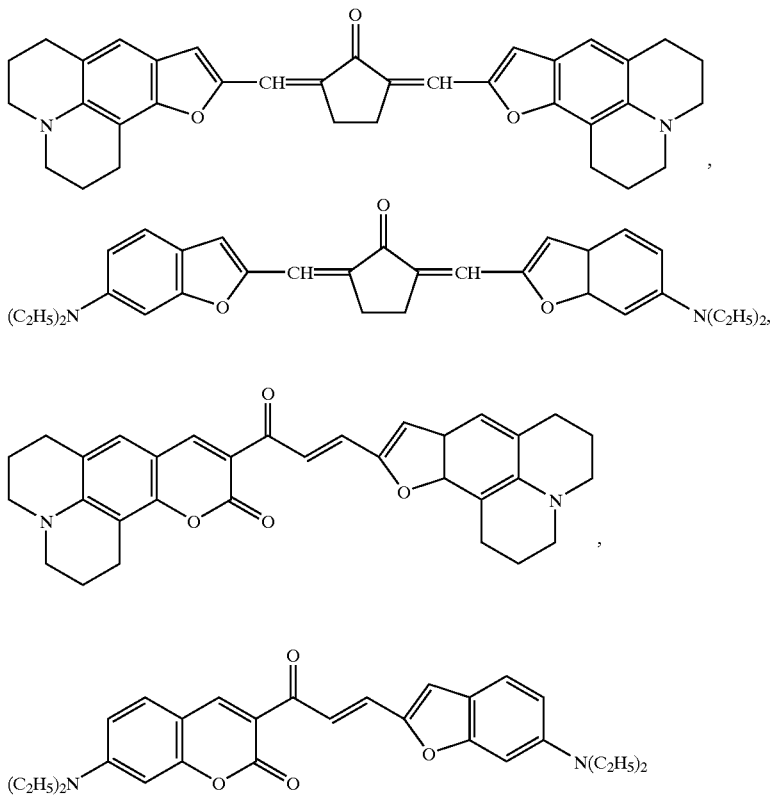
conjugate ketone dyes described in JP-A-2-85858 and JP-A-2-216154 such as
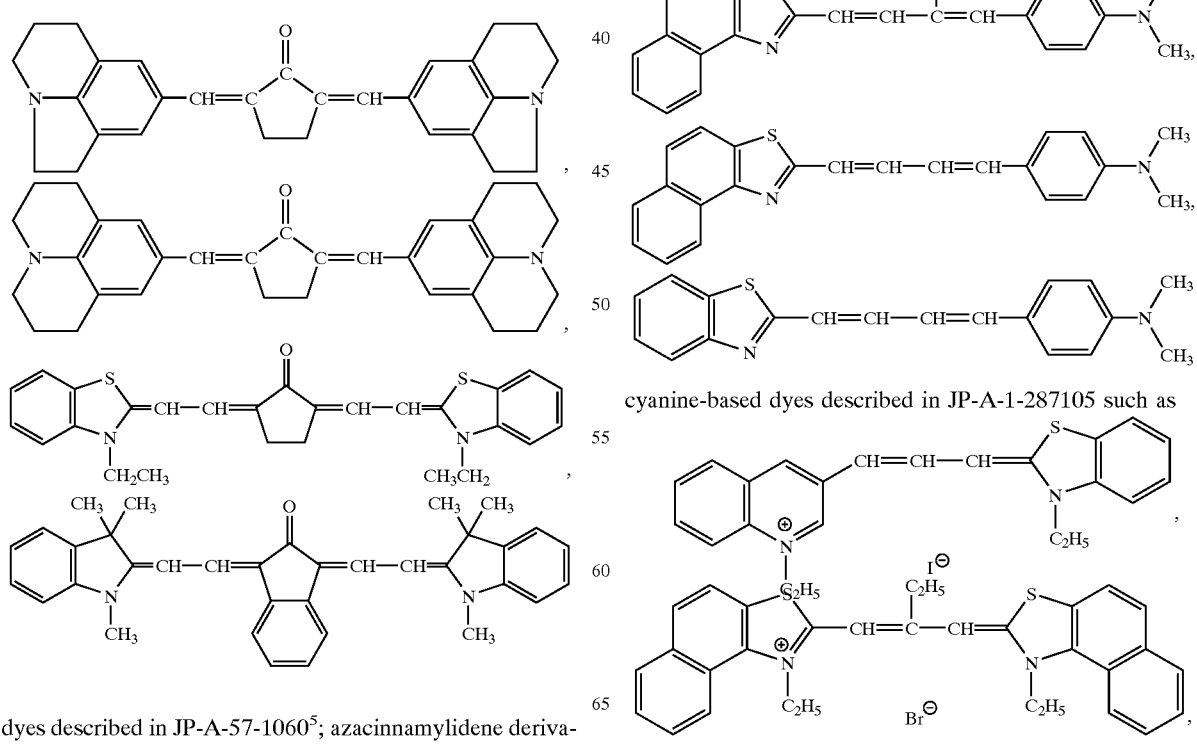
dyes described in JP-A-57-1060⁵; azacinnamylidene derivatives described in JP-B-2-30321 such as
cyanine-based dyes described in JP-A-1-287105 such as

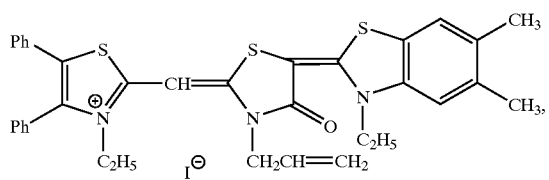

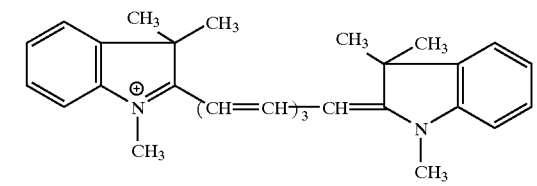

xanthene-based dyes described in JP-A-62-31844, JP-A-62-31848 and JP-A-62-143043 such as

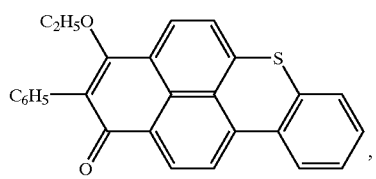

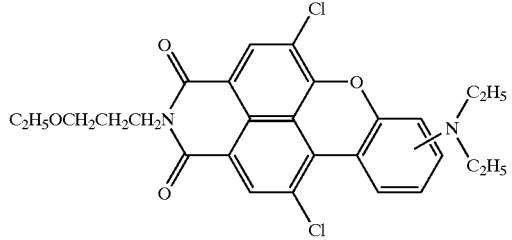

aminostyryl ketones described in JP-B-59-28325 such as

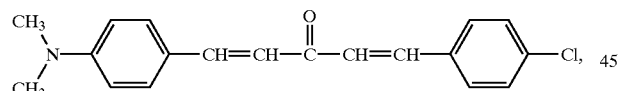

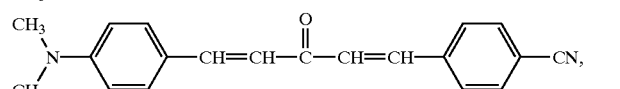

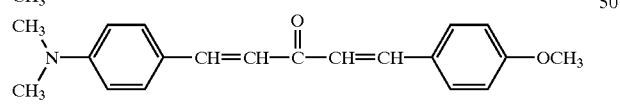

merocyanine dyes represented by the following formulae [1] to [8] described in JP-B-61-9621 such as

[1]

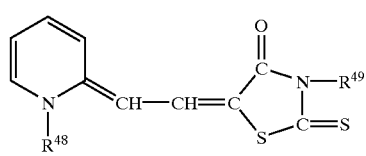

[2]

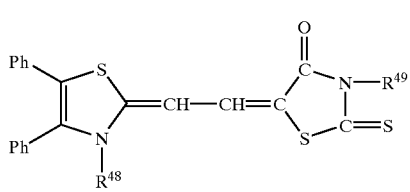

[3]

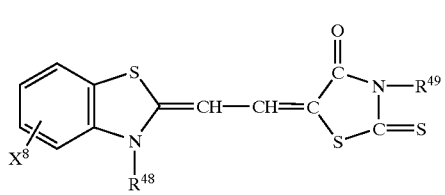

[4]

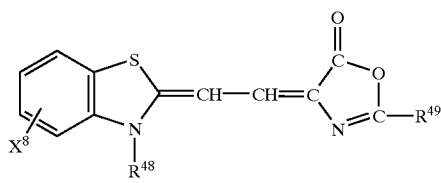

[5]

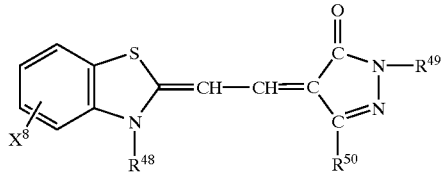

[6]

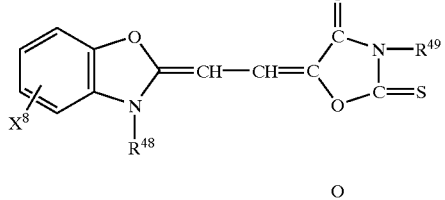

[7]

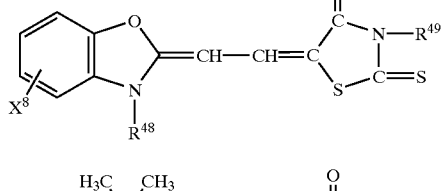

[8]

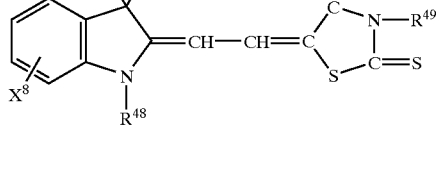

wherein in formula [3] to [8], $X^8$ represents a hydrogen atom, an alkyl group, a substituted alkyl group, an alkoxy group, an aryl group, a substituted aryl group, an aryloxy group, an aralkyl group or a halogen atom, in formula [2], Ph represents a phenyl group and in formulae [1] to [8], $R^{48}$, $R^{49}$ and $R^{50}$, which may be the same or different, each represents an alkyl group, a substituted group, an alkenyl group, an aryl group, a substituted aryl group or an aralkyl group); dyes represented by the following formulae [9] to [11] described in JP-A-2-179643 such as

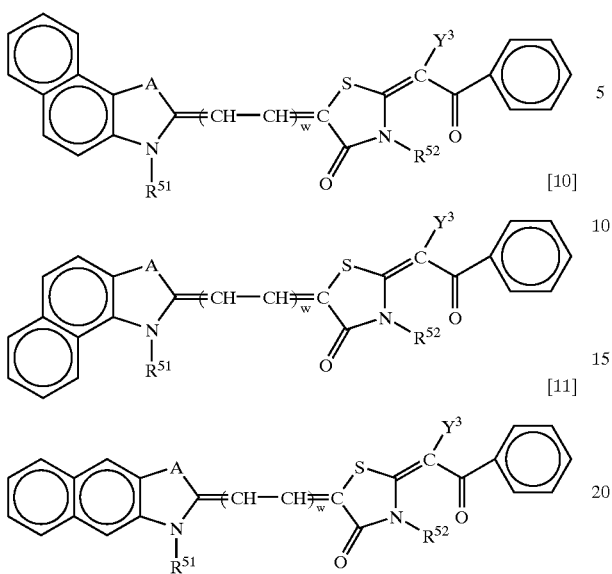

[9]

[10]

[11]

wherein A represents oxygen atom, sulfur atom, selenium atom, tellurium atom, an alkyl- or aryl-substituted nitrogen atom or a dialkyl-substituted carbon atoms, $Y^3$ represents hydrogen atom, an alkyl group, a substituted alkyl group, an aryl group, a substituted aryl group, an aralkyl group, an acyl group or a substituted alkoxycarbonyl group, $R^{51}$ and $R^{52}$ each represents hydrogen atom, an alkyl group having from 1 to 18 carbon atoms or a substituted alkyl group having from 1 to 18 carbon atoms containing as a substituent $R^{53}O$—,

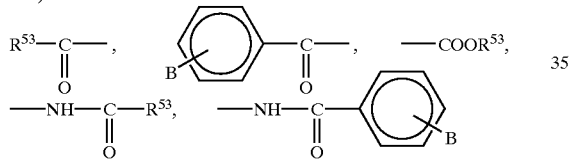

—(CH$_2$CH$_2$O)—$R^{53}$ or a halogen atom (e.g., F. Cl, Br, I) (wherein $R^{53}$ represents hydrogen atom or an alkyl group having from 1 to 10 carbon atoms and B represents a dialkylamino group, a hydroxyl group, an acyloxy group, a halogen atom or a nitro group), w represents an integer of from 0 to 4 and x represents an integer of from 1 to 20); merocyanine dyes represented by the following formula [12] described in JP-A-2-244050:

[12]

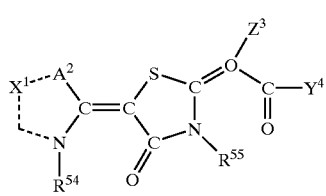

wherein $R^{54}$ and $R^{55}$ each independently represents hydrogen atom, an alkyl group, a substituted alkyl group, an alkoxycarbonyl group, an aryl group, a substituted aryl group or an aralkyl group, $A^2$ represents oxygen atom, sulfur atom, selenium atom, tellurium atom, an alkyl- or aryl-substituted nitrogen atom or a dialkyl-substituted carbon atom, $X^9$ represents a nonmetallic atom group necessary for forming a nitrogen-containing 5-membered heterocyclic ring, $Y^4$ represents a substituted phenyl group, an unsubstituted or substituted polynuclear aromatic ring or an unsubstituted or substituted alkyl heteroaromatic ring, $Z^3$ represents hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group and $Z^3$ and $Y^4$ may combine with each other to form a ring, of which preferred specific examples are set forth below:

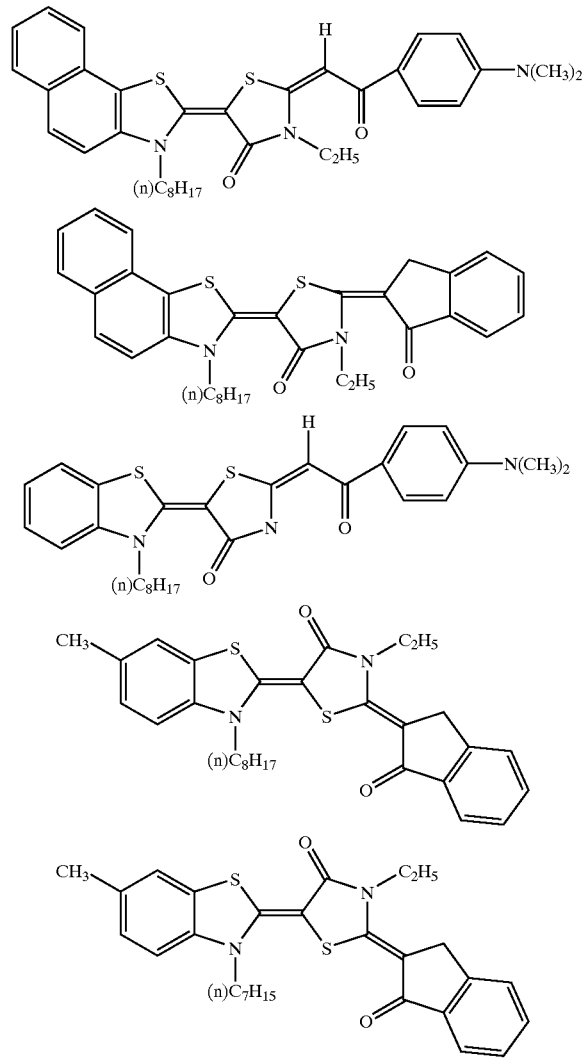

merocyanine dyes represented by the following formula [13] described in JP-B-59-28326:

[13]

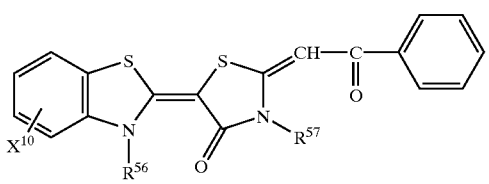

wherein $R^{56}$ and $R^{57}$, which may be the same or different, each represents hydrogen atom, an alkyl group, a substituted alkyl group, an aryl group, a substituted aryl group or an aralkyl group and $X^{10}$ represents a substituent having a Hammett's Φ value of from −0.9 to +0.5; merocyanine dyes represented by the following formula [14] described in JP-A-59-89303:

[14]

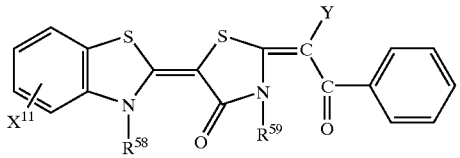

wherein $R^{58}$ and $R^{59}$ each represents hydrogen atom, an alkyl group, a substituted alkyl group, an aryl group, a substituted aryl group or an aralkyl group, $X^{11}$ represents a substituent having a Hammett's Φ value of from −0.9 to +0.5 and $Y^5$ represents hydrogen atom, an alkyl group, a substituted alkyl group, an aryl group, a substituted aryl group, an aralkyl group, an acyl-group or an alkoxycarbonyl group, of which preferred specific examples are set forth

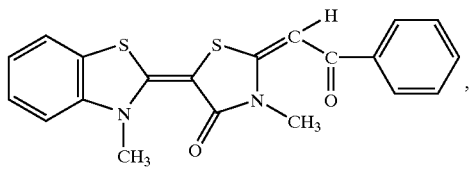

,

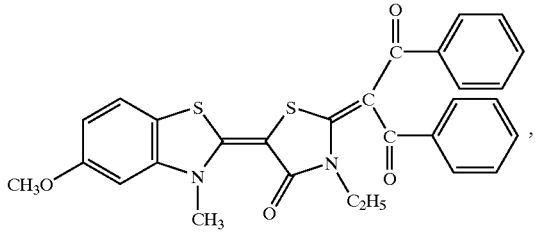

,

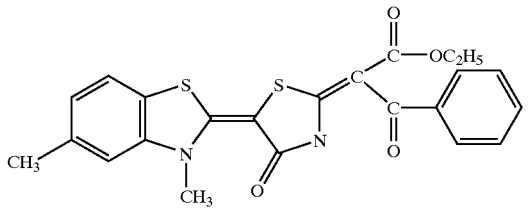

merocyanine dyes represented by the following formula [15] described in Japanese Patent Application No. 6-269047:

[15]

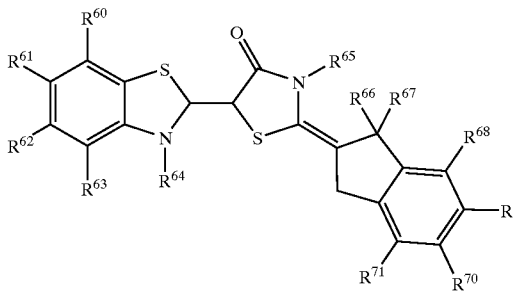

wherein $R^{60}$, $R^{61}$, $R^{62}$, $R^{63}$, $R^{68}$, $R^{69}$, $R^{70}$ and $R^{71}$ each independently represents hydrogen atom, a halogen atom, an alkyl group, a substituted alkyl group, an aryl group, a substituted aryl group, a hydroxyl group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group, or $R^{60}$ and $R^{61}$, $R^{61}$ and $R^{62}$, $R^{62}$ and $R^{63}$, $R^{68}$ and $R^{69}$, $R^{69}$ and $R^{70}$, or $R^{70}$ and $R^{71}$ may combine with each other to form an aliphatic or aromatic ring, $R^{64}$ represents hydrogen atom, an alkyl group, a substituted alkyl group, an aryl group or a substituted aryl group, $R^{65}$ represents a substituted or unsubstituted alkenylalkyl group or a substituted or unsubstituted alkynylalkyl group and $R^{66}$ and $R^{67}$ each independently represents hydrogen atom, a halogen atom, an alkyl group, a substituted alkyl group, an aryl group, a substituted aryl group or a substituted carbonyl group, of which preferred specific examples include:

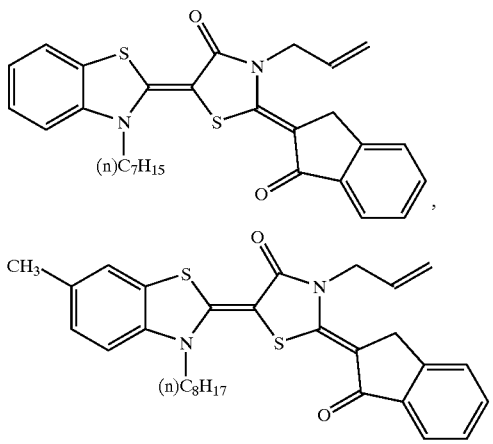

,

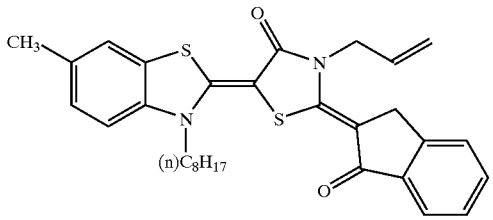

and benzopyrane-based dyes represented by the following formula [16] described in Japanese Patent Application No. 7-164583:

[16]

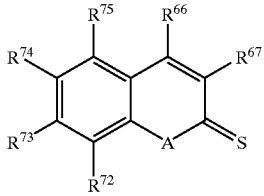

wherein $R^{72}$ to $R^{75}$ each independently represents hydrogen atom, a halogen atom, an alkyl group, an aryl group, a hydroxyl group, an alkoxy group or an amino group, $R^{72}$ to $R^{75}$ each may form a ring comprising nonmetallic atoms together with the carbon atom to which $R^{72}$ to $R^{75}$ each may combine, $R^{76}$ represents hydrogen atom, an alkyl group, an aryl group, a heteroaromatic group, a cyano group, an alkoxy group, a carboxy group or an alkenyl group, $R^{77}$ represents a group represented by $R^{76}$ or —Z—$R^{76}$, Z represents a carbonyl group, sulfonyl group, a sulfinyl group or an arylene dicarbonyl group, $R^{76}$ and $R^{77}$ may form together a ring comprising nonmetallic atoms, A represents O atom, S atom, NH or N atom having a substituent, B represents O atom or =C(G1)(G2) (wherein G1 and G2, which may be the same or different, each represents hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, provided that G1 and G2 are not hydrogen atom at the same time, and G1 and G2 may form a ring comprising nonmetallic atoms together with the carbon atom).

Other than these, particularly, the following infrared absorbents (dye or pigment) are suitably used as the sensitizing dye.

Preferred examples of the dye include cyanine dyes described in JP-A-58-125246, JP-A-59-84356, JP-A-59-202829 and JP-A-60-78787, and cyanine dyes described in British Patent 434,875.

Also, near infrared absorbing sensitizers described in U.S. Pat. No. 5,156,938 may be suitably used. In addition, substituted arylbenzo(thio)pyrylium salts described in U.S. Pat. No. 3,881,924, trimethinethiapyrylium salts described in JP-A-57-142645 (U.S. Pat. No. 4,327,169), pyrylium-based compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 may also be suitably used.

Other preferred examples of the dye include near infrared absorbing dyes represented by formulae (I) and (II) of U.S. Pat. No. 4,756,993 and phthalocyanine-based dyes described in EP-A-916513.

Furthermore, anionic infrared absorbents described in Japanese Patent Application No. 10-79912 may also be suitably used. The term anionic infrared absorbent means a dye not having a cationic structure but having an anionic structure in the mother nucleus which substantially absorbs an infrared ray. Examples thereof include (c1) an anionic metal complex, (c2) an anionic carbon black, (c3) an anionic phthalocyanine and (c4) a compound represented by the following formula 6. In these anionic infrared absorbents, the counter cation is a monovalent cation containing a proton, or a polyvalent cation.

$$[G_a\text{—}M\text{—}G_b]^m X^{m+} \tag{6}$$

The anionic metal complex (c1) as used herein means a metal complex such that the center metal and ligand in the complex moiety which substantially absorbs light are anionic as the whole.

Examples of the anionic carbon black (c2) include carbon black where an anionic group such as sulfonic acid, a carboxylic acid or a phosphonic acid group is connected as a substituent. Such a group may be introduced into the carbon black by a method of oxidizing carbon black with a predetermined acid, described in *Carbon Black Binran Dai 3 Han* (*Carbon Black Handbook, 3rd Edition*), page 12, complied by Carbon Black Kyokai and issued by Carbon Black Kyokai (Apr. 5, 1995).

The anionic phthalocyanine (c3) means a phthalocyanine such that an anionic group described for (c2) is bonded as a substituent to the phthalocyanine skeleton and the phthalocyanine as the whole is anionic.

The compound represented by formula 6 (c4) is described in detail below. In formula 6, $G_a^-$ represents an anionic substituent, $G_b$ represents a neutral substituent, $X^m$ represents a cation having from 1 to m valence and containing a proton, m represents an integer of from 1 to 6, and M represents a conjugate chain. The conjugate chain M may have a substituent or a ring structure. The conjugate in M can be presented by the following formula:

wherein $R^1$, $R^2$ and $R^3$ each independently represents hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, $R^1$, $R^2$ and/or $R^3$ may combine with each other to form a ring structure, and n represents an integer of from 1 to 8.

Preferred examples of the anionic infrared absorbent represented by formula 6 include the following compounds A-1 to A-5.

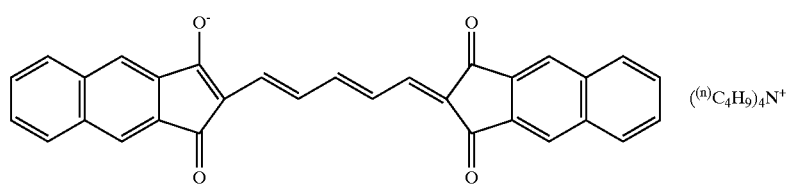

A-1

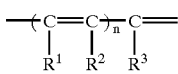

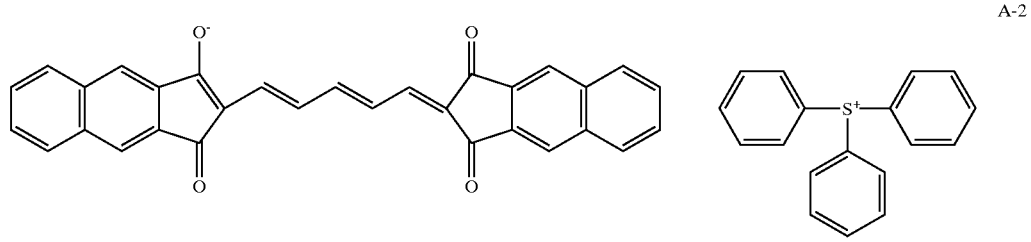

A-2

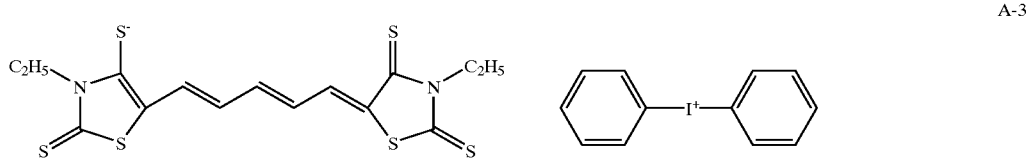

A-3

-continued
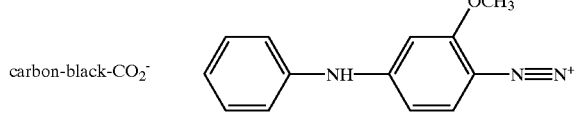
A-4
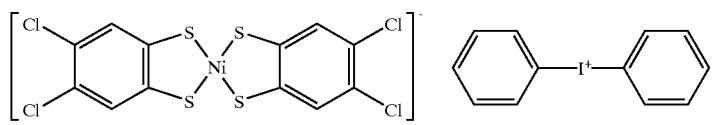
A-5
Also, the following cationic infrared absorbents CA-1 to CA-44 may be preferably used.
CA-1
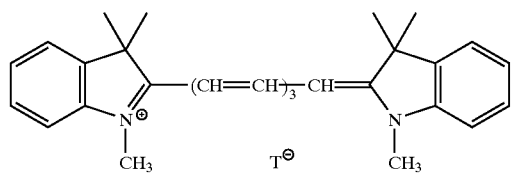
CA-2
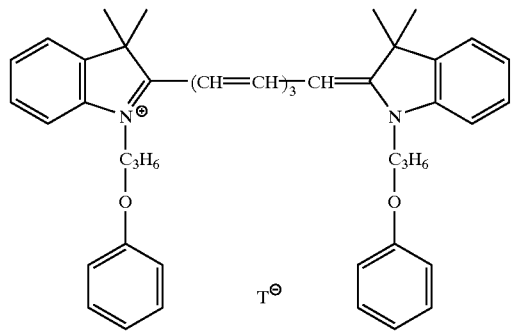
CA-3
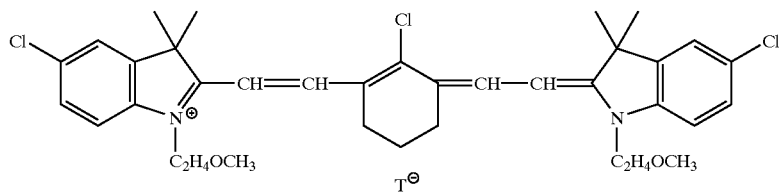
CA-4
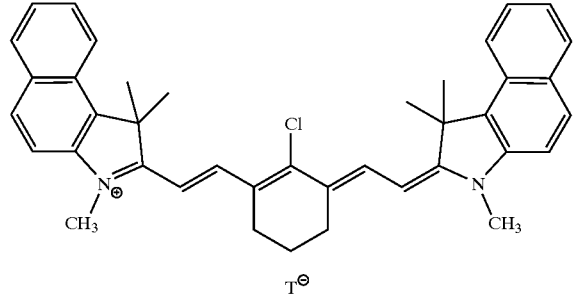

-continued
CA-5
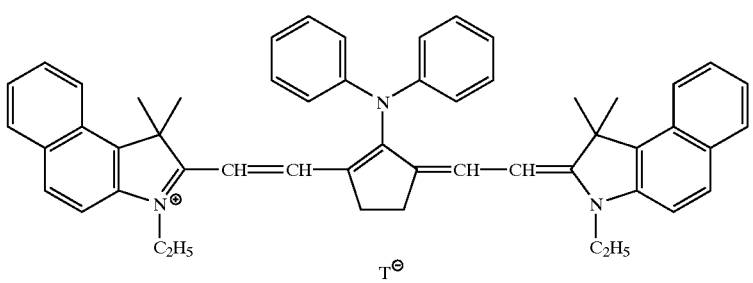
CA-6
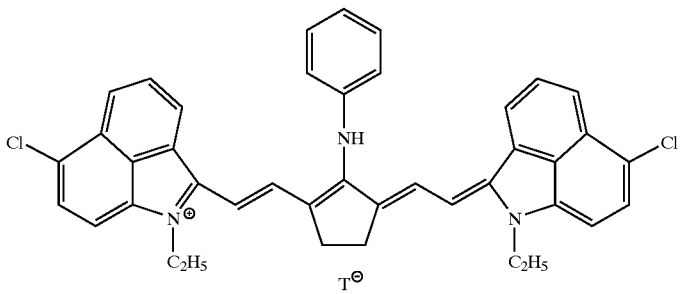
CA-7
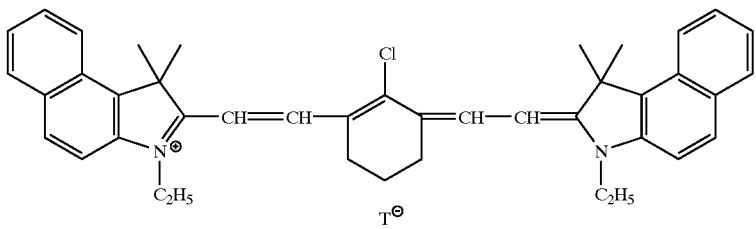
CA-8
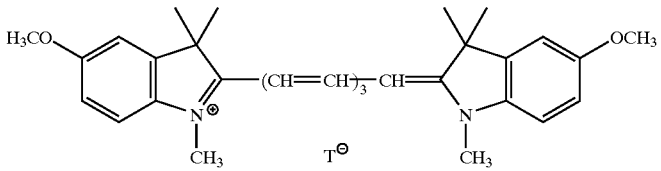
CA-9
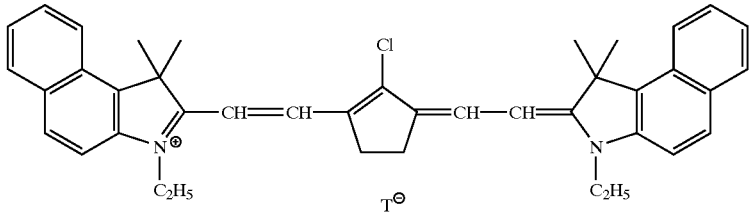
CA-10
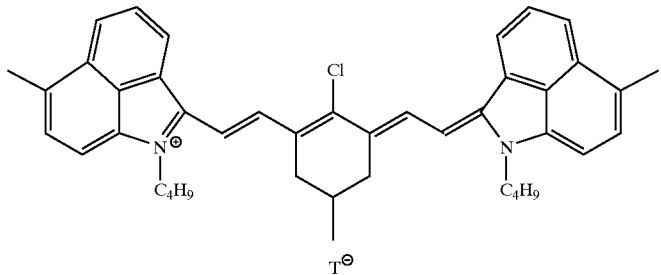

CA-11
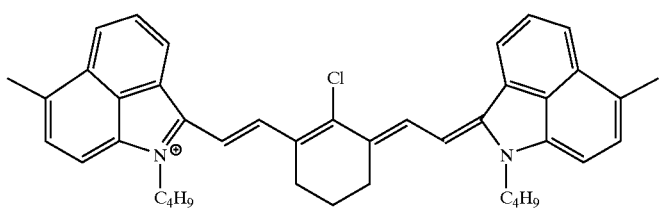
CA-12
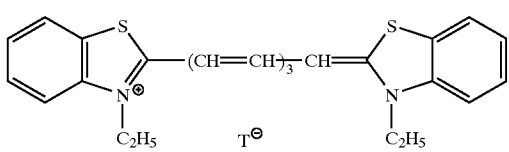
CA-13
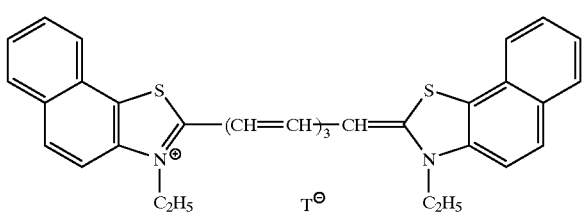
CA-14
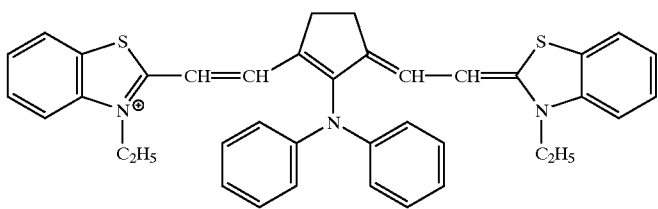
CA-15
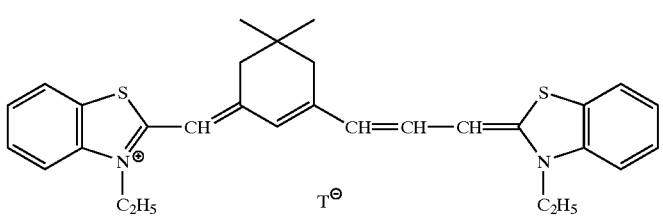
CA-16
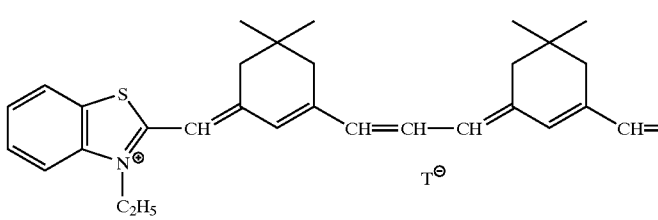
CA-17
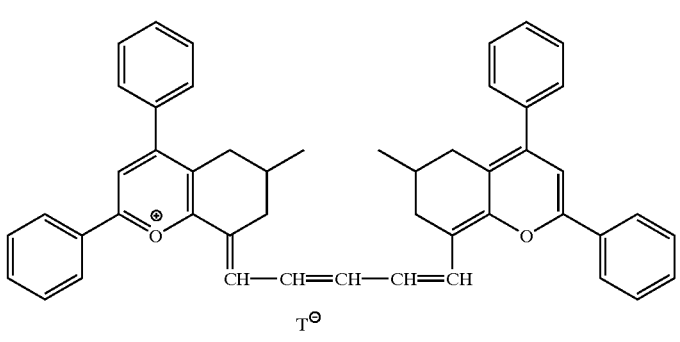

-continued
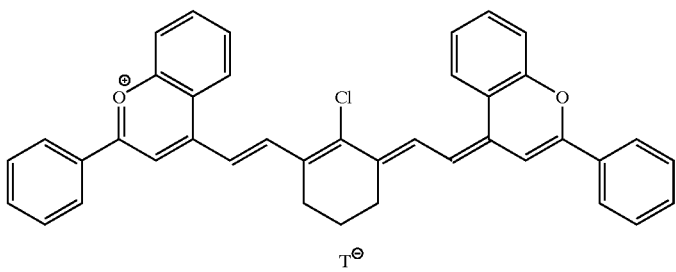
CA-18
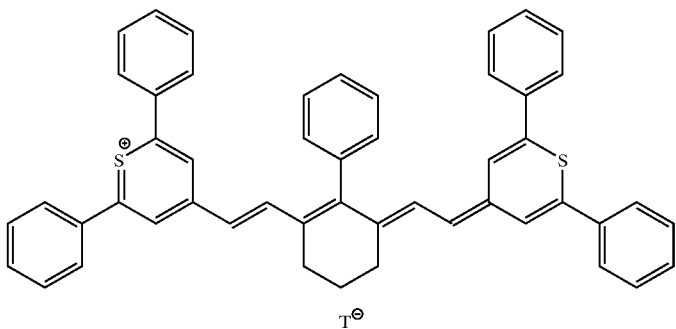
CA-19
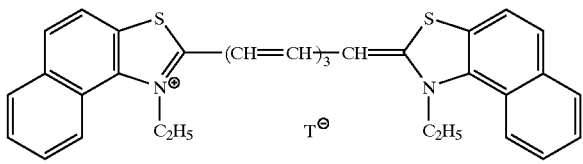
CA-20
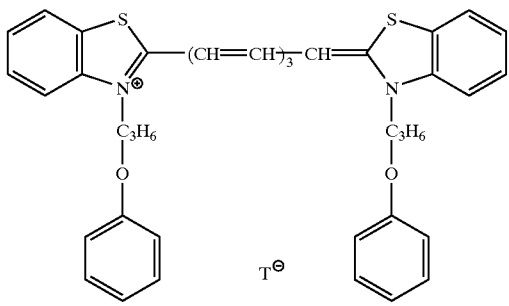
CA-21
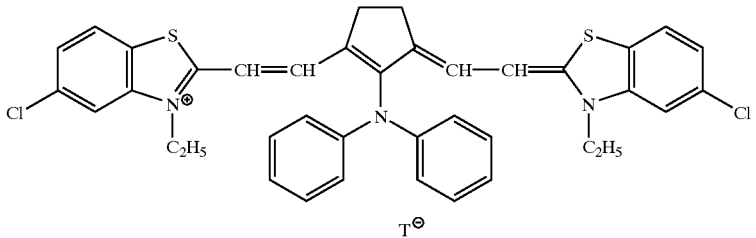
CA-22
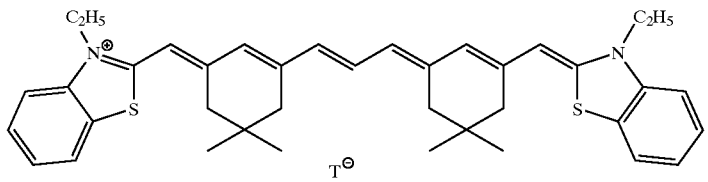
CA-23

-continued
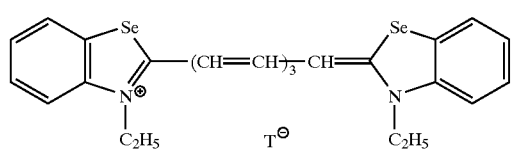
CA-24
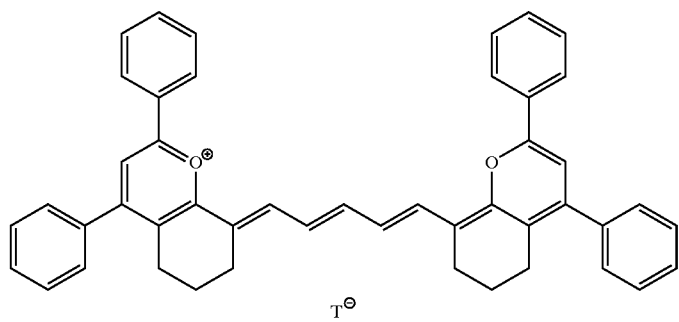
CA-25
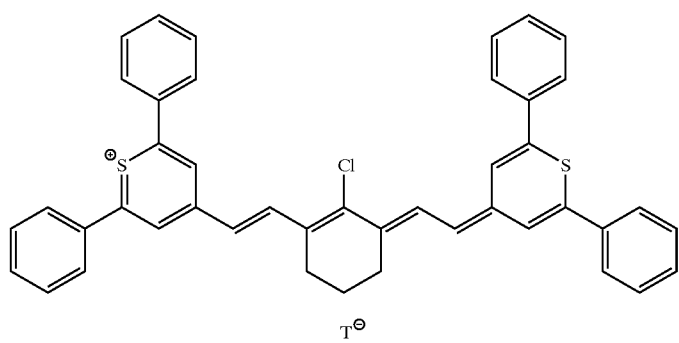
CA-26
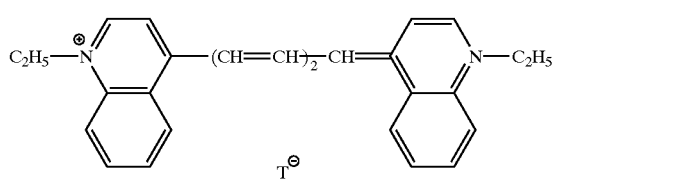
CA-27
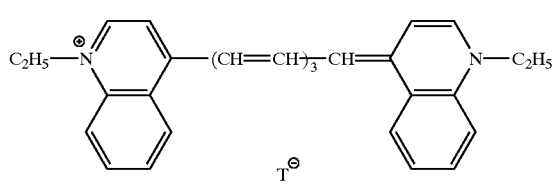
CA-28
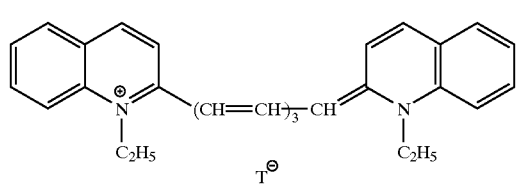
CA-29

-continued
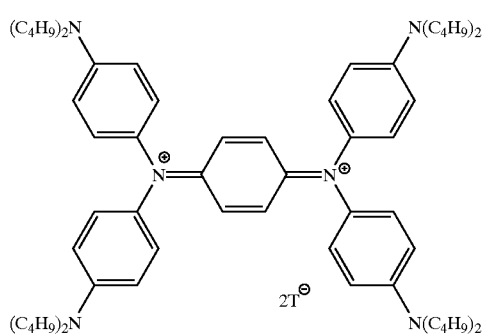
CA-30
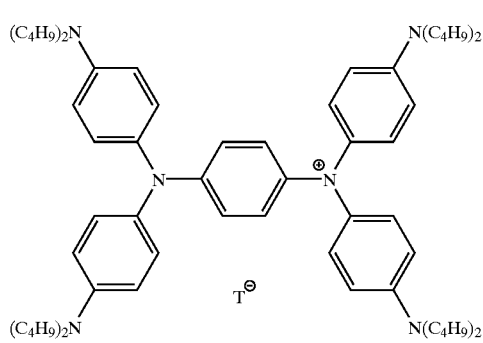
CA-31
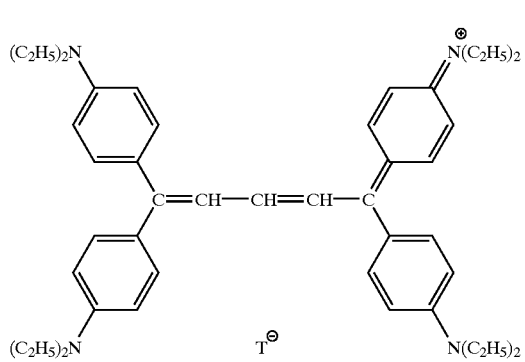
CA-32
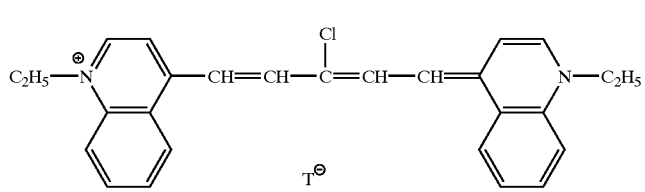
CA-33
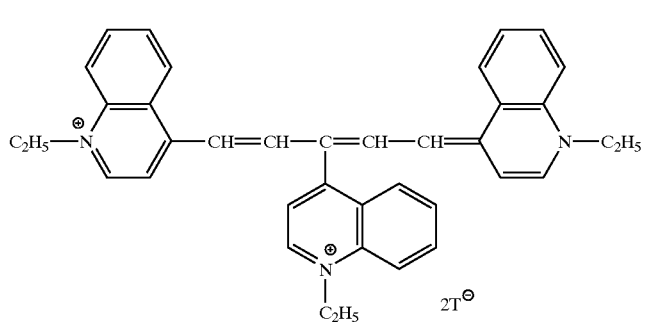
CA-34

-continued
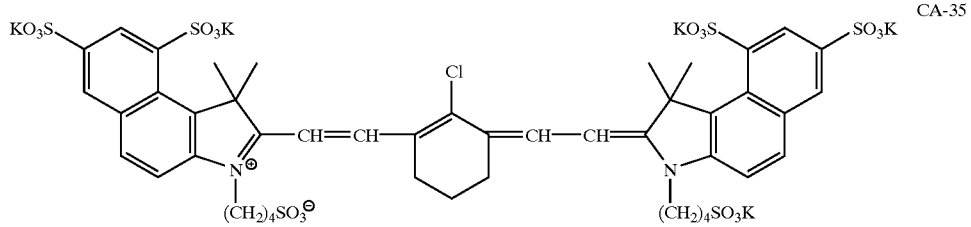
CA-35
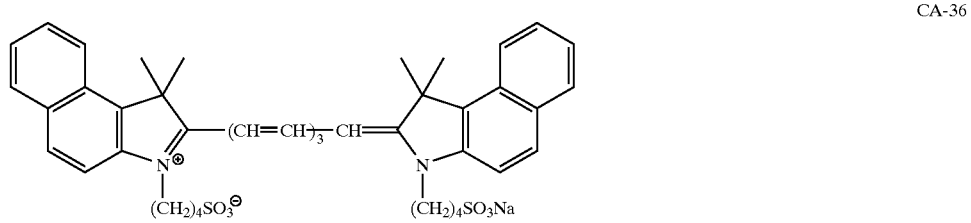
CA-36
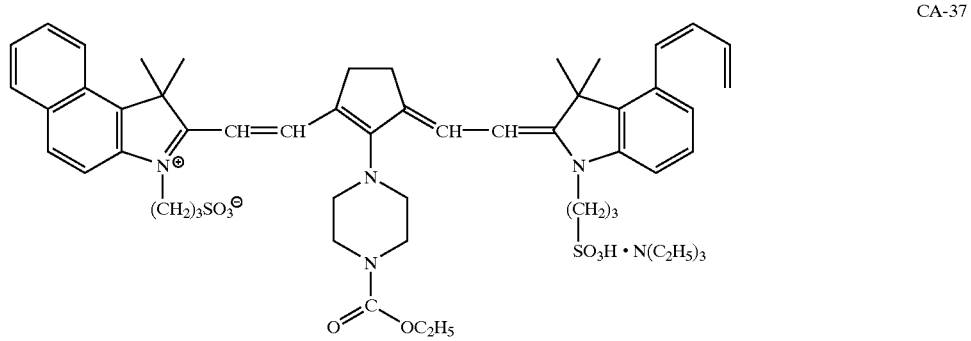
CA-37
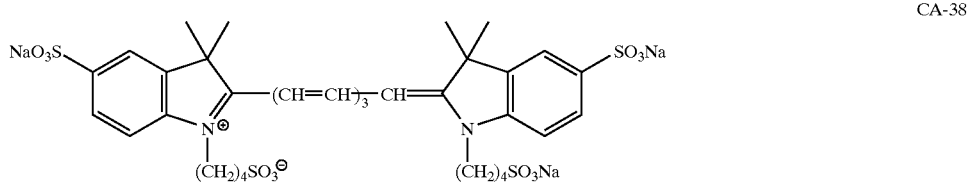
CA-38
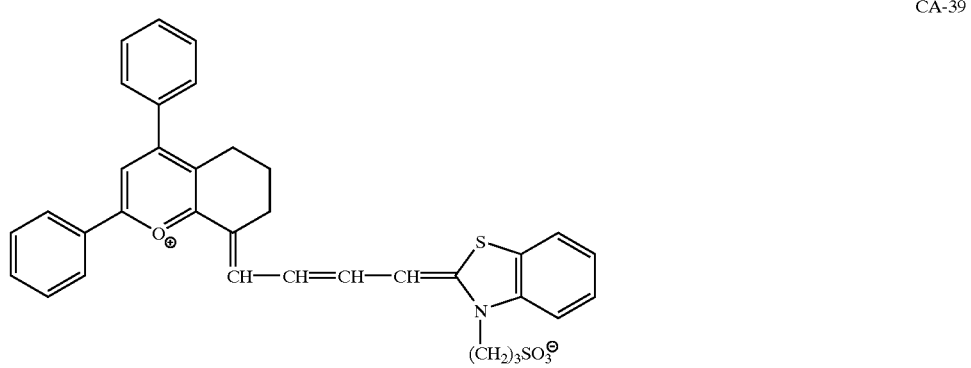
CA-39
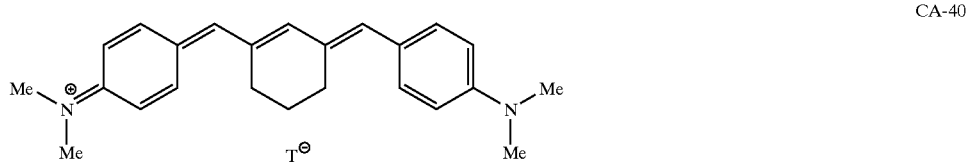
CA-40

-continued

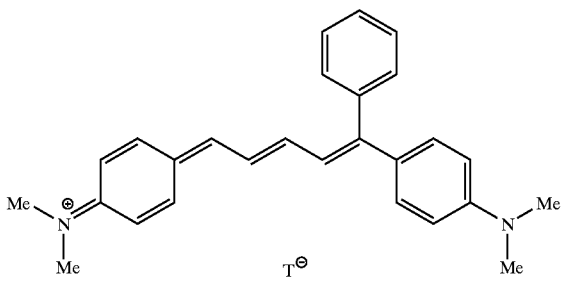
CA-41

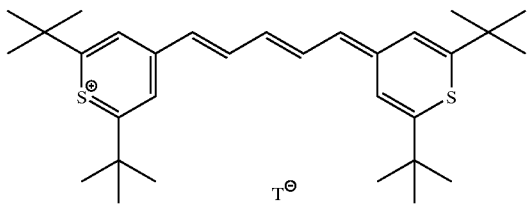
CA-42

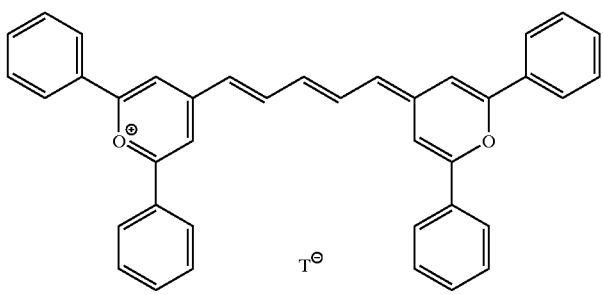
CA-43

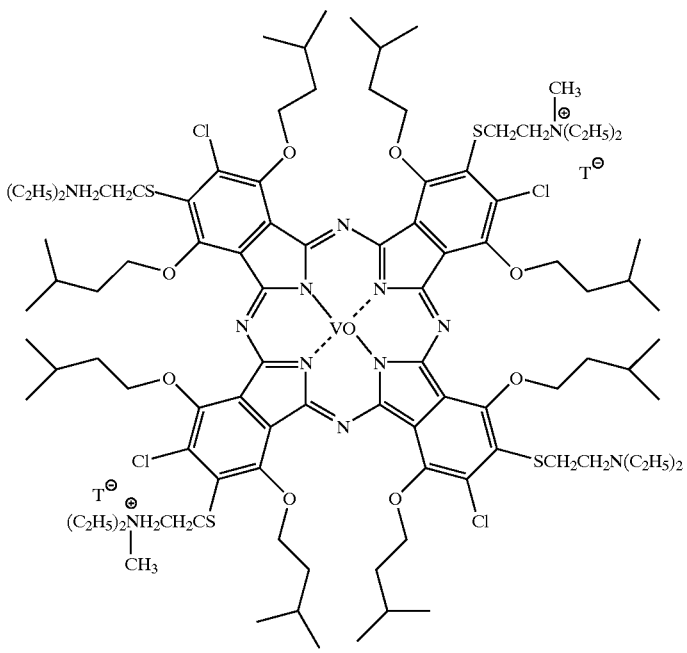
CA-44

In these structural formulae, T⁻ represents a monovalent counter anion, preferably a halogen anion (e.g., F⁻, Cl⁻, Br⁻, I⁻), a Lewis acid anion (e.g., $BF_4^-$, $PF_6^-$, $SbCl_6^-$, $ClO_4^-$), an alkylsulfonate anion or an arylsulfonate anion.

The alkyl in the alkylsulfonic acid is a linear, branched or cyclic alkyl group having from to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and 2-norbornyl group. Among these, linear alkyl groups having from to 12 carbon atoms, branched alkyl groups having from 3 to 12 carbon atoms and cyclic alkyl groups having from 5 to 10 carbon atoms are preferred.

The aryl in the arylsulfonic acid is an aryl group comprising one benzene ring or an aryl group resulting from the formation of a condensed ring by 2 or 3 benzene rings or by a benzene ring and a 5-membered unsaturated ring, and specific examples thereof include a phenyl group, a naphthyl group, an anthryl group, a phenanthryl group, an indenyl group, an acenaphthenyl group and a fluorenyl group, with a phenyl group and a naphthyl group being preferred.

In addition, the following nonionic infrared absorbents NA-1 to NA-12 may also be preferably used.

NA-1

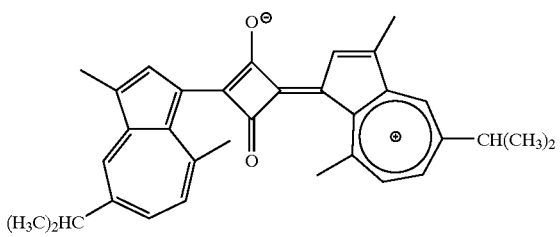

NA-2

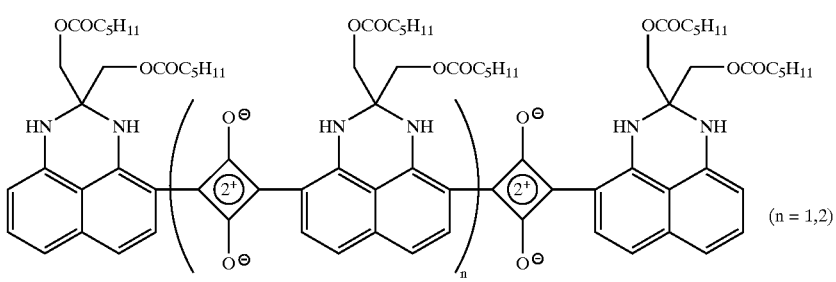

NA-3

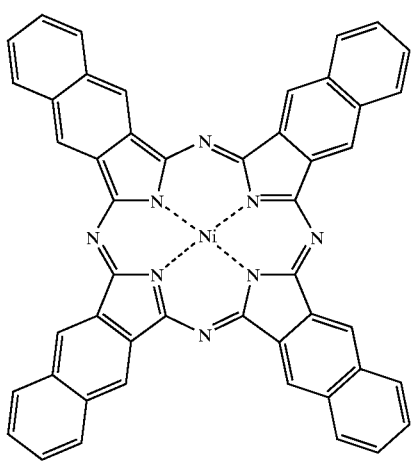

NA-4

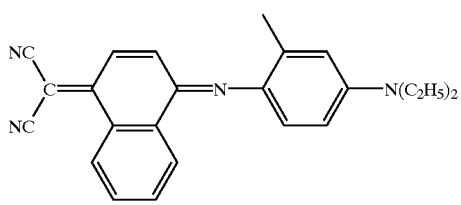

NA-5

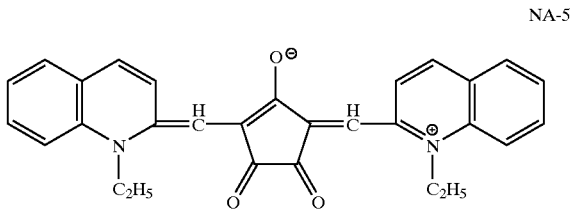

NA-6

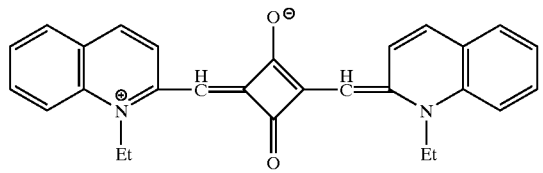

NA-7
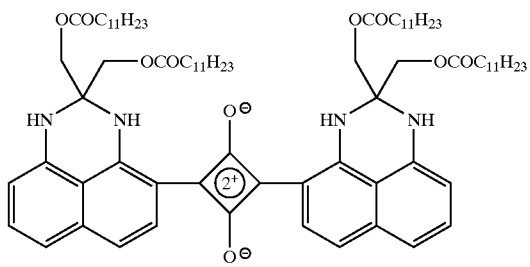
NA-8
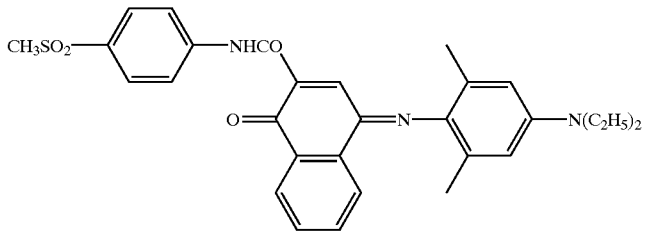
NA-9
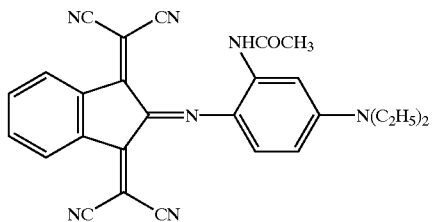
NA-10
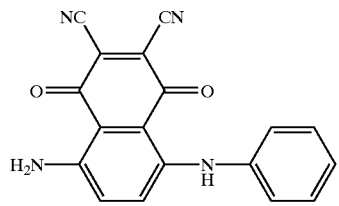
NA-11
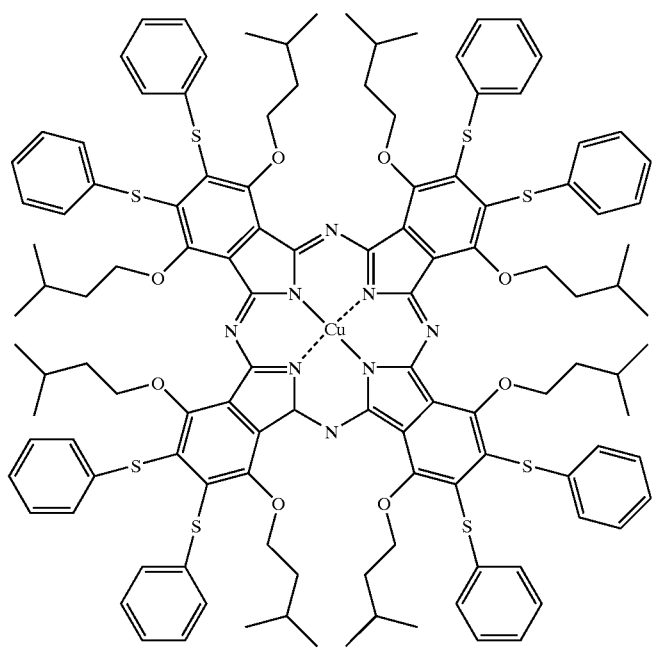

NA-12

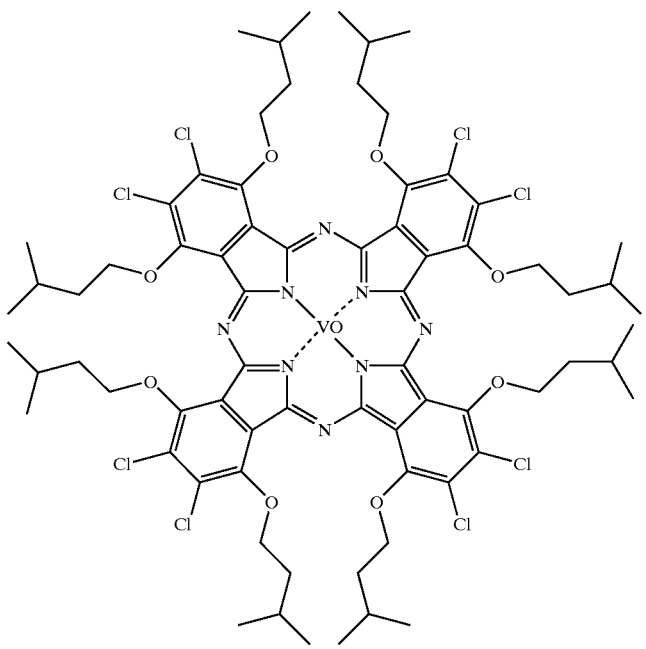

Among these compounds, more preferred are anionic infrared absorbent A-1, cationic infrared absorbents CA-7, CA-30, CA-40 and CA-42, and nonionic infrared absorbent NA-11.

Other than these dyes, commercially available dyes and known dyes described in publications, for example, *Senryo Binran* (*Handbook of Dyes*), compiled by Yuki Gosei Kagaku Kyokai (1970) may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, diimmonium dye, aminium dye, squarylium dye and metal thiolate dye.

Also, in addition to those pigments which can be used as the sensitizing dye, commercially available pigments and pigments described in *Color Index* (*C.I.*) *Binran* (*C.I. Handbook*), *Saishin Ganryo Binran* (*Handbook of Latest Pigments*), compiled by Nippon Ganryo Gijutsu Kyokai (1977), *Saishin Ganryo Oyo Gijutsu* (*Latest Pigment Application Technology*), CMC (1986), and *Insatsu Ink Gijutsu* (*Printing Ink Technology*), CMC (1984) may be used. The kind of the pigment includes black pigment, yellow pigment, orange pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, carbon black is preferred.

These pigments each may or may not be surface-treated before use.

The surface treatment may be performed a method of coating resin or wax on the surface, a method of attaching a surface active agent and a method of bonding a reactive substance (for example, silane coupling agent, an epoxy compound and polyisocyanate) to the pigment surface. These surface treatment methods are described in *Kinzoku Sekken no Seishitsu to Oyo* (*Properties and Application of Metal Soap*), Saiwai Shobo, *Insatsu Ink Gijutsu* (*Printing Ink Technology*), CMC (1984), and *Saishin Ganryo Oyo Gijutsu* (*Latest Pigment Application Technology*), CMC (1986).

The pigment preferably has a particle size of from 0.01 to 10 μm, more preferably from 0.05 to 1 μm, still more preferably from 0.1 to 1 μm. If the particle size of the pigment is less than 0.01 μm, the dispersion is disadvantageous in view of the stability in the coating solution for the image recording layer, whereas if it exceeds 10 μm, disadvantageous results may occur in view of the uniformity of the image recording layer.

For dispersing the pigment, known dispersion techniques used in the production of ink or toner may be used. Examples of the dispersing machine include ultrasonic disperser, sand mill, attritor, pearl mill, super-mill, ball mill, impeller, disperser, KD mill, colloid mill, dynatron, three roll mill and pressure kneader. These are described in detail in *Saishin Ganryo Oyo Gijutsu* (*Latest Pigment Application Technology*), CMC (1986).

More preferred examples of the sensitizing dye for use in the present invention include the merocyanine dyes described in JP-B-61-9621, the merocyanine dyes described in JP-A-2-179643, the merocyanine dyes described in JP-A-2-244050, the merocyanine dyes described in JP-B-59-28326, the merocyanine dyes described in JP-A-59-89303, the merocyanine dyes described in Japanese Patent Application No. 6-269047 and the benzopyrane-based dyes described in Japanese Patent Application No. 7-164583.

Furthermore, the infrared absorbents described in JP-A-11-209001 may also be used.

The sensitizing dyes for use in the present invention can be suitably used either individually or in combination of two or more thereof. The photopolymerizable composition of the present invention may further contain as a co-sensitizer a known compound having a function to more improve sensitivity or to prevent polymerization inhibition due to oxygen.

Examples of the co-sensitizer includes amines such as the compounds described in M. R. Sander *Journal of Polymer Society*, Vol. 10, p. 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825. Specific examples thereof include triethanolamine, ethyl p-dimethylaminobenzoate, p-formyldimethylaniline and p-methylthiodimethylaniline.

Other examples of the co-sensitizer include thiols and sulfides such as the thiol compounds described in JP-A-53-702, JP-B-55-500806 and JP-A-5-142772 and disulfide compounds described in JP-A-56-75643. Specific examples thereof include 2-mercaptobenzothiazole, 2-mercaptobenzoxazole, 2-mercaptobenzimidazole, 2-mercapto-4 (3H)-quinazoline and β-mercaptonaphthalene.

Still other examples of the co-sensitizer include amino acid compounds (e.g., N-phenylglycine), organometallic compounds described in JP-B-48-42965 (e.g., tributyltin acetate), hydrogen donors described in JP-B-55-34414, sulfur compounds described in Japanese Patent Application No. 5-91089 (e.g. trithian), phosphorus compounds described in Japanese Patent Application No. 5-32147 (e.g., diethyl phosphite), and Si—H and Ge—H compounds described in Japanese Patent Application No. 6-191605.

The amount of the photopolymerization initiator used in the composition of the present invention is from 0.01 to 60 wt %, preferably from 1 to 30 wt %, based on the weight of all components of the photopolymerizable composition.

In the case of using a sensitizing dye, the molar ratio of the photopolymerization initiator to the sensitizing dye in the photopolymerizable composition is from 100:0 to 1:99, preferably from 90:10 to 10:90, most preferably from 80:20 to 20:80.

In the case of using the above-described co-sensitizer, the co-sensitizer is suitably used in an amount of from 0.01 to 50 parts by weight, more preferably from 0.02 to 20 parts by weight, most preferably from 0.05 to 10 parts by weight, per part by weight of the photopolymerization initiator.

The photopolymerizable composition of the present invention preferably contains a linear organic high molecular polymer as a binder. The "linear organic high molecular polymer" may be any polymer as long as it is a linear organic high molecular polymer having compatibility with the photopolymerizable ethylenically unsaturated compound. A water- or alkalescent water-soluble or swellable linear organic high molecular polymer capable of water development or alkalescent water development is preferably selected. The linear organic high molecular polymer is used not only as a film forming agent of the composition but also as a developer while appropriately selecting it depending on the case where water, alkalescent water or organic solvent is used. For example, when a water-soluble organic high molecular polymer is used, water development can be performed. Examples of this linear organic high molecular polymer includes addition polymers having a carboxylic acid group on the side chain such as methacrylic acid copolymer, acrylic acid copolymer, itaconic acid copolymer, crotonic acid copolymer, maleic acid copolymer and partially esterified maleic acid copolymer, described in JP-A-59-44615, JP-B-54-34327, JP-B-58-12577, JP-B-54-25957, JP-A-54-92723, JP-A-59-53836 and JP-A-59-71048. Furthermore, acidic cellulose derivatives having a carboxylic acid group similarly on the side chain may be used. In addition, those obtained by adding a cyclic acid anhydride to an addition polymer having a hydroxyl group are also useful. Among these, copolymers of [benzyl (meth)acrylate/(meth)acrylic acid/other addition polymerizable vinyl monomer, if desired] and copolymers of [allyl (meth)acrylate/(meth)acrylic acid/other addition polymerizable vinyl monomer, if desired] are preferred. Other than these, polyvinyl pyrrolidone and polyethylene oxide are useful as the water-soluble linear organic polymer. In order to increase the strength of the cured film, alcohol-soluble polyamides and polyethers of 2,2-bis(4-hydroxyphenyl)propane with epichlorohydrin are also useful.

The linear organic high molecular polymer may be mixed in the entire composition in an arbitrary amount. However, if the amount exceeds 90 wt % based on the weight of all components of the composition, disadvantageous results may be caused in view of the strength or the like of the image formed. The amount mixed is preferably from 30 to 85%. The weight ratio of the photopolymerizable ethylenically unsaturated compound to the linear organic high molecular polymer is preferably from 1/9 to 7/3, more preferably from 3/7 to 5/5.

In the case where the compound having a structure represented by formula (I) of the present invention used is a high molecular type, the compound itself functions as a binder, therefore, the above-described binder may not be contained in the photopolymerizable composition. In using the compound in combination with the binder, the high molecular-type polymerizable compound of the present invention and the binder are used in the above-described weight ratio.

Polymerization Inhibitor:

In the present invention, in addition to those fundamental components, a slight amount of a thermal polymerization inhibitor is preferably added so as to prevent unnecessary thermal polymerization of the compound having a polymerizable ethylenically unsaturated double bond during the production or storage of the photopolymerizable composition. Suitable examples of the thermal polymerization inhibitor include hydroquinone, p-methoxyphenol, di-t-butyl-p-cresol, pyrogallol, tert-butylcatechol, benzoquinone, 4,4'-thiobis(3-methyl-6-tert-butylphenol), 2,2'-methylenebis (4-methyl-6-tert-butyl-phenol) and N-nitrosophenylhydroxylamine primary cerium salt. The amount of the thermal polymerization inhibitor added is preferably from about 0.01 to about 5 wt % based on the weight of the entire composition. Also, if desired, a higher fatty acid derivative such as behenic acid and behenic acid amide may be added to allow it to be present unevenly on the surface of the photosensitive layer during the drying process after the coating so as to prevent the polymerization inhibition due to oxygen. The amount of the higher fatty acid derivative added is preferably from about 0.5 to about 10 wt % of the entire composition.

Coloring Agent and the Like:

Furthermore, a dye or a pigment may also be added for the purpose of coloring the photosensitive layer. By adding this, the printing plate can be improved in the visibility after the plate making or in the suitability for plate inspection such as suitability for an image densitometer. The coloring agent is preferably a pigment because many dyes cause reduction in the sensitivity of the photopolymerizable system photosensitive layer. Specific examples of the coloring agent include pigments such as phthalocyanine-based pigment, azo-based pigment, carbon black and titanium oxide, and dyes such as Ethyl Violet, Crystal Violet, azo-based dyes, anthraquinone-based dyes and cyanine-based dyes. The amount of the dye or pigment added is preferably from about 0.5 to about 5 wt % based on the entire composition.

Other Additives:

In order to improve the physical properties of the cured film, an inorganic filler or other known additives such as plasticizer and ink receptivity agent capable of improving the inking property on the photosensitive layer surface, may also be added.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 wt % or less based on the total weight of the compound having an ethylenically unsaturated double bond and the binder.

Furthermore, in order to improve the film strength (press life) which is described later, an UV initiator, a heat cross-linking agent and the like capable of reinforcing the effect of heating/exposure after the development may also be added.

In addition, in order to improve the adhesion between the photosensitive layer and the support or to increase the developer removability of the unexposed photosensitive layer, an additive may be added or an interlayer may be provided. For example, when a compound having a relatively strong interaction with the support, such as a compound having a diazonium structure and a phosphonic compound, is added or undercoated, the adhesive property can be improved and the press life can be prolonged. On the other hand, when a hydrophilic polymer such as polyacrylic acid and polysulfonic acid is added or undercoated, the developability of the non-image_area can be improved and the resistance against staining can be increased.

The photopolymerizable composition of the present invention is coated on a support after dissolving it in an organic solvent of various types. Examples of the solvent which can be used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy-propanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %.

The coverage of photosensitive layer on a support has an effect mainly on the sensitivity of the photosensitive layer, the developability, and the strength and press life of the exposed film, therefore, an appropriate coverage is preferably selected according to the use. If the coverage is too small, a sufficiently long press life may not be obtained, whereas if the coverage is excessively large, the sensitivity decreases, the exposure takes a time and the development also requires a longer time. In the case of a lithographic printing plate for scanning exposure, which is the main object of the present invention, the coverage is suitably from about 0.1 to about 10 g/m$^2$, more preferably from 0.5 to 5 g/m$^2$, in terms of the dry weight Support:

For obtaining a lithographic printing plate which is one of the principal objects of the present invention, the photosensitive layer is preferably provided on a support having a hydrophilic surface. To this purpose, any known hydrophilic support used for lithographic printing plates may be used without any limitation. The support used is preferably a dimensionally stable plate-like material. Examples thereof include paper, paper laminated with plastics (e.g., polyethylene, polypropylene, polystyrene), sheet of a metal (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal) and paper or plastic film laminated with or having deposited thereon the above-described metal. The surface of these supports may also be subjected to a known appropriate physical or chemical treatment, if desired, so as to impart hydrophilicity, improve the strength and the like.

Among those supports, preferred are paper, polyester film and aluminum plate, and more preferred is aluminum plate because it is dimensionally stable and relatively inexpensive and can have a surface excellent in the hydrophilicity and strength by a surface treatment, if desired. Also, a composite sheet obtained by bonding an aluminum plate on a polyethylene terephthalate film described in JP-B-48-18327 may be preferably used.

The aluminum plate is suitably a pure aluminum plate or an alloy plate mainly comprising aluminum and containing a trace amount of foreign elements. Also, a plastic film laminated with or having deposited thereon aluminum may be used. Examples of the foreign element contained in the aluminum alloy include silicon, iron, manganese, copper, magnesium, chromium, zinc, bismuth, nickel and titanium. The foreign element content in the alloy is at most 10 wt % or less. In the present invention, pure aluminum is preferred, however, it is difficult to produce a completely pure aluminum in view of the smelting technology, therefore, an aluminum containing a trace amount of foreign elements may be used. As such, the composition of the aluminum plate for use in the present invention is not specified and an aluminum plate comprising conventionally known and used materials may be appropriately used. The aluminum plate for use in the present invention preferably has a thickness of approximately from 0.1 to 0.6 mm, more preferably from 0.15 to 0.4 mm, still more preferably from 0.2 to 0.3 mm.

In the case of a support having a metal surface, particularly an aluminum surface, the support is preferably subjected to a surface treatment such as surface roughening (graining), dipping in an aqueous solution of sodium silicate, potassium fluorozirconate or phosphate, or anodic oxidation.

The surface roughening of the aluminum plate is performed by various methods, for example, by a method of mechanically roughening the surface, a method of electrochemically dissolving and roughening the surface or a method of chemically dissolving the selected surface. In the mechanical surface roughening, a known method such as ball polishing, brush polishing, blast polishing or buff polishing may be used. The electrochemical surface roughening may be performed by passing an alternating current or direct current through the electrolytic solution such as hydrochloric acid or nitric acid. These two surface roughening treatments may be used in combination as disclosed in JP-A-54-63902. In advance of surface-roughening the aluminum plate, the aluminum plate is, if desired, subjected to a degreasing treatment with, for example, a surface active agent, an organic solvent or an alkaline aqueous solution so as to remove the rolling oil on the surface.

Furthermore, an aluminum plate subjected to a surface roughening treatment and then to a dipping treatment in an aqueous sodium silicate solution may be preferably used. An aluminum plate subjected to an anodic oxidation treatment and then to a dipping treatment in an aqueous solution of alkali metal silicate described in JP-B-47-5125 is suitably used. The anodic oxidation treatment is performed by applying an electric current to the aluminum plate as an anode in an electrolytic solution, for example, in an aqueous or non-aqueous solution of an inorganic acid such as phosphoric acid, chromic acid, sulfuric acid or boric acid, an organic acid such as oxalic acid or sulfamic acid, or a salt thereof. These aqueous or non-aqueous solutions may be used individually or in combination of two or more thereof.

The silicate electrodeposition described in U.S. Pat. No. 3,658,662 is also effective.

A combination of the above-described support subjected to electrolysis graining disclosed in JP-B-46-27481, JP-A-52-58602 and JP-A-52-30503 with anodic oxidation treatment and sodium silicate treatment is also useful.

A support subjected in sequence to mechanical graining, chemical etching, electrolysis graining, anodic oxidation treatment and sodium silicate treatment as in JP-A-56-28893 is also suitably used.

Furthermore, a support subjected to, after the above-described treatments, an undercoating treatment with a water-soluble resin such as a polyvinyl phosphonic acid, a polymer or copolymer having a sulfonic acid group on the side chain, a polyacrylic acid or a water-soluble metal salt (e.g., zinc borate) or with a yellow dye or an amine salt may also be suitably used.

A sol-gel treated substrate having covalent-bonded thereto a functional group capable of bringing out an addition reaction by radicals described in Japanese Patent Application No. 5-304358 is also suitably used.

Other preferred examples include those obtained by providing a water-resistant hydrophilic layer as the surface layer on an arbitrary support. Examples of the surface layer include a layer comprising an inorganic pigment and a binder described in U.S. Pat. No. 3,055,295 and JP-A-56-13168, a hydrophilic swelling layer described in JP-A-9-80744, and a sol-gel film comprising titanium oxide, polyvinyl alcohol and a silicic acid described in JP-W-8-507727 (the term "JP-W" as used herein means an "unexamined published international patent application").

The hydrophilizing treatments are applied not only to render the support surface hydrophilic but also to prevent harmful reaction of the photopolymerizable composition coated thereon and at the same time to improve the adhesion of the photosensitive layer.

[Protective Layer]

In the present invention, the lithographic printing plate for scanning exposure is usually exposed in air, therefore, a protective layer may be further provided on the photopolymerizable composition. The protective layer prevents basic substances and the like present in air, which inhibit the image-formation reaction caused in the photosensitive layer upon exposure, from mixing into the photosensitive layer and thereby enables the exposure in the air. Accordingly, the protective layer is required to have low permeability to low molecular compounds and preferably further has capabilities of not substantially inhibit the transmission of light used for the exposure, exhibiting excellent adhesion to the photosensitive layer and being easily removed in the development step after the exposure. The protective layer has been conventionally designed as such and this is described in detail in U.S. Pat. No. 3,458,311 and JP-A-55-49729. Examples of the material which can be used for the protective layer is a water-soluble polymer compound having relatively excellent crystallinity. Specific examples thereof include water-soluble polymers such as polyvinyl alcohol, polyvinyl pyrrolidone, acidic celluloses, gelatin, gum arabic and polyacrylic acid. Among these, polyvinyl alcohol is preferably used as the main component because most advantageous results can be given to the fundamental properties such as oxygen shutting out property and development removability. The polyvinyl alcohol for use in the protective layer has necessary oxygen shutting out property and water solubility, therefore, as long as it contains an unsubstituted vinyl alcohol unit, a part may be displaced with an ester, an ether or an acetal. Similarly, a part may have another copolymer component. Examples of the polyvinyl alcohol which can be used include those having a hydrolysis degree of from 71 to 100 mol % and a weight average molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd. selection of PVA, use of additives) and the coated amount thereof are selected by taking account of, in addition to the shutting out property against low molecular substances and the development removability, fogging, adhesive property and scratch resistance. In general, PVA having a higher hydrolysis ratio (namely, the protective layer has a higher unsubstituted vinyl alcohol unit content) and the layer thickness is larger, the low molecular substance shutting out property becomes stronger and this is more advantageous in view of sensitivity. However, if the low molecular substance shutting out property is extremely intensified, an unnecessary polymerization reaction may be caused during the production or stock storage or unnecessary fogging or thickening of image lines may be generated during the image exposure. Furthermore, the adhesive property to the image area and the scratch resistance are very important in view of handling of the plate. That is, when a hydrophilic layer comprising a water-soluble polymer is laminated on a lipophilic polymer layer, the layer is readily peeled off due to insufficient adhesion. To overcome this problem, various proposals have been made to improve the adhesive property between those two layers. For example, U.S. Pat. No. 292,501 and 44,53 describe a technique of mixing from 20 to 60 wt % of an acrylic emulsion or a water-insoluble vinyl pyrrolidone-vinyl acetate copolymer in a hydrophilic polymer mainly comprising polyvinyl alcohol and stacking it on a polymer layer, thereby obtaining a sufficiently high adhesive property. These known techniques all can be applied to the protective layer for use in the present invention. The coating method of the protective layer is described in detail, for example, in U.S. Pat. No. 3,458,311 and JP-A-55-49729.

Furthermore, other functions may be imparted to the protective layer. For example, when a laser ray is used as the light source, the photosensitive composition is sometimes intended to exhibit excellent sensitivity to light at the wavelength of the light source but not to be photosensitized by light at other wavelengths. In the case where the light source emits light in the infrared region of 750 nm or more, the plate may be used substantially in a bright room, however, photosensitization takes place even by short-wave light such as light of a fluorescent lamp. In such a case, a coloring agent (e.g., water-soluble dye) ensuring excellent transmittance of light of the light source and favored with capability of efficiently absorbing light at a wavelength of less than 700 nm is preferably added.

In another example where a light source which emits light in the ultraviolet region of 450 nm or less is used, the plate can be used under a substantially safe light. However, the composition is sometimes sensitized by visible light of 500 nm or more. In such a case, by using a coloring agent (e.g., water-soluble dye) ensuring excellent transmission of light of the light source and favored with efficient absorption of light at 500 nm or more may be used, whereby the safelight suitability can be more increased without causing any reduction in the sensitivity.

In the case where a photosensitive material using the photopolymerizable composition of the present invention is used as an image-forming material, the photosensitive material is usually subjected to imagewise exposure and then developed with a developer to remove the unexposed area of the photosensitive layer, thereby obtaining an image. When the photopolymerizable composition is used for manufacturing a lithographic printing plate, a developer described in JP-B-57-7427 is preferably used. The developer is suitably an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or an aqueous solution of an organic alkali agent such as monoethanolamine or diethanolamine. The alkali agent is added such that the alkali solution has a concentration of from 0.1 to 10 wt %, preferably from 0.5 to 5 wt %.

The above-described alkaline aqueous solution may contain, if desired, a surface active agent or an organic solvent in a small amount, such as benzyl alcohol, 2-phenoxyethanol or 2-butoxyethanol. Examples thereof include those described in U.S. Pat. Nos. 3,375,171 and 3,615,480.

Furthermore, the developers described in JP-A-50-26601, JP-A-58-54341, JP-B-56-39464 and JP-B-56-42860 are also excellent.

In the plate-making process of a lithographic printing plate original plate to which the photopolymerizable composition of the present invention is suitably applied, the entire surface may be heated, if desired, before or during the exposure or in the term from exposure to development. By this heating, the image-forming reaction in the photosensitive layer is accelerated and advantageous effects can be obtained such as improvement of the sensitivity and the press life and stabilization of the sensitivity. Furthermore, for the purpose of improving the image strength and the press life, it is also effective to after-heat or expose the entire surface of the image after the development. If the temperature is excessively high, problems may arise such as fogging of even the non-image area. In the heating after the development, a very severe condition is used, usually a temperature of from 200 to 500° C. If the temperature is low, a sufficiently high effect of reinforcing the image may not be obtained, whereas if it is excessively high, there arises a problem such as deterioration of the support or thermal decomposition of the image area.

In the exposure of the lithographic printing plate for scan exposure according to the present invention, known methods may be used without any limitation. The light source is preferably a laser and examples of the laser light source having a wavelength of from 350 to 450 nm, which is available at present and which can be used, include the followings:

gas lasers such as Ar ion laser (364 nm, 351 nm, from 10 mW to 1 W), Kr ion laser (356 nm, 351 nm, from 10 mW to 1 W) and He—Cd laser (441 nm, 325 nm, from 1 to 100 mW);

solid lasers such as combination of Nd:YAG ($YVO_4$) with SHG crystal× twice (355 nm, from 5 mW to 1 W) and combination of Cr:LiSAF and SHG crystal (430 nm, 10 mW); semiconductor laser type such as $KNbO_3$, ring resonator (430 nm, 30 mW), combination of a guided wave-type wavelength sensing element with AlGaAs or InGAAs semiconductor (from 380 to 450 nm, from 5 to 100 mW) and AlGaInN (from 350 to 450 nm, from 5 to 30 mW); and pulse lasers such as $N_2$ laser (337 nm, pulse: from 0.1 to 10 mJ) and XeF (351 nm, pulse: from 10 to 250 mJ).

Among these, the AlGaInN semiconductor laser (commercially available InGaN-type semiconductor laser: from 400 to 410 nm, from 5 to 30 mW) is preferred in view of the wavelength properties and the cost.

In addition, as the available light source which emit light of from 450 to 700 nm, Ar+ laser (488 nm), YAG-SHG laser (532 nm), He—Ne laser (633 nm), He—Cd laser and red semiconductor lasers (from 650 to 690 nm) may be suitably used, and as the available light source which emit light of from 700 to 1,200 nm, semiconductor lasers (from 800 to 850 nm) and Nd-YAG laser (1,064 nm) may be suitably used.

Furthermore, various mercury lamps of ultrahigh pressure, high pressure, medium pressure or low pressure, chemical lamp, carbon arc lamp, xenon lamp, metal halide lamp, ultraviolet laser lamps (e.g., ArF excimer laser, KrF excimer laser) and radioactive rays such as electron beam, X ray, ion beam and far infrared ray, may be used. Among these, laser light sources of 350 nm or more are preferred because these are inexpensive.

The exposure mechanism may be any of an internal surface drum system, an external drum system and a flat bed system. The components of the photosensitive layer for use in the present invention may have high water solubility and thereby the photosensitive layer may be rendered to be soluble in neutral water or alkalescent water. For the lithographic printing plate having such a construction, a system of mounting the plate in a printing machine and then performing the exposure and development on the machine may be employed.

In addition to the use for the lithographic printing plate for san exposure, the photopolymerizable composition of the present invention can be widely applied without any limitation, to those which are known as the use of photocurable resin. For example, when the present invention is applied to a liquid photopolymerizable composition using, if desired, a cation polymerizable compound in combination, a high-sensitivity photofabrication material can be obtained. Furthermore, by using changes in the refractive index upon photopolymerization, a hologram material may be obtained. By using changes in the surface tackiness upon photopolymerization, the present invention can be applied to various transfer materials (e.g., peel-type light-sensitive material, toner developing light-sensitive material). The present invention can also be applied to photocuring of a microcapsule, to the production of an electron material such as photoresist, and to photocurable materials such as ink, coating material and adhesive.

The present invention is described in greater detail below by referring to the Examples, however, the present invention should not be construed as being limited to these examples.

Synthesis of Compound Having Structure Represented by Formula (I) of the Present Invention The compound of formula (I) can be easily synthesized from a corresponding acryl group-containing compound according to the method described in *Secchaku no Gijutsu* (*Adhesion Technology*), Vol. 14, No. 4, Consecutive Vol. 37, page 2 (1995).

SYNTHESIS EXAMPLE 1

Compound A-1

Methyl acrylate (1.5 mol), an aqueous 37% formalin solution (1.0 mol) and tetrahydrofuran (100 ml) were charged into a flask. Thereto, DABCO (1,4-diazabicyclo[2,2,2]octane) (0.135 mol) was added and the mixture was stirred. After the reaction for 24 hours, 40 ml of 1N hydrochloric acid/200 ml of water ml were added and the reaction solution was extracted with ethyl acetate, dried over magnesium sulfate, filtered and concentrated under reduced pressure to obtain Compound A-1 in a yield of 30%.

The structure of the compound was identified by NMR, MASS and IR.

SYNTHESIS EXAMPLE 2

Compound A-12

Compound A-1 (1.0 mol) and tetrahydrofuran (100 ml) were charged into a flask. Thereto, NaH (1.0 mol) was gradually added under ice cooling and after stirring for 30 minutes, benzyl bromide (1.0 mol) was added dropwise over 1 hour. The mixture was returned to room temperature and stirred for 3 hours. After the reaction, 200 ml of water was added and the reaction solution was extracted with ethyl acetate, dried over magnesium sulfate, filtered and fully concentrated under reduced pressure to obtain Compound A-12 in a yield of 80%.

The structure of the compound was identified by NMR, MASS and IR.

SYNTHESIS EXAMPLE 3

Compound A-17

Compound A-1 (1.0 mol), ethyl acetate (100 ml), pyridine (1.0 mol) and DMAP (4-dimethylaminopyridine) (0.1 mol) were charged into a flask. Thereto, acetic acid chloride (1.0 mol) was added dropwise over 1 hour under ice cooling and the mixture was returned to room temperature and stirred for 3 hours. After the reaction, 200 ml of water was added and the ethyl acetate layer was extracted, dried over magnesium sulfate, filtered and fully concentrated under reduced pressure to obtain Compound A-17 in a yield of 95%. The structure of the compound was identified by NMR, MASS and IR.

SYNTHESIS EXAMPLE 4

Compound A-22

Compound A-1 (1.0 mol), ethyl acetate (100 mol), pyridine (1.0 mol) and DMAP (4-dimethylaminopyridine) (0.1 mol) were charged into a flask. Thereto, p-toluenesulfonyl chloride (1.0 mol) was added dropwise over 1 hour under ice cooling and the mixture was returned to room temperature and stirred for 3 hours. After the reaction, 200 ml of water was added and the reaction solution was extracted with ethyl acetate, dried over magnesium sulfate, filtered and fully concentrated under reduced pressure to obtain Compound A-22 in a yield of 90%. The structure of the compound was identified by NMR, MASS and IR.

SYNTHESIS EXAMPLE 5

Compound A-33

2-(Bromomethyl)acrylic acid (produced by Aldrich) (1.0 mol) and chloroform (100 ml) were charged into a flask. Thereto, $SOCl_2$ (1.0 mol) was added dropwise over 1 hour under ice cooling and the mixture was returned to room temperature and stirred for 2 hours. Thereto, n-butanol (2.0 mol) was added and after the reaction at room temperature for 24 hours, the reaction solution was concentrated under reduced pressure, 200 ml of water was added thereto, and the resulting solution was extracted with ethyl acetate, dried over magnesium sulfate, filtered and fully concentrated under reduced pressure to obtain Compound A-33 in a yield of 90%. The structure of the compound was identified by NMR, MASS and IR.

SYNTHESIS EXAMPLE 6

Compound A-27

2-(Bromomethyl)acrylic acid (produced by Aldrich) (1.0 mol) and chloroform (100 ml) were charged into a flask. Thereto, $SOCl_2$ (1.0 mol) was added dropwise over 1 hour under ice cooling and the mixture was returned to room temperature and stirred for 2 hours. Thereto, methanol (2.0 mol) was added and after the reaction at room temperature for 24 hours, the reaction solution was concentrated under reduced pressure, 200 ml of water was added thereto, and the resulting solution was extracted with ethyl acetate, dried over magnesium sulfate, filtered and fully concentrated under reduced pressure. Thereto, ethyl acetate (100 ml) and 2-mercaptobenzothiazole (1.0 mol) were added and further triethylamine (1.0 mol) was added dropwise over 30 minutes under ice cooling. Thereto, 200 ml of water was added and the resulting solution was extracted with ethyl acetate, dried over magnesium sulfate, filtered and fully concentrated under reduced pressure to obtain Compound A-27 in a yield of 80%. The structure of the compound was identified by NMR, MASS and IR.

SYNTHESIS EXAMPLE 7

Compound A-38

2-(Bromomethyl)acrylic acid (produced by Aldrich) (1.0 mol) and chloroform (100 ml) were charged into a flask. Thereto, $SOCl_2$ (1.0 mol) was added dropwise over 1 hour under ice cooling and the mixture was returned to room temperature and stirred for 2 hours. Thereto, methanol (2.0 mol) was added and after the reaction at room temperature for 24 hours, the reaction solution was concentrated under reduced pressure, 200 ml of water was added thereto, and the resulting solution was extracted with ethyl acetate, dried over magnesium sulfate, filtered and fully concentrated under reduced pressure. Thereto, ethyl acetate (100 ml) and morpholine (1.0 mol) were added and further triethylamine. (1.0 mol) was added dropwise over 30 minutes under ice cooling. The mixture was stirred for 5 hours, 200 ml of water was added thereto and the resulting solution was extracted with ethyl acetate, dried over magnesium sulfate, filtered and fully concentrated under reduced pressure to obtain Compound A-38 in a yield of 70%. The structure of the compound was identified by NMR, MASS and IR.

SYNTHESIS EXAMPLE 8

Compound B-5

A-1 (1.5 mol) and acetone (100 ml) were charged into a flask. Thereto, n-butyl isocyanate (1.0 mol) and di-n-butyltin dilaurate (0.001 mol) were added and the mixture was stirred at room temperature for 8 hours. Thereto, 200 ml of water was added and the resulting solution was extracted with ethyl acetate, dried over magnesium sulfate, filtered and concentrated under reduced pressure. Thereto, tetrahydrofuran (100 ml) was added and NaH (1.0 mol) was gradually added under ice cooling. After stirring for 1 hours, p-methoxyphenol (0.01 mol) was added and the mixture was stirred at a bath temperature of 80° C. for 10 hours. After stirring, 200 ml of water was added and the resulting solution was extracted with ethyl acetate, dried over magnesium sulfate, filtered, fully concentrated under reduced pressure, separated by silica gel column chromatography (hexane/ethyl acetate=9/1), and then concentrated under reduced pressure to obtain Compound B-5 in a yield of 20%. The structure of the compound was identified by NMR, MASS and IR.

SYNTHESIS EXAMPLE 9

Compound C-1

1,6-Hexanediol diacrylate (produced by Nakamura Kagaku) (0.75 mol), an aqueous 37% formalin solution (1.0 mol) and tetrahydrofuran (100 ml) were charged into a flask.

Thereto, DABCO (0.135 mol) was added and the mixture was stirred. After the reaction for 24 hours, 40 ml of 1N hydrochloric acid/200 ml of water were added and the reaction solution was extracted with ethyl acetate, dried over magnesium sulfate, filtered, concentrated under reduced pressure, separated by silica gel column chromatography (hexane/ethyl acetate=9/1) and then concentrated under reduced pressure to obtain Compound C-1 in a yield of 20%. The structure of the compound was identified by NMR, MASS and IR.

SYNTHESIS EXAMPLE 10

Compound D-7

Compound A-1 (1.0 mol), ethyl acetate (100 ml), pyridine (1.0 mol) and DMAP (4-dimethylaminopyridine) (0.1 mol) were charged into a flask. Thereto, butanedioyl dichloride (0.5 mol) was added dropwise over 1 hour under ice cooling and the mixture was returned to room temperature and stirred for 3 hours. After the reaction, 20 ml of water was added and the reaction solution was extracted with ethyl acetate, dried over magnesium sulfate, filtered and concentrated under reduced pressure to obtain Compound D-7 in a yield of 80%. The structure of the compound was identified by NMR, MASS and IR.

SYNTHESIS EXAMPLE 11

Compound E-4

Pentaerythritol tetraacrylate (produced by Nakamura Kagaku) (0.375 mol), an aqueous 37% formalin solution (1.0 mol) and tetrahydrofuran (100 ml) were charged into a flask.

Thereto, DABCO (0.135 mol) was added and the mixture was stirred. After the reaction for 24 hours, 40 ml of 1N hydrochloric acid/200 ml of water were added and the reaction solution was extracted with ethyl acetate, dried over magnesium sulfate, filtered, concentrated under reduced pressure, separated by silica gel column chromatography (hexane/ethyl acetate=9/1) and concentrated under reduced pressure to obtain Compound E-4 in a yield of 10%. The structure of the compound was identified by NMR, MASS and IR.

SYNTHESIS EXAMPLE 12

Compound F-3

Compound A-1 (1.0 mol), ethyl acetate (100 ml), pyridine (1.0 mol) and DMAP (4-dimethylaminopyridine) (0.1 mol) were charged into a flask. Thereto, trimesoyl chloride (0.34 mol) was added dropwise over 1 hour under ice cooling and the mixture was returned and stirred for 3 hours. After the reaction, 200 ml of water was added and the ethyl acetate layer was extracted, dried over magnesium sulfate, filtered and fully concentrated under reduced pressure to obtain Compound F-3 in a yield of 70%. The structure of the compound was identified by NMR, MASS and IR.

SYNTHESIS EXAMPLE 13

Compound G-5

Compound A-1 (0.8 mol), acetone (100 ml), pyridine (1.0 mol) and DMAP (4-dimethylaminopyridine) (0.1 mol) were charged into a flask. Thereto, a 30 wt % solution (an amount of giving a COCl group content of 1.0 mol based on Compound A-1) of polyacrylic acid chloride having a weight average molecular weight of 20,000 separately obtained by the radical polymerization of acrylic acid chloride and Thermal Polymerization Initiator V-601 (produced by Wako Junyaku) was added under ice cooling. The mixture was returned to room temperature and stirred for 24 hours. After the reaction, 200 ml of water was added and the mixture was further stirred for 24 hours. The reaction solution was added dropwise to 100 ml of 1N hydrochloric acid/1 L of water, the polymer precipitate was taken out, dissolved in ethyl acetate and dried over magnesium sulfate, and thereto p-methoxyphenol was added to have a concentration of about 500 ppm. The resulting solution was concentrated under reduced pressure while controlling to have a solid concentration of 30%. As a result, Compound G-5 was obtained in a yield of 90%. The structure of the compound was identified by GPC, NMR and IR.

SYNTHESIS EXAMPLE 14

Compound G-13

2-(Bromomethyl)acrylic acid (produced by Aldrich) (0.8 mol) and chloroform (100 ml) were charged into a flask. Thereto, SOCl2 (0.8 mol) was added dropwise over 1 hour under ice cooling. The mixture was returned to room temperature and stirred for 2 hours. After the concentration under reduced pressure, acetone (100 ml) was added and thereto, a novolak (in an amount of giving an OH group content of 1.0 mol based on the 2-(bromomethyl)acrylic acid) having a weight average molecular weight of 4,000 synthesized from m-cresol, p-cresol and formalin in the presence of an oxalic acid catalyst was added. Further thereto, triethylamine (0.8 mol) was added dropwise over 1 hour. After the reaction at room temperature for 24 hours, the reaction solution was added dropwise to 100 ml of 1N hydrochloric acid/1 L of water, the polymer precipitate was taken out, dissolved in ethyl acetate and dried over magnesium sulfate, and thereto p-methoxyphenol was added to have a concentration of about 200 ppm. The resulting solution was concentrated under reduced pressure while controlling to have a solid concentration of 30%. As a result, Compound G-13 was obtained in a yield of 80%. The structure of the compound was identified by GPC, NMR and IR.

All compounds specifically described can be synthesized in the same manner as above.

EXAMPLE 1 OF PHOTOPOLYMERIZABLE COMPOSITION

Preparation of Support

A 0.3 mm-thick aluminum plate was etched by dipping it in 10 wt % sodium hydroxide at 60° C. for 25 seconds, washed with running water, neutralization washed with 20 wt % of nitric acid and then washed with water. The resulting plate was subjected to an electrolytic graining treatment in 1 wt % of an aqueous nitric acid solution using a sinusoidal wave alternating current at an anodic time electricity of 300 coulomb/dm$^2$. Subsequently, the aluminum plate was dipped in 1 wt % of an aqueous sodium hydroxide solution at 40° C. for 5 hours, desmutted at 60° C. for 40 seconds in 30 wt % of an aqueous sulfuric acid solution, and then anodized for 2 hours at a current density of 2 A/dm$^2$ in 20 wt % of aqueous sulfuric acid solution to have an anodic oxide film thickness of 2.7 g/m$^2$. The surface roughness measured was 0.3 μm (Ra indication according to JIS B0601).

On the back surface of the thus-treated substrate, the following sol-gel reaction solution was coated by a bar coater and dried at 100° C. for 1 minute to prepare a support having provided thereon a backcoat layer in a dry coated weight of 70 mg/m$^2$.

Sol-gel reaction solution:

| Tetraethyl silicate | 50 parts by weight |
|---|---|
| Water | 20 parts by weight |
| Methanol | 15 parts by weight |
| Phosphoric acid | 0.05 part by weight |

These components were mixed and stirred, then within about 5 minutes, generation of heat started. After the reaction for 60 minutes, the following solution was added to prepare a coating solution for the backcoat layer.

| Pyrogallol formaldehyde condensed resin (molecular weight: 2,000) | 4 parts by weight |
|---|---|
| Dimethyl phthalate | 5 parts by weight |
| Fluorine-based surfactant (N-butylperfluorooctane sulfonamide ethyl acrylate/ polyoxyethylene acrylate copolymer, molecular weight: 20,000) | 0.7 parts by weight |
| Methanol silica sol (produced by Nissan Chemical Industry, Ltd., methanol: 30 wt %) | 50 parts by weight |
| Methanol | 800 parts by weight |

Preparation of Photosensitive Layer

On the thus-treated aluminum plate, a photopolymerizable composition having the following composition was coated to have a dry coated amount of 1.5 g/m$^2$ and then dried at 100° C. for 1 minute to form a photosensitive layer.

Solution for Forming Photosensitive Layer

| Compound [X] having a polymerizable group of the present invention or for comparison shown in Table A below) | 1.5 g |
|---|---|
| Photopolymerization initiator [Y] shown in Table A below) | 0.3 g |
| Polymer binder [Z] shown in Table A below | 2.0 g |
| Polymerizable compound [R] shown in Table A below | 5 g (see Table A) |
| Additive [S] shown in Table A below | 0.4 g |
| Fluorine-based surfactant (Megafac F-177, produced by Dai-Nippon Ink & Chemicals, Inc.) | 0.03 g |
| Thermal polymerization inhibitor (N-nitrosophenylhydroxylamine aluminum salt) | 0.01 g |
| Pigment dispersion | 2.0 g |
| Composition of Pigment Dispersion | |
| Composition: Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |
| Methyl Ethyl ketone | 20 g |
| Propylene glycol monomethyl ether | 20 g |

Preparation of Protective Layer

In some Examples, an aqueous solution containing 3 wt % of polyvinyl alcohol (saponification degree: 98 mol %, polymerization degree 550) was coated on the photosensitive layer to have a dry coated weight of 2 g/m$^2$ and dried at 100° C. for 2 minutes.

Evaluation of Sensitivity

The thus-obtained light-sensitive materials were evaluated on the sensitivity by varying the light source according to the exposure wavelength of each light-sensitive material.

For example, the light-sensitive material was exposed in air using a semiconductor laser of 400 nm, an FD-YAG laser of 632 nm and a semiconductor laser of 830 nm, and developed by dipping it in a developer having the following composition at 25° C. for 10 seconds. From the minimum exposure amount necessary for forming an image, the sensitivity in the unit of mJ/cm$^2$ under respective exposure conditions was calculated. As the numerical value obtained is smaller, the sensitivity is higher. However, with the difference of the light source wavelength, the energy amount per one photon changes and simply thought, as the wavelength is shorter, the photosensitization can be usually attained with a smaller exposure amount. Accordingly, comparison of the sensitivity between different exposure conditions has no meaning and Table B is set forth to compare the difference between Example and Comparative Example under the same exposure conditions. The results are shown in Table B.

Composition of Developer

| | |
|---|---|
| DP-4 (produced by Fuji Photo Film Co., Ltd.) | 65.0 g |
| Water | 880.0 g |
| Lipomin A (20% aqueous solution, produced by Lion) | 50.0 g |

Evaluation of Storage Stability

The light-sensitive materials obtained above before the exposure to a laser were left standing under a high temperature condition (60° C.) for 3 days. These light-sensitive materials after the storage were exposed to a laser in the same manner as above and the energy amount necessary for the recording was calculated. From the values calculated, an energy ratio between before and after the storage at a high temperature (energy after high temperature storage/energy after high temperature storage) was obtained. In view of the production, this energy ratio is preferably 1.1 or less. With this energy ratio, good storage stability can also be obtained.

The results of this evaluation are also shown in Table B below.

TABLE A

| | Light-Sensitive Material | | | | | |
|---|---|---|---|---|---|---|
| | X | Y | Z | R(r) | S | Presence or Absence of Protective Layer | Light Source (nm) |
| Example 1 | C-1 | Y-1 | Z-1 | none | none | present | 400 |
| Example 2 | C-9 | Y-1 | Z-1 | none | none | present | 400 |
| Example 3 | D-17 | Y-2 | Z-2 | none | S-1 | present | 400 |
| | D-18 | Y-2 | Z-2 | none | S-2 | present | 400 |
| | E-2 | Y-1 | Z-2 | none | S-3 | present | 400 |
| | E-20 | Y-2 | Z-1 | none | S-4 | present | 400 |
| | F-3 | Y-1 | Z-1 | none | S-3 | present | 400 |
| | F-8 | Y-1 | Z-2 | R-1(0.5) | S-1 | present | 400 |
| | G-1 | Y-1 | none | R-1(0.1) | S-1 | present | 400 |
| | 1G-3 | Y-1 | none | R-2(1.0) | none | present | 400 |
| | 1H-1 | Y-2 | Z-1 | none | none | present | 400 |
| | 1J-1 | Y-1 | Z-2 | none | none | present | 400 |
| Comparative Example 1 | xc-1 | Y-1 | z-1 | none | none | present | 400 |
| Comparative Example 2 | xc-9 | Y-1 | Z-1 | none | none | present | 400 |
| | xd-17 | Y-2 | Z-2 | none | S-1 | present | 400 |
| | xd-18 | Y-2 | Z-2 | none | S-2 | present | 400 |
| | xe-2 | Y-1 | Z-2 | none | S-3 | present | 400 |
| | xe-20 | Y-2 | Z-1 | none | S-4 | present | 400 |
| | xf-3 | Y-1 | Z-1 | none | S-3 | present | 400 |
| | xf-8 | Y-1 | Z-2 | R-1(0.5) | S-1 | present | 400 |
| | xg-1 | Y-1 | none | R-1(1.0) | S-1 | present | 400 |
| | 1xg-3 | Y-1 | none | R-2(1.0) | none | present | 400 |
| | 1xh-1 | Y-2 | Z-1 | none | none | present | 400 |
| | 1xj-1 | Y-1 | Z-2 | none | none | present | 400 |
| Example 13 | C-2 | Y-3 | Z-1 | R-1(0.5) | none | present | 532 |
| Example 14 | C-8 | Y-3 | Z-1 | none | none | present | 532 |
| Example 15 | D-13 | Y-4 | Z-1 | none | S-1 | present | 532 |
| Example 16 | D-15 | Y-4 | Z-2 | none | S-2 | present | 532 |
| Example 17 | E-1 | Y-5 | Z-2 | none | S-3 | present | 532 |
| Example 18 | E-21 | Y-4 | Z-1 | none | S-4 | present | 532 |
| Example 19 | F-4 | Y-5 | Z-1 | none | S-3 | present | 532 |
| Example 20 | F-10 | Y-3 | Z-2 | none | S-2 | present | 532 |
| Example 21 | G-2 | Y-4 | none | R-1(1.0) | S-2 | present | 532 |
| Example 22 | G-10 | Y-3 | none | R-2(1.0) | none | present | 532 |
| Example 23 | H-2 | Y-3 | Z-1 | none | none | present | 532 |
| Example 24 | J-3 | Y-3 | Z-2 | none | none | present | 532 |
| Comparative Example 13 | xc-2 | Y-3 | Z-1 | R-1(0.5) | none | present | 532 |
| Comparative Example 14 | xc-8 | Y-3 | Z-1 | none | none | present | 532 |
| Comparative Example 15 | xd-13 | Y-4 | Z-1 | none | S-1 | present | 532 |
| Comparative Example 16 | xd-15 | Y-4 | Z-2 | none | S-2 | present | 532 |
| Comparative Example 17 | xe-1 | Y-5 | Z-2 | none | S-3 | present | 532 |
| Comparative Example 18 | xe-21 | Y-4 | Z-1 | none | S-4 | present | 532 |
| Comparative Example 19 | xf-4 | Y-5 | Z-1 | none | S-3 | present | 532 |
| Comparative Example 20 | xf-10 | Y-3 | Z-2 | none | S-2 | present | 532 |
| Comparative Example 21 | xg-2 | Y-4 | none | R-1(1.0) | S-2 | present | 532 |
| Comparative Example 22 | xg-10 | Y-3 | none | R-2(1.0) | none | present | 532 |
| Comparative Example 23 | xh-2 | Y-3 | Z-1 | none | none | present | 532 |
| Comparative Example 24 | xj-3 | Y-3 | Z-2 | none | none | present | 532 |
| Example 25 | C-3 | Y-6 | z-1 | R-1(0.5) | none | none | 830 |

TABLE A-continued

Light-Sensitive Material

| | X | Y | Z | R(r) | S | Presence or Absence of Protective Layer | Light Source (nm) |
|---|---|---|---|---|---|---|---|
| Example 26 | C-10 | Y-6 | Z-1 | none | none | none | 830 |
| Example 27 | D-4 | Y-6 | Z-1 | none | S-5 | none | 830 |
| Example 28 | D-18 | Y-7 | Z-2 | none | S-5 | none | 830 |
| Example 29 | E-7 | Y-7 | Z-2 | none | S-6 | none | 830 |
| Example 30 | E-9 | Y-8 | Z-1 | none | S-7 | none | 830 |
| Example 31 | F-5 | Y-8 | Z-1 | none | none | none | 830 |
| Example 32 | F-11 | Y-8 | Z-2 | none | none | none | 830 |
| Example 33 | G-5 | Y-8 | none | R-1(1.0) | none | none | 830 |
| Example 34 | G-12 | Y-9 | none | R-2(1.0) | none | none | 830 |
| Example 35 | H-1 | Y-9 | Z-1 | none | none | none | 830 |
| Example 36 | J-7 | Y-9- | Z-2 | none | none | none | 830 |
| Comparative Example 25 | xc-3 | Y-6 | Z-1 | R-1(0.5) | none | none | 830 |
| Comparative Example 26 | xc-10 | Y-6 | Z-1 | none | none | none | 830 |
| Comparative Example 27 | xd-4 | Y-6 | Z-1 | none | S-5 | none | 830 |
| Comparative Example 28 | xd-18 | Y-7 | Z-2 | none | S-5 | none | 830 |
| Comparative Example 29 | xe-7 | Y-7 | Z-2 | none | S-6 | none | 830 |
| Comparative Example 30 | xe-9 | Y-8 | Z-1 | none | S-7 | none | 830 |
| Comparative Example 31 | xf-5 | Y-8 | Z-1 | none | none | none | 830 |
| Comparative Example 32 | xf-11 | Y-8 | Z-2 | none | none | none | 830 |
| Comparative Example 33 | xg-5 | Y-8 | none | R-1(1.0) | none | none | 830 |
| Comparative Example 34 | xg-12 | Y-9 | none | R-2(1.0) | none | none | 830 |
| Comparative Example 35 | xh-1 | Y-9 | Z-1 | none | none | none | 830 |
| Comparative Example 36 | xj-7 | Y-9 | Z-2 | none | none | none | 830 |

TABLE B

Evaluation Results

| | Sensitivity (mJ/cm$^2$) | Storage Stability (Ratio) |
|---|---|---|
| Example 1 | 0.05 | 1.05 |
| Example 2 | 0.1 | 1.0 |
| Example 3 | 0.1 | 1.0 |
| Example 4 | 0.1 | 1.05 |
| Example 5 | 0.1 | 1.0 |
| Example 6 | 0.1 | 1.0 |
| Example 7 | 0.1 | 1.05 |
| Example 8 | 0.05 | 1.1 |
| Example 9 | 0.05 | 1.1 |
| Example 10 | 0.05 | 1.05 |
| Example 11 | 0.1 | 1.05 |
| Example 12 | 0.1 | 1.05 |
| Comparative Example 1 | 0.2 | 2.0 |
| Comparative Example 2 | 0.2 | 2.0 |
| Comparative Example 3 | 0.2 | 1.5 |
| Comparative Example 4 | 0.2 | 1.5 |
| Comparative Example 5 | 0.25 | 1.5 |
| Comparative Example 6 | 0.3 | 1.5 |
| Comparative Example 7 | 0.2 | 2.0 |
| Comparative Example 8 | 0.3 | 1.5 |
| Comparative Example 9 | 0.15 | 2.0 |
| Comparative Example 10 | 0.15 | 2.0 |
| Comparative Example 11 | 0.3 | 1.5 |
| Comparative Example 12 | 0.2 | 2.0 |
| Example 13 | 0.15 | 1.0 |
| Example 14 | 0.1 | 1.0 |
| Example 15 | 0.1 | 1.0 |
| Example 16 | 0.1 | 1.05 |
| Example 17 | 0.1 | 1.0 |
| Example 18 | 0.1 | 1.0 |
| Example 19 | 0.15 | 1.1 |
| Example 20 | 0.1 | 1.1 |
| Example 21 | 0.1 | 1.05 |
| Example 22 | 0.1 | 1.0 |
| Example 23 | 0.15 | 1.05 |
| Example 24 | 0.1 | 1.05 |
| Comparative Example 13 | 0.3 | 1.5 |
| Comparative Example 14 | 0.3 | 1.5 |
| Comparative Example 15 | 0.2 | 1.5 |
| Comparative | 0.2 | 1.5 |

TABLE B-continued

Evaluation Results

| | Sensitivity (mJ/cm$^2$) | Storage Stability (Ratio) |
|---|---|---|
| Example 16 Comparative | 0.3 | 1.5 |
| Example 17 Comparative | 0.4 | 1.5 |
| Example 18 Comparative | 0.3 | 2.0 |
| Example 19 Comparative | 0.3 | 1.5 |
| Example 20 Comparative | 0.2 | 2.5 |
| Example 21 Comparative | 0.3 | 2.0 |
| Example 22 Comparative | 0.3 | 1.5 |
| Example 23 Comparative | 0.3 | 1.5 |
| Example 24 | | |
| Example 25 | 100 | 1.05 |
| Example 26 | 100 | 1.0 |
| Example 27 | 100 | 1.0 |
| Example 28 | 90 | 1.0 |
| Example 29 | 110 | 1.1 |
| Example 30 | 100 | 1.0 |
| Example 31 | 110 | 1.0 |
| Example 32 | 100 | 1.0 |
| Example 33 | 90 | 1.1 |
| Example 34 | 90 | 1.1 |
| Example 35 | 100 | 1.0 |
| Example 36 | 100 | 1.0 |
| Comparative Example 25 | 150 | 1.5 |
| Comparative Example 26 | 250 | 1.5 |
| Comparative Example 27 | 150 | 1.5 |
| Comparative Example 28 | 200 | 1.5 |
| Comparative Example 29 | 300 | 2.0 |
| Comparative Example 30 | 200 | 2.0 |
| Comparative Example 31 | 150 | 2.0 |
| Comparative Example 32 | 150 | 2.0 |
| Comparative Example 33 | 150 | 1.5 |
| Comparative Example 34 | 200 | 1.5 |
| Comparative Example 35 | 300 | 2.0 |
| Comparative Example 36 | 200 | 2.0 |

Compounds in Examples

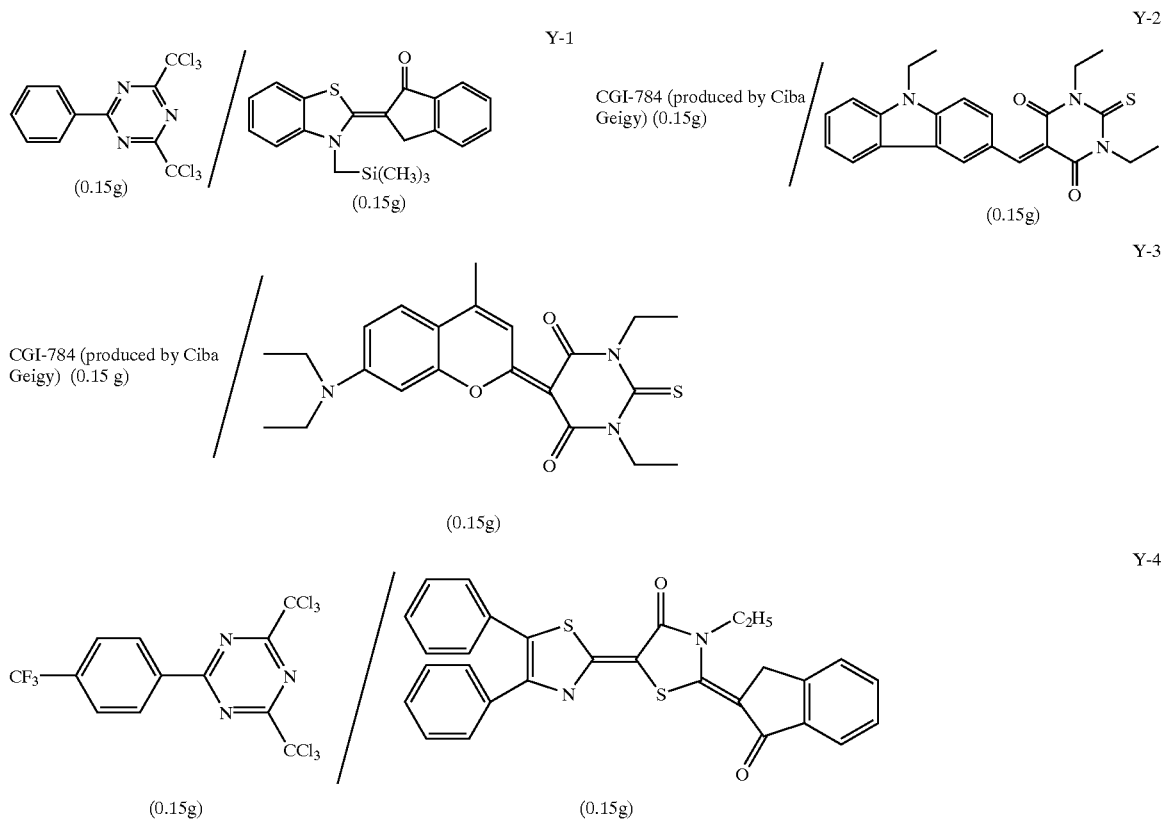

-continued
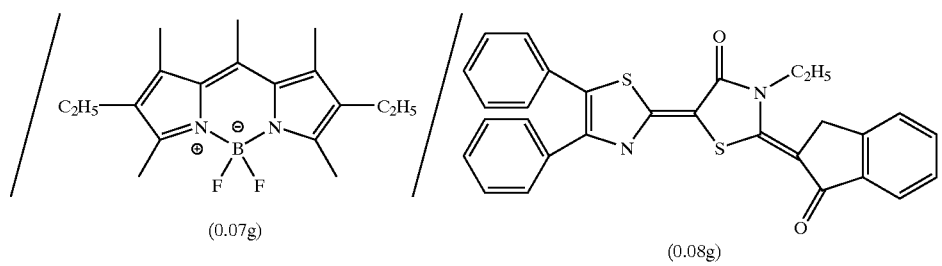
CGI-784 (produced by Ciba Geigy) (0.15 g)
(0.07g)
Y-5
(0.08g)
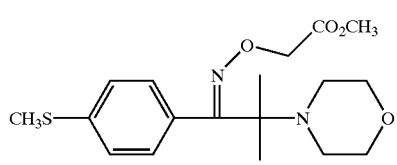 S-1
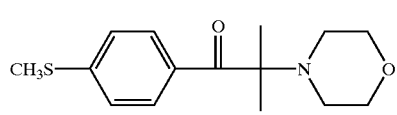 S-2
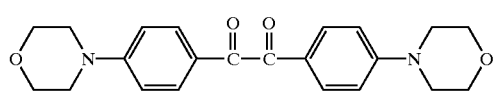 S-3
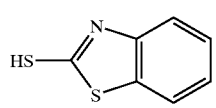 S-4
$((n)C_4H_9)_4N^{\oplus} \cdot PF_6^{\ominus}$ S-5
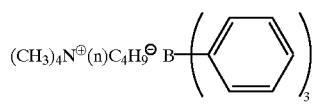 S-6
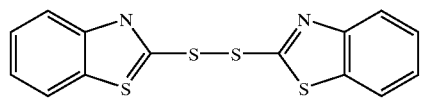 S-7
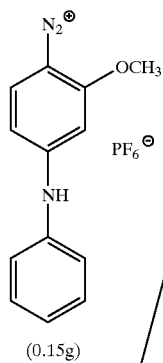
(0.15g)
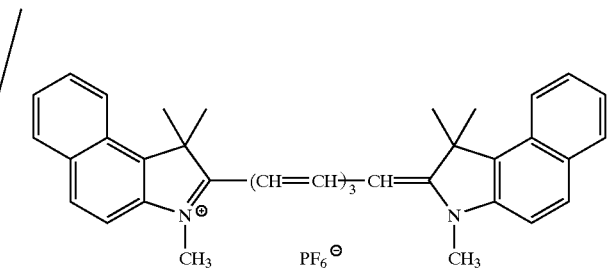
(0.15g)
Y-6
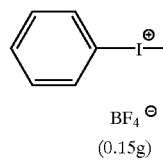
$BF_4^{\ominus}$
(0.15g)
carbon black
(0.15g)
Y-7

-continued
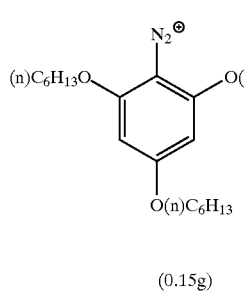
(0.15g)
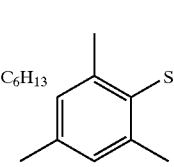
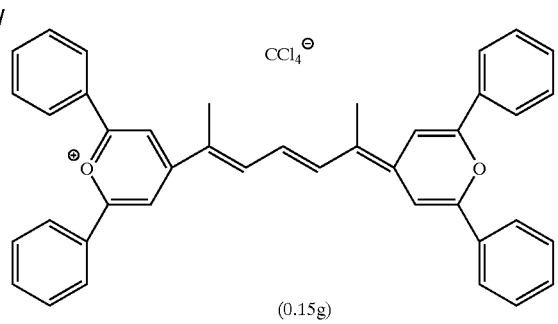
Y-8
(0.15g)
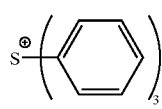
Y-9
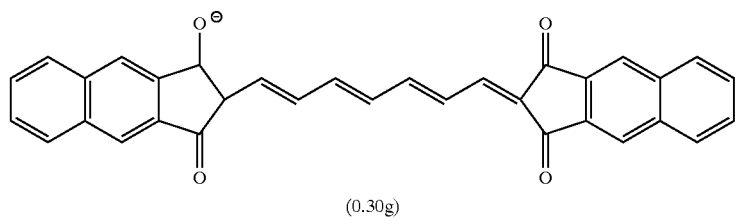
(0.30g)
Compounds in Comparative Examples:
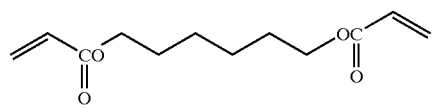 Xc-1
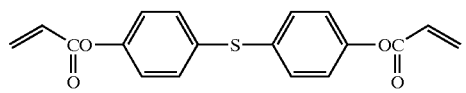 Xc-9
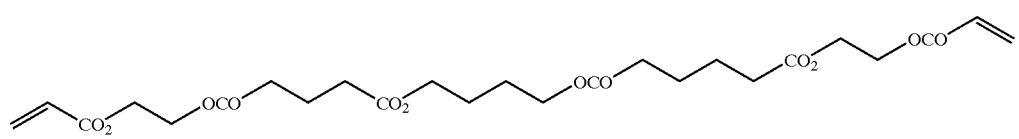 Xd-17
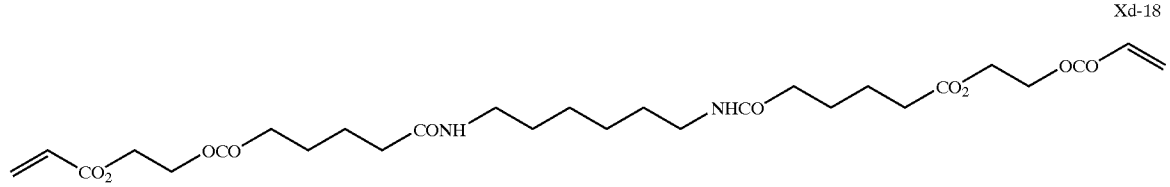 Xd-18
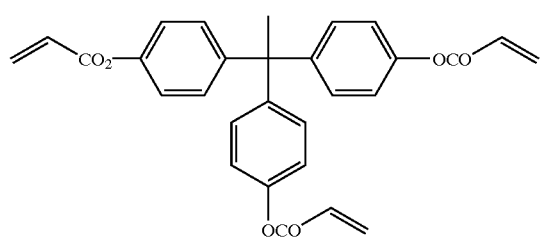 Xe-2

-continued
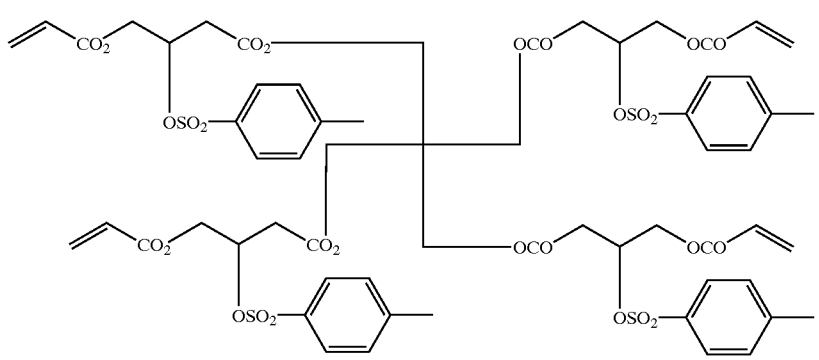
Xe-20
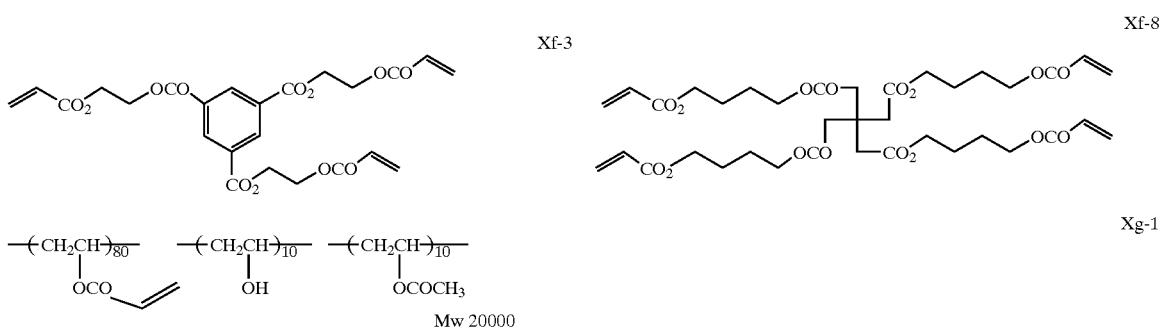
Xf-3
Xf-8
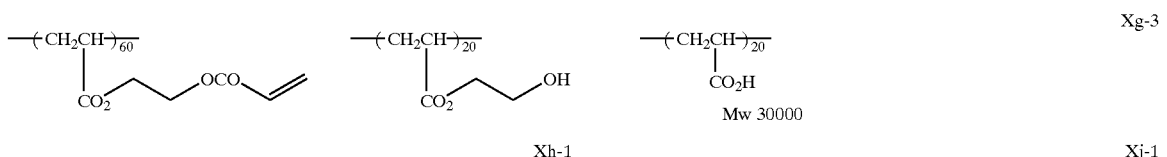
Xg-1
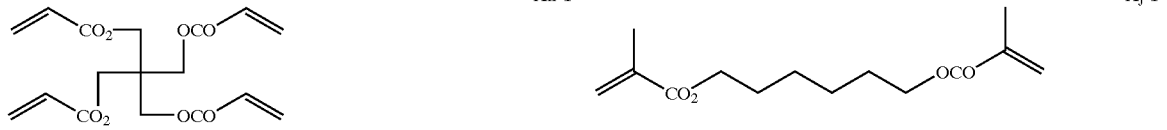
Xg-3
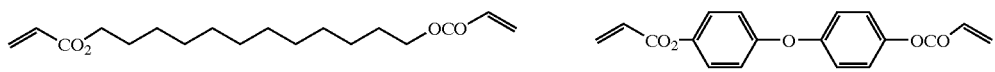
Xh-1
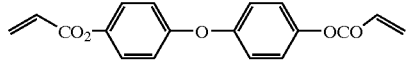
Xj-1
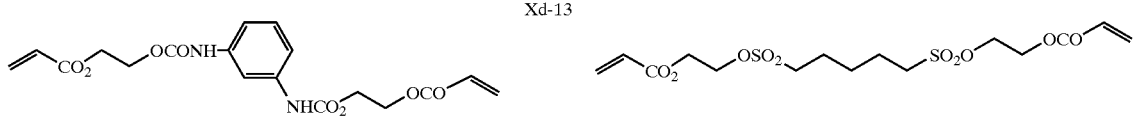
Xc-2
Xc-8
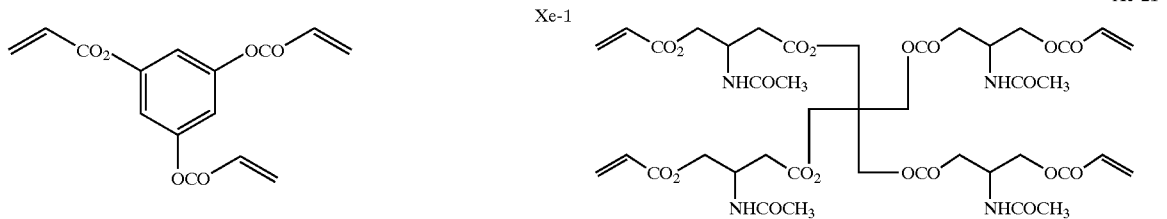
Xd-13
Xd-15
Xe-1
Xe-21
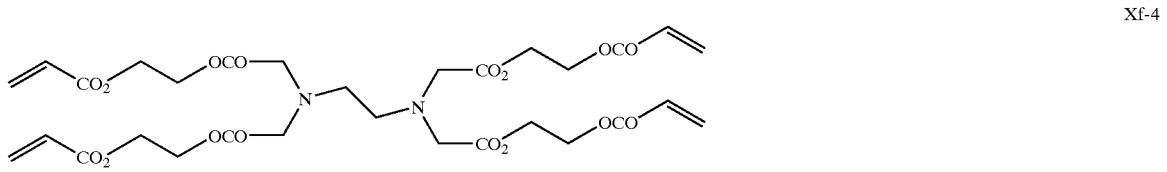
Xf-4

-continued
Xf-10
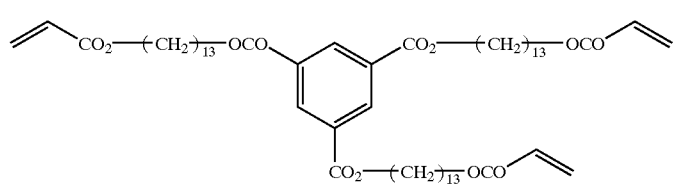
Xg-2
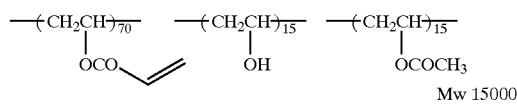
Xg-10
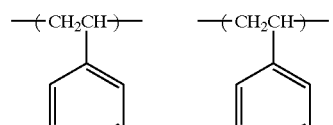
Xh-2
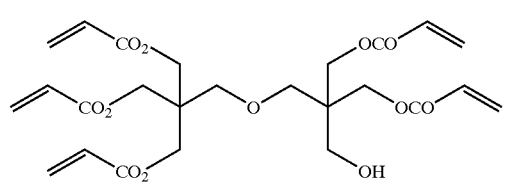
Xj-3
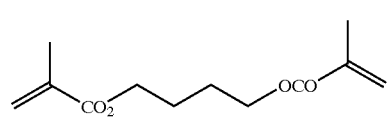
Xc-3
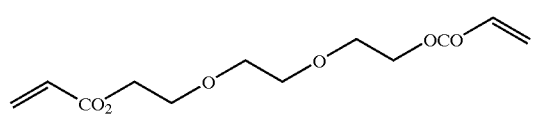
Xc-10
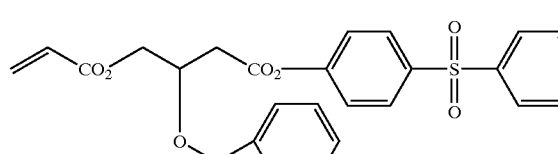
Xd-4
Xd-18
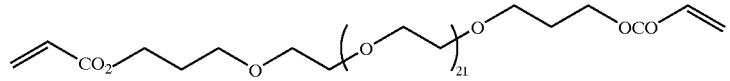
Xe-7
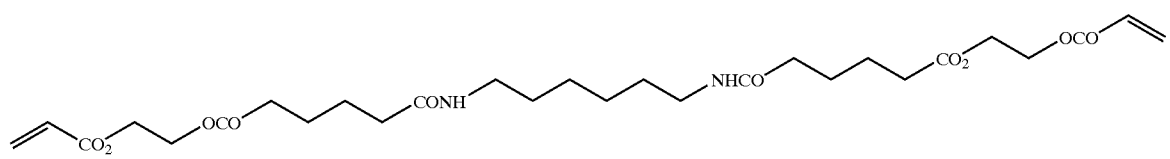
Xe-9
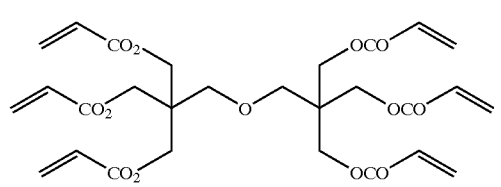
Xf-5
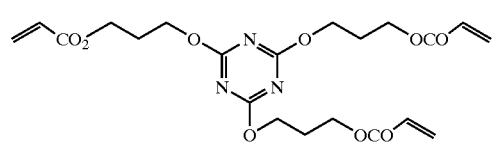

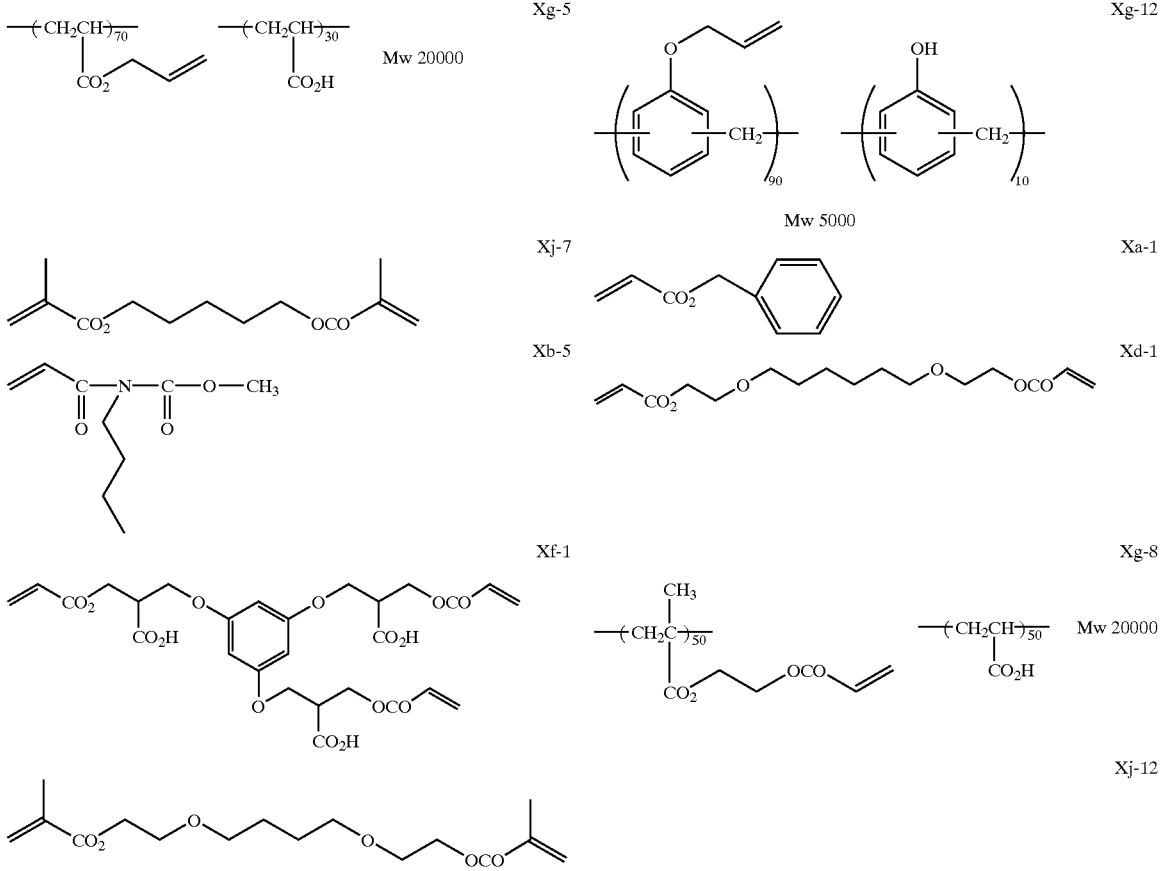

It is seen from Table B that the light-sensitive materials of the present invention have high sensitivity and good storage stability.

EXAMPLE 2 OF PHOTOPOLYMERIZABLE COMPOSITION

On PET (polyethylene terephthalate), a photopolymerizable composition solution having the following composition was coated to have a dry coated weight of 2.0 g/m² and then dried at 80° C. for 1 minute to form a photosensitive layer.

Photopolymerizable Composition Solution

| | |
|---|---|
| Compound [S] having a polymerizable group of the present invention or for comparison shown in Table C below | 1.5 g |
| CGI-784 (produced by Ciba Geigy, titanocene-based initiator) | 0.2 g |
| Polymethyl methacrylate (Mw: 30,000, Mw/Mn = 1.3) | 2.0 g |
| Fluorine-based surfactant (Megafac F-177, produced by Dai-Nippon Ink & Chemicals, Inc.) | 0.03 g |
| Methyl ethyl ketone | 20 g |
| 1-Methoxy-2-propanol | 20 g |

Evaluation of Sensitivity

The thus-obtained light-sensitive materials each was cut into a square of 10 cm×10 cm and light of a high-pressure mercury lamp was irradiated thereon in air to give a sensitivity of 300 mJ/cm² on the light-sensitive material. Thereafter, the weight (Wi g) of the light-sensitive material was measured. Thereafter, this was dipped in methyl ethyl ketone/1-methoxy-2-propanol=50 wt %/50 wt % at 25° C. for 10 minutes, developed with a solvent and dried, and then the weight (Wf g) was measured.

The sensitivity was evaluated good or bad using the degree of hardening defined by the following formula:

Degree of Hardening (%)=100−(Wi−Wf)/2 (%)

As the degree of hardening is closer to 100%, the sensitivity is higher. The results are shown in Table C below.

TABLE C

| | Evaluation Results | |
|---|---|---|
| | [X] | Degree of Hardening (%) |
| Example 37 | A-4 | 40 |
| Example 38 | B-5 | 40 |
| Example 39 | C-1 | 70 |
| Example 40 | D-1 | 70 |
| Example 41 | E-1 | 70 |
| Example 42 | F-1 | 60 |
| Example 43 | G-8 | 70 |
| Example 44 | H-1 | 80 |
| Example 45 | J-12 | 60 |
| Comparative Example 37 | xa-1 | 0 |
| Comparative | xb-5 | 0 |

TABLE C-continued

Evaluation Results

|  | [X] | Degree of Hardening (%) |
|---|---|---|
| Example 38 Comparative Example 39 | xc-1 | 0 |
| Comparative Example 0 | xd-1 | 0 |
| Comparative Example 0 | xe-1 | 0 |
| Comparative Example 0 | xf-1 | 0 |
| Comparative Example 5 | xg-8 | 5 |
| Comparative Example 0 | xh-1 | 0 |
| Comparative Example 0 | xj-12 | 0 |

It is seen from Table C that the photopolymerizable composition of the present invention is hardened even in the absence of a protective layer against oxygen, insusceptible to oxygen and favored with high sensitivity.

According to the present invention, a photopolymerizable composition capable of successfully ensuring both high sensitivity and excellent storage stability, as a radical photopolymerization-system composition which is highest in the sensitivity and very promising out of the image-forming techniques, can be provided. Particularly, a photopolymerizable composition suitable as a lithographic printing plate material capable of making a printing plate directly from digital data of a computer or the like by the recording using a solid laser or semiconductor laser which emits an ultraviolet ray, a visible ray or an infrared ray, can be provided.

What is claimed is:

1. A photopolymerizable composition comprising a compound having a structure represented by the following formula (I) and a photopolymerization initiator:

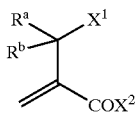
(I)

wherein $X^1$ and $X^2$ each independently represents a group containing a hetero atom wherein the hetero atom is in the α-position or a halogen atom, $R^a$ and $R^b$ each independently represents a hydrogen atom, a halogen atom, a cyano group or an organic residue, and $X^1$ and $X^2$, $R^a$ and $R^b$, or $X^1$ and $R^a$ or $R^b$ may combine with each other to form a cyclic structure.

2. The photopolymerizable composition as claimed in claim 1, wherein said composition is photosensitized by a laser light source having a wavelength of 300 to 1,200 nm.

3. The photopolymerizable composition as claimed in claim 2, wherein said composition further comprises a sensitizing dye.

4. The photopolymerizable composition as claimed in claim 1, wherein said compound having a structure represented by the formula (I) has at least two structures represented by the formula (I).

5. The photopolymerizable composition as claimed in claim 1, wherein said compound having a structure represented by the formula (I) has at least three structures represented by the formula (I).

6. The photopolymerizable composition as claimed in claim 1, wherein said compound having a structure represented by the formula (I) has a molecular weight of 4,000 or more.

7. The photopolymerizable composition as claimed in claim 1, wherein $X^2$ in the formula (I) is methoxy group.

8. The photopolymerizable composition as claimed in claim 1, wherein $X^1$ in the formula (I) contains O, S, N or OCO.

9. The photopolymerizable composition as claimed in claim 1, wherein $X^1$ in the formula (I) contains O.

10. The photopolymerizable composition as claimed in claim 1, wherein $X^1$ in the formula (I) contains OCO.

11. The photopolymerizable composition as claimed in claim 1, wherein said composition further comprises an acrylate or methacrylate compound.

12. The photopolymerizable composition as claimed in claim 1, wherein an amount of said compound having a structure represented by the formula (I) is 10 to 70 wt % based on the weight of all the components.

13. The photopolymerizable composition as claimed in claim 1, wherein said composition further comprises an alkali-soluble linear polymer.

14. The photopolymerizable composition as claimed in claim 1, wherein the photopolymerization initiator is selected from the group consisting of titanocene compounds, trihalomethyl-S-triazine compounds, aromatic onium salt compounds, borate compounds and hexaarylbiimidazole compounds.

* * * * *